United States Patent
Yamazaki

(10) Patent No.: US 9,865,743 B2
(45) Date of Patent: Jan. 9, 2018

(54) SEMICONDUCTOR DEVICE INCLUDING OXIDE LAYER SURROUNDING OXIDE SEMICONDUCTOR LAYER

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/053,919

(22) Filed: Oct. 15, 2013

(65) Prior Publication Data
US 2014/0110703 A1    Apr. 24, 2014

(30) Foreign Application Priority Data

Oct. 24, 2012 (JP) ................ 2012-234427
Oct. 24, 2012 (JP) ................ 2012-234510
Nov. 6, 2012 (JP) ................ 2012-244909

(51) Int. Cl.
*H01L 29/10*      (2006.01)
*H01L 29/12*      (2006.01)
(Continued)

(52) U.S. Cl.
CPC ................ *H01L 29/7869* (2013.01)

(58) Field of Classification Search
None
See application file for complete search history.

(56) References Cited

U.S. PATENT DOCUMENTS 5,470,762 A   11/1995   Codama et al.
5,528,032 A   6/1996   Uchiyama
(Continued)

FOREIGN PATENT DOCUMENTS

CN    102834922    12/2012
EP    1737044 A    12/2006
(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008
(Continued)

*Primary Examiner* — Allen Parker
*Assistant Examiner* — Ismail Muse
(74) *Attorney, Agent, or Firm* — Nixon Peabody LLP; Jeffrey L. Costellia

(57) ABSTRACT

Oxygen is likely to be released or an oxygen vacancy is likely to occur during a manufacturing process particularly at a side surface of an oxide semiconductor layer. When an oxygen vacancy occurs at the side surface of the oxide semiconductor layer, a problem arises in that the resistance of the side surface is reduced, the apparent threshold voltage of a transistor varies, and variation in the threshold voltage is increased. Further, the variation in the threshold voltage may cause unintentional current to flow between a source and a drain, which might lead to an increase in the off-state current of the transistor and deterioration in the electric characteristics of the transistor. A semiconductor device in which a multilayer film including an oxide semiconductor layer and an oxide layer surrounding the oxide semiconductor layer is used for a channel formation region is provided.

18 Claims, 32 Drawing Sheets

(51) Int. Cl.
  *H01L 29/26* (2006.01)
  *H01L 29/66* (2006.01)
  *H01L 29/786* (2006.01)
  *H01L 21/02* (2006.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,757,030 A | 5/1998 | Codama et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,237,166 B2 | 8/2012 | Kumomi et al. |
| 8,274,078 B2 | 9/2012 | Itagaki et al. |
| 8,378,351 B2 | 2/2013 | Fukumoto et al. |
| 8,420,456 B2 | 4/2013 | Okamoto |
| 8,502,221 B2 | 8/2013 | Yamazaki |
| 9,306,079 B2 * | 4/2016 | Yamazaki ......... H01L 29/78693 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267141 A1 * | 11/2006 | Saito ......... G11C 5/025 257/532 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250701 A1 | 10/2009 | Kimura |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0301329 A1 * | 12/2010 | Asano ......... H01L 29/78696 257/43 |
| 2010/0320458 A1 | 12/2010 | Umeda et al. |
| 2010/0320459 A1 | 12/2010 | Umeda et al. |
| 2011/0117698 A1 * | 5/2011 | Suzawa ......... H01L 27/1225 438/104 |
| 2011/0147738 A1 * | 6/2011 | Yamazaki ......... H01L 29/7869 257/43 |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2012/0086000 A1 | 4/2012 | Mizoguchi et al. |
| 2012/0104385 A1 | 5/2012 | Godo et al. |
| 2012/0119205 A1 | 5/2012 | Taniguchi et al. |
| 2012/0139019 A1 | 6/2012 | Iba |
| 2012/0153278 A1 | 6/2012 | Jeong et al. |
| 2012/0161126 A1 * | 6/2012 | Yamazaki ......... H01L 27/10873 257/43 |
| 2012/0175609 A1 | 7/2012 | Yamazaki |
| 2012/0187397 A1 | 7/2012 | Yamazaki et al. |
| 2012/0229724 A1 | 9/2012 | Miyairi et al. |
| 2012/0267624 A1 | 10/2012 | Isobe et al. |
| 2013/0313550 A1 | 11/2013 | Yamazaki |
| 2014/0103339 A1 | 4/2014 | Yamazaki et al. |
| 2014/0239267 A1 * | 8/2014 | Byun ......... H01L 29/66742 257/40 |
| 2014/0339544 A1 | 11/2014 | Hanaoka et al. |

FOREIGN PATENT DOCUMENTS

| | | |
|---|---|---|
| EP | 2226847 A | 9/2010 |
| JP | 60-198861 A | 10/1985 |

(56) References Cited

FOREIGN PATENT DOCUMENTS

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-268224 | 9/1994 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-096055 | 4/2007 |
| JP | 2009-021565 | 1/2009 |
| JP | 2009-231613 | 10/2009 |
| JP | 2010-016347 | 1/2010 |
| JP | 4415062 | 2/2010 |
| JP | 2010-067954 | 3/2010 |
| JP | 2010-073881 A | 4/2010 |
| JP | 2010-177431 | 8/2010 |
| JP | 4571221 | 10/2010 |
| JP | 2011-222767 | 11/2011 |
| JP | 2011-228695 A | 11/2011 |
| JP | 2011-243745 A | 12/2011 |
| JP | 2012-099796 A | 5/2012 |
| JP | 2012-119564 A | 6/2012 |
| JP | 2012-160679 | 8/2012 |
| JP | 2012-160679 A | 8/2012 |
| JP | 2012-160720 A | 8/2012 |
| JP | 2012-191023 A | 10/2012 |
| JP | 2012-208481 A | 10/2012 |
| JP | 2012-256825 A | 12/2012 |
| WO | WO-2004/114391 | 12/2004 |
| WO | WO 2008/133345 A1 | 11/2008 |
| WO | WO-2011/122364 | 10/2011 |
| WO | WO 2014061762 A1 * | 4/2014 ....... H01L 29/78693 |

OTHER PUBLICATIONS

International Search Report (Application No. PCT/JP2013/078634) Dated Jan. 28, 2014.

Written Opinion (Application No. PCT/JP2013/078634) Dated Jan. 28, 2014.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg—Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 69, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2; Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L; Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

(56) References Cited

OTHER PUBLICATIONS

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of The 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

(56) References Cited

OTHER PUBLICATIONS

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

SEMICONDUCTOR DEVICE INCLUDING OXIDE LAYER SURROUNDING OXIDE SEMICONDUCTOR LAYER

TECHNICAL FIELD

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

BACKGROUND ART

Attention has been focused on a technique for forming a transistor using a semiconductor thin film (also referred to as a thin film transistor (TFT)). The transistor is applied to a wide range of electronic devices such as an integrated circuit (IC) or an image display device. A silicon-based semiconductor material is widely known as a material for a semiconductor thin film applicable to a transistor. As another example, an oxide semiconductor has been attracting attention.

For example, a transistor using an amorphous oxide containing indium (In), gallium (Ga), and zinc (Zn) for a channel formation region of a transistor is disclosed (see Patent Document 1).

Further, it is known that oxygen is released from an oxide semiconductor during a manufacturing process, so that an oxygen vacancy is formed (see Patent Document 2).

REFERENCE

Patent Document

[Patent Document 1] Japanese Published Patent Application No. 2006-165528

[Patent Document 2] Japanese Published Patent Application No. 2011-222767

DISCLOSURE OF INVENTION

During a manufacturing process, oxygen is likely to be released or an oxygen vacancy is likely to occur particularly at a side surface of an oxide semiconductor layer. When an oxygen vacancy occurs at the side surface of the oxide semiconductor layer, a problem arises in that the resistance of the side surface is reduced, the apparent threshold voltage of a transistor varies, and variation in the threshold voltage is increased. Further, the variation in the threshold voltage may cause unintentional current to flow between a source and a drain, which might lead to an increase in the off-state current of the transistor and deterioration in the electric characteristics of the transistor.

In view of the above problems, an object of one embodiment of the present invention is to provide a semiconductor device including an oxide semiconductor layer and having little variation in electric characteristics. Another object is to provide a highly reliable semiconductor device including an oxide semiconductor layer and exhibiting stable electric characteristics. Another object is to provide a semiconductor device having stable electric characteristics. Another object is to provide a highly reliable semiconductor device. Another object is to provide a semiconductor device with low power consumption. Another object is to provide a semiconductor device that is less likely to have a defective shape. Another object is to provide a method for manufacturing any of the semiconductor devices. Another object is to provide a method for manufacturing a semiconductor device with high productivity. Another object is to provide a method for manufacturing a semiconductor device with high yield.

One embodiment of the present invention is a semiconductor device in which a multilayer film including an oxide semiconductor layer and an oxide layer surrounding the oxide semiconductor layer is used for a channel formation region.

In the case where a transistor is formed using an oxide semiconductor, a carrier due to an oxygen vacancy might occur. Many oxygen vacancies in an oxide semiconductor layer including a channel formation region of the transistor lead to generation of electrons in the channel formation region, which causes defective electric characteristics of the transistor, for example, a normally-on state, an increase in leakage current, and a shift of the threshold voltage due to stress application. In the oxide semiconductor layer, hydrogen, silicon, nitrogen, carbon, and metal elements which are not the main component are impurities. For example, hydrogen has a donor level in the oxide semiconductor layer, which results in an increase in carrier density. Further, silicon has an impurity level in the oxide semiconductor layer and the impurity level serves as a trap, which might deteriorate the electric characteristics of the transistor.

Thus, to obtain stable electric characteristics of a semiconductor device including an oxide semiconductor layer, some measures need to be taken to reduce oxygen vacancies in the oxide semiconductor layer and decrease the concentration of impurities such as hydrogen and silicon.

Thus, in a semiconductor device in one embodiment of the present invention, an oxide layer which contains one or more kinds of elements composing an oxide semiconductor layer and in which an oxygen vacancy occurs less frequently than in the oxide semiconductor layer is provided in contact with the top surface, the bottom surface, and a side surface of the oxide semiconductor layer so as to surround the oxide semiconductor layer in which a channel is formed. Accordingly, oxygen vacancies which may occur in the oxide semiconductor layer in which a channel is formed can be reduced. As a result, variation in the electric characteristics such as the threshold voltage of a transistor can be reduced.

The oxide semiconductor layer and the oxide layer contain at least indium. The oxide layer has an energy gap wider than that of the oxide semiconductor layer, and the content ratio of indium in the oxide semiconductor layer is higher than the content ratio of indium in the oxide layer. As a typical example, an oxide containing indium, zinc, and the element M can be used for the oxide semiconductor layer and the oxide layer. In addition, the content ratio of the element M is preferably higher in the oxide layer than in the oxide semiconductor layer.

An oxide preferably used for the oxide layer has a high content ratio of the element M such as gallium, aluminum, silicon, titanium, germanium, yttrium, zirconium, tin, lanthanum, cerium, or hafnium. These elements strongly bond with oxygen and need high energy for forming an oxygen vacancy, so that an oxygen vacancy is less likely to occur. For this reason, an oxygen vacancy is less likely to occur in an oxide layer that contains any of these elements with a high proportion, and the oxide layer has stable characteristics. Thus, when a surface of the oxide semiconductor layer is surrounded by the oxide layer, an oxygen vacancy is less likely to be formed at an end portion of the oxide semiconductor layer; as a result, a semiconductor device having stable characteristics can be obtained.

Further, in the case where the end portion of a multilayer film has curvature in a cross section, the coverage with a film which is to be formed over the multilayer film can be improved. With such a structure, the film can be formed uniformly over the multilayer film so as to prevent an entry of an impurity element from a region having low film density or a region where the film is not formed into the multilayer film, which causes deterioration in the characteristics of a semiconductor device. Thus, a semiconductor device having stable characteristics can be obtained. Note that it is particularly preferable that the whole end portion, a lower end portion, or the lower end portion and an upper end portion of the multilayer film be curved.

Alternatively, the oxide layer may include a first oxide layer below the oxide semiconductor layer, a second oxide layer over the oxide semiconductor layer, and a third oxide layer which covers the side surface of the oxide semiconductor layer. The space between the surface of the oxide semiconductor layer and a surface of the oxide layer can be wider at a side portion of the multilayer film than at an upper portion thereof. The thickness of the multilayer film may be $\frac{1}{50}$ to 50 times the radius of curvature of a curved surface on a side surface. With such a structure, a reduction in reliability of the semiconductor device in which the oxide semiconductor layer is surrounded by the oxide layer can be suppressed.

Further alternatively, a base insulating film may be provided below the multilayer film. The thickness of a region of the base insulating film which overlaps with the multilayer film is larger than the thicknesses of the other regions. The base insulating film includes a first region overlapping with the multilayer film, a second region surrounding the first region, and a third region surrounding the second region. The thickness of the second region is preferably smaller than that of the first region and the thickness of the third region is preferably smaller than that of the second region. The base insulating film having such a shape with a step (also referred to as a step-like shape) allows the step coverage with a film which is to be formed over the base insulating film and the multilayer film to be improved and the defective shapes of the semiconductor device to be reduced.

The film can be formed uniformly over the multilayer film so as to prevent an entry of an impurity element from a region having low film density or a region where the film is not formed into the multilayer film, which causes deterioration in the characteristics of a semiconductor device. Thus, a semiconductor device having stable characteristics can be obtained. Note that it is particularly preferable that a lower end portion, or both the lower end portion and an upper end portion of the multilayer film be curved.

In the semiconductor device in one embodiment of the present invention, which has the above structure, the oxide semiconductor layer serving as a channel (serving as a main path of a carrier) can be a highly purified intrinsic oxide semiconductor layer. Note that a highly purified intrinsic oxide semiconductor layer in this specification and the like refers to an oxide semiconductor layer having a Fermi level whose difference from the intrinsic Fermi level is 0.5 eV or smaller. In this case, the carrier density of the oxide semiconductor layer is lower than $1\times10^{17}/cm^3$, lower than $1\times10^{15}/cm^3$, or lower than $1\times10^{13}/cm^3$. With a highly purified intrinsic oxide semiconductor layer, the transistor can have stable electric characteristics.

Specifically, the following structure can be employed for example.

One embodiment of the present invention is a semiconductor device including a multilayer film which includes an oxide semiconductor layer and an oxide layer surrounding the oxide semiconductor layer, a gate insulating film over the multilayer film, and a gate electrode overlapping with the multilayer film with the gate insulating film therebetween.

One embodiment of the present invention is a semiconductor device including a gate electrode, a gate insulating film over the gate electrode, and a multilayer film overlapping with the gate electrode with the gate insulating film therebetween. The multilayer film includes an oxide semiconductor layer and an oxide layer surrounding the oxide semiconductor layer.

One embodiment of the present invention is a semiconductor device including a gate electrode, a gate insulating film over the gate electrode, a multilayer film which overlaps with the gate electrode with the gate insulating film therebetween and includes an oxide semiconductor layer and an oxide layer surrounding the oxide semiconductor layer, and a source electrode and a drain electrode electrically connected to the oxide semiconductor layer. The oxide semiconductor layer and the oxide layer each contain indium, zinc, and a metal element other than indium and zinc as constituent elements. The content ratio of the metal element other than indium and zinc is higher in the oxide layer than in the oxide semiconductor layer.

One embodiment of the present invention is a semiconductor device including a gate electrode; a gate insulating film over the gate electrode; a multilayer film which overlaps with the gate electrode with the gate insulating film therebetween and includes an oxide semiconductor layer, a first oxide layer in contact with a bottom surface of the oxide semiconductor layer, a second oxide layer in contact with a top surface of the oxide semiconductor layer, and a third oxide layer in contact with a side surface of the oxide semiconductor layer; and a source electrode and a drain electrode electrically connected to the oxide semiconductor layer. The oxide semiconductor layer, the first oxide layer, the second oxide layer, and the third oxide layer are each an In-M-Zn oxide. The content ratio of an element M in each of the first oxide layer, the second oxide layer, and the third oxide layer is higher than that in the oxide semiconductor layer.

One embodiment of the present invention is a semiconductor device including a gate electrode; a gate insulating film over the gate electrode; a multilayer film which overlaps with the gate electrode with the gate insulating film therebetween and includes an oxide semiconductor layer, a first oxide layer in contact with a bottom surface of the oxide semiconductor layer, a second oxide layer in contact with a top surface of the oxide semiconductor layer, and a third oxide layer in contact with a side surface of the oxide semiconductor layer; a source electrode and a drain electrode electrically connected to the oxide semiconductor layer; and a protective insulating film containing oxygen which is over the source electrode and the drain electrode and in contact with the multilayer film. The oxide semiconductor layer, the first oxide layer, the second oxide layer, and the third oxide layer are each an In-M-Zn oxide. The content ratio of an element M in each of the first oxide layer, the second oxide layer, and the third oxide layer is higher than that in the oxide semiconductor layer.

Note that an absorption coefficient of a defect level (density of state (DOS)) in the multilayer film measured by a constant photocurrent method (CPM) is preferably lower than $1\times10^{-3}$ cm$^{-1}$.

Further, the multilayer film is preferably surrounded by an insulating film containing excess oxygen.

Furthermore, the oxide layer preferably includes a first region in contact with the bottom surface of the oxide semiconductor layer, a second region in contact with the top surface of the oxide semiconductor layer, and a third region in contact with the side surface of the oxide semiconductor layer. The third region preferably contains the same kind of element as that in the first region.

With one embodiment of the present invention, variation in the electric characteristics of a semiconductor device including an oxide semiconductor layer can be reduced. Further, a semiconductor device having improved reliability and exhibiting stable electric characteristics can be provided. In addition, the above semiconductor device can be manufactured.

BEST MODE FOR CARRYING OUT THE INVENTION

Figure 1A:
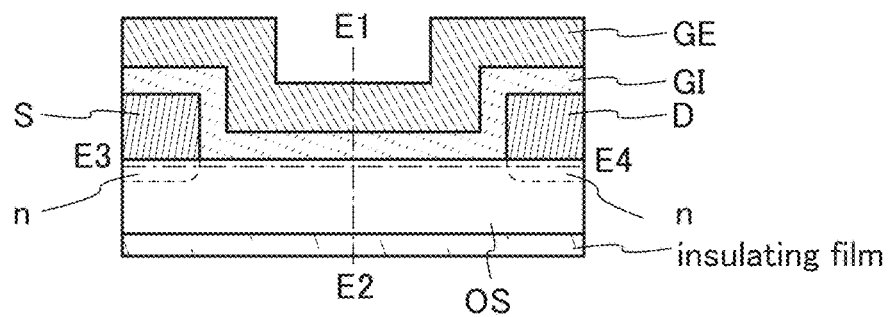
FIG. 1A is a cross-sectional view of a transistor including an oxide semiconductor layer and FIG. 1B shows a band structure thereof.

Embodiments and an example of the present invention are described below in detail with reference to the accompanying drawings. However, the present invention is not limited to the following description and it is easily understood by those skilled in the art that the mode and details can be variously changed. In addition, the present invention should not be construed as being limited to the description in the following embodiments and the example. In describing structures of the present invention with reference to the drawings, the same reference numerals are used in common for the same portions in different drawings. Note that the same hatch pattern is applied to similar parts, and in some cases the similar parts are not especially denoted by reference numerals.

Note that in the actual manufacturing process, a resist mask or the like might be unintentionally reduced in size by treatment such as etching, which is not illustrated in some cases for easy understanding.

Further, the ordinal numbers such as "first" and "second" in this specification are used for convenience and do not indicate the order of steps or the stacking order of layers. In addition, the ordinal numbers in this specification do not indicate particular names which specify the present invention.

Note that in many cases, a voltage refers to a potential difference between a certain potential and a reference potential (e.g., a ground potential (GND) or a source potential). Accordingly, a voltage can also be called a potential.

Even when the expression "to be electrically connected" is used, there is a case in which no physical connection is made and a wiring is just extended in an actual circuit.

Further, functions of a source and a drain might be switched when a direction of current flow is changed in circuit operation, for example. Thus, the terms "source" and "drain" can be switched in this specification.

The descriptions in this embodiment can be combined with each other as appropriate.

<1. Deterioration Mechanism of Transistor Including Oxide Semiconductor Layer>

First, a deterioration mechanism model of a transistor including an oxide semiconductor layer will be described to show that the removal or reduction of DOS is effective to improve reliability of the transistor including the oxide semiconductor layer.

An example of the transistor including the oxide semiconductor layer is illustrated in FIG. 1A. In FIG. 1A, "OS" denotes an oxide semiconductor layer, "S" denotes a source electrode, "D" denotes a drain electrode, "GI" denotes a gate insulating film, and "GE" denotes a gate electrode. Note that an n-layer (denoted by "n" in the drawings) having higher carrier density than the oxide semiconductor layer is included between the oxide semiconductor layer and the source and drain electrodes.

Figure 1B:
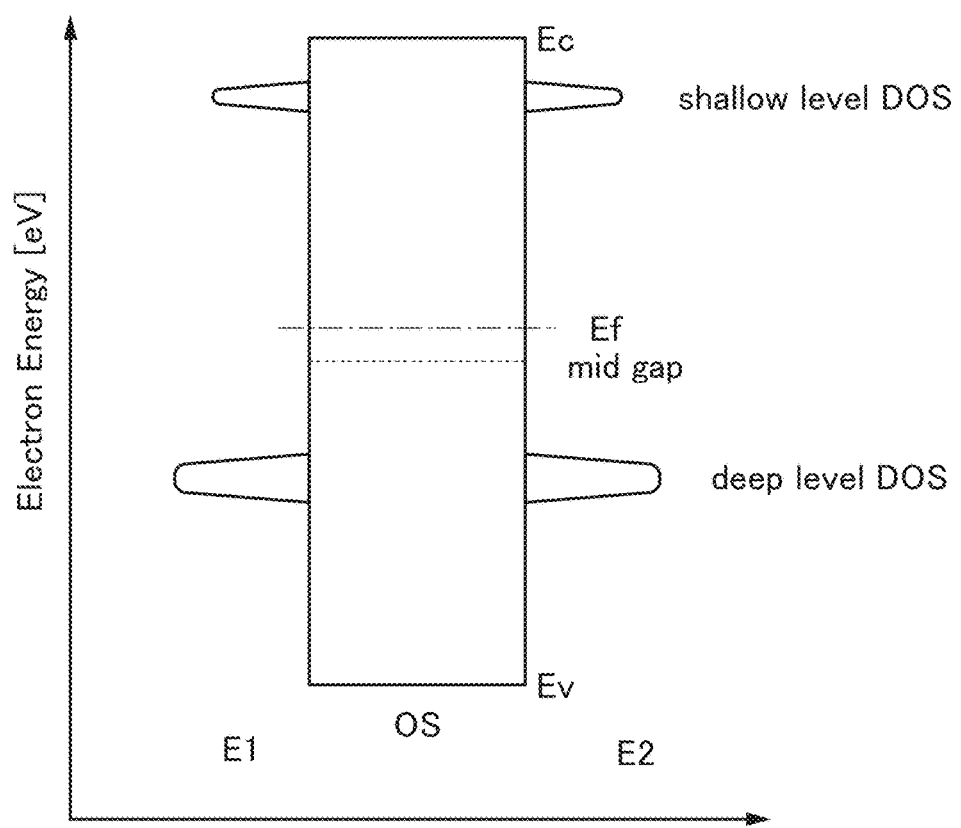

FIG. 1B shows a band structure along dashed-dotted line E1-E2 in FIG. 1A. According to FIG. 1B, there are two kinds of DOS: shallow level DOS and deep level DOS. A common factor causing the shallow level and the deep level is an oxygen vacancy (Vo). In an oxide semiconductor layer containing indium, in particular, an oxygen atom which is adjacent to an indium atom is released, so that an oxygen vacancy is formed. Note that "Ec" denotes the lowest conduction band energy of the oxide semiconductor layer, "Ev" denotes the highest valence band energy of the oxide semiconductor layer, "Ef" denotes the Fermi energy of the oxide semiconductor layer, and "mid gap" denotes the middle of the energy gap of the oxide semiconductor layer (intrinsic level). It is assumed that the oxide semiconductor layer is an intrinsic (i-type) or substantially intrinsic oxide semiconductor layer. In that case, the Fermi energy coincides with "mid gap"; however, they are slightly shifted from each other in the drawings for easy understanding. Note that DOS distributes in the energy axis direction and its height (the direction perpendicular to the electron energy axis) indicates the density of DOS.

In the case where voltage is not applied to the gate electrode, DOS is neutral and is not positively or negatively charged.

Figure 2A:
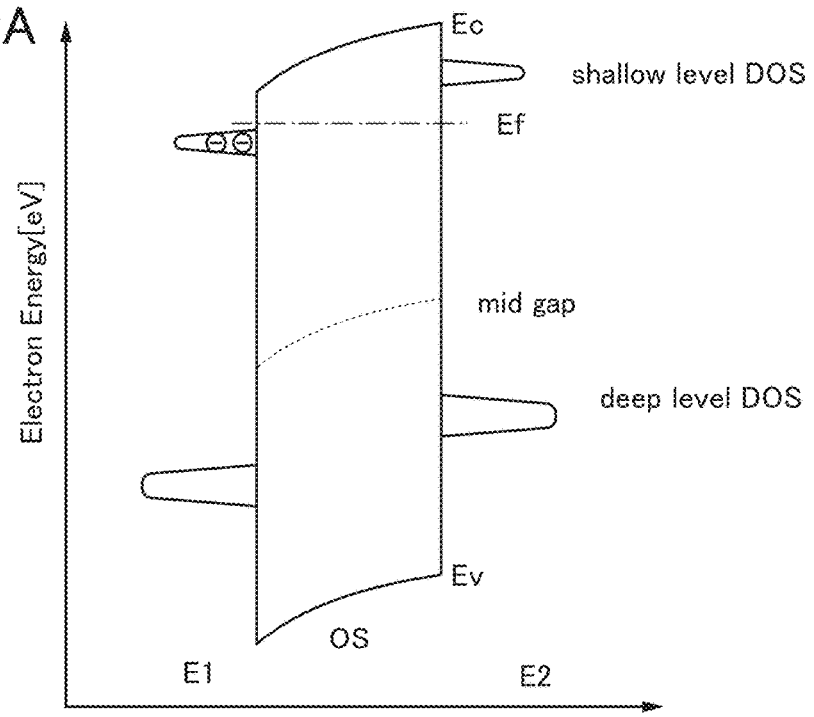
FIGS. 2A and 2B each show a band structure of a transistor including an oxide semiconductor layer.

When positive voltage is applied to the gate electrode, the band of the oxide semiconductor layer curves as shown in FIG. 2A. Further, in the case where shallow level energy is lower than the Fermi energy because of the electric field from the gate electrode, a negative charge (e.g., electron) is trapped in the shallow level.

Figure 2B:
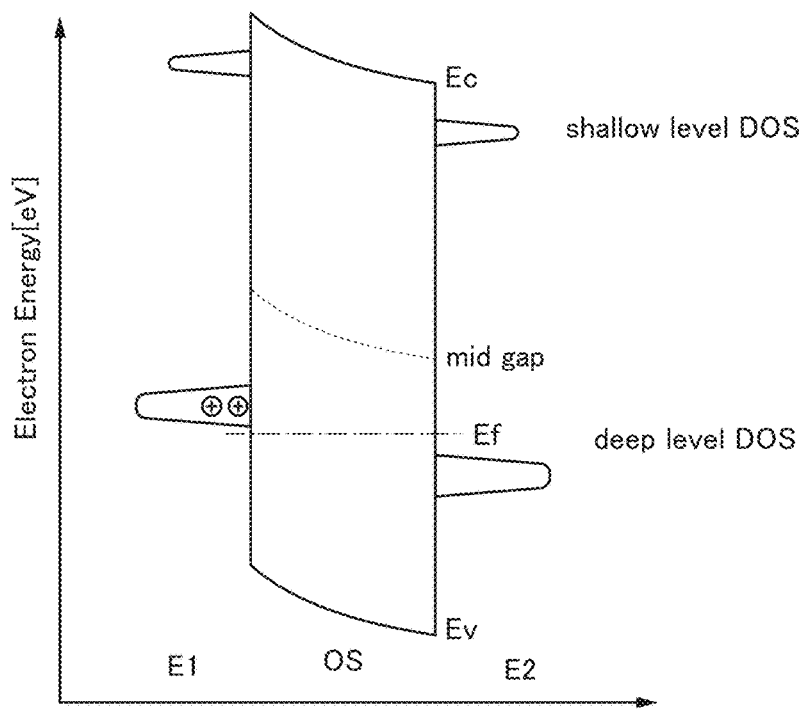

Similarly, when negative voltage is applied to the gate electrode, the band of the oxide semiconductor layer curves as shown in FIG. 2B. Further, in the case where deep level energy is higher than the Fermi energy because of the electric field from the gate electrode, a positive charge (e.g., hole) is trapped in the deep level.

Since a charge trapped in DOS of the oxide semiconductor layer has an extremely long relaxation time ($\tau$), the charge is held for a long time even when the electric field from the gate electrode is stopped. Thus, the charge trapped in DOS behaves like a fixed charge. For example, in the case where a negative charge is trapped in a shallow level, the charge works in a manner similar to that in the case where an electric field is generated by a negative fixed charge and as a result, the threshold voltage of a transistor shifts in the positive direction. On the other hand, in the case where a positive charge is trapped in a deep level, the charge works in a manner similar to that in the case where an electric field is generated by a positive fixed charge and as a result, the threshold voltage of the transistor shifts in the negative direction.

As described above, the transistor including the oxide semiconductor layer has a deterioration mechanism in which the threshold voltage shifts in the positive direction or the negative direction depending on DOS in the oxide semiconductor layer. This shows that the removal or reduction of DOS is effective to improve the reliability of the transistor including the oxide semiconductor layer.

Next, deterioration caused by the application of positive voltage to the drain electrode of the transistor will be described.

Figure 3A:
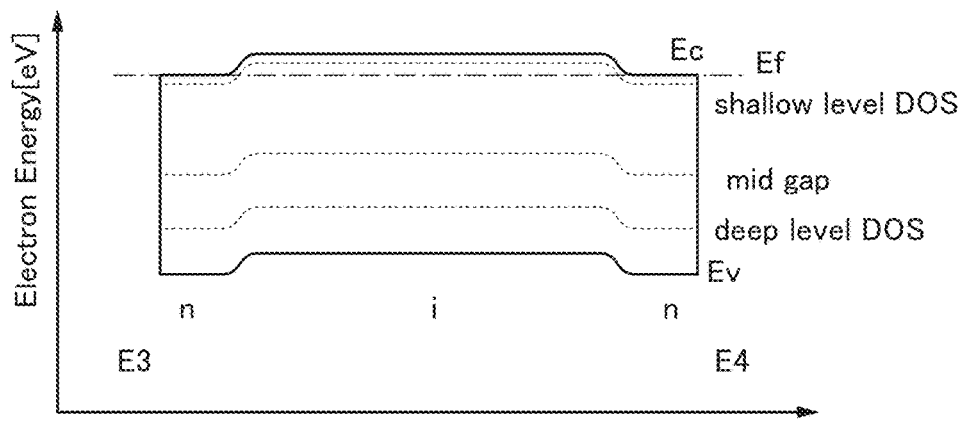
FIGS. 3A and 3B each show a band structure of a transistor including an oxide semiconductor layer.

FIG. 3A shows a band structure along dashed-dotted line E3-E4 in FIG. 1A. Note that an oxide semiconductor layer (OS) is shown as an i-layer (denoted by "i") in FIG. 3A to be distinguished from the n-layer.

As shown in FIG. 3A, the Fermi energy of the oxide semiconductor layer is higher than the mid gap. This is because when the distance between the source electrode and the drain electrode is sufficiently short, the lowest conduction band energy (Ec) is lowered by the effect of the source electrode and the drain electrode and thus, the lowest conduction band energy and the Fermi energy come close to each other. This phenomenon is called a conduction band lowering (CBL) effect. The CBL effect is an effect specific to an oxide semiconductor, which is due to an extremely large depletion layer of the oxide semiconductor layer.

Here, the CBL effect will be described in detail.

It seems intuitively that in the case where an intrinsic or substantially intrinsic oxide semiconductor layer is used as the oxide semiconductor layer, a barrier that is about half the energy gap of the oxide semiconductor layer is formed between the source and drain electrodes and the oxide semiconductor layer. However, the transistor including the oxide semiconductor layer actually has such Vg-Id characteristics that drain current starts to flow when gate voltage is about 0 V.

Figure 4:
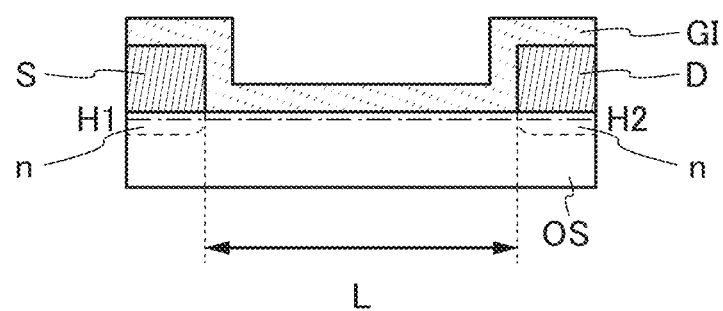
FIG. 4 illustrates a cross-sectional structure of a calculation model.

In view of the above, the following structure illustrated in FIG. 4 is assumed: an oxide semiconductor layer (OS) is provided; a source electrode (S) and a drain electrode (D) are provided over the oxide semiconductor layer; and a gate insulating film (GI) is provided over the oxide semiconductor layer, the source electrode, and the drain electrode. Then, a band structure along dashed-dotted line H1-H2 of the case where the channel length (L) is changed is calculated. In FIG. 4, an n-layer is provided in regions of the oxide semiconductor layer, which are in contact with the source electrode and the drain electrode.

From an estimate of the curve width of the band obtained by solving the Poisson's equation, the curve width of the band is found to be characterized by the Debye shielding length $\lambda_D$ in the following formula. Note that $k_B$ in the following formula is the Boltzmann constant.

$$\text{the curve width of the band} = \qquad \qquad \text{[Formula 1]}$$

-continued $$\sqrt{\frac{\varepsilon\varepsilon_0 k_B T}{e^2 ni}} - \text{the Debye shielding length } \lambda_D$$

By substituting $6.6\times10^{-9}$ cm$^{-3}$ for the intrinsic carrier density ni of the oxide semiconductor layer, 15 for the relative permittivity $\varepsilon$ of the oxide semiconductor layer, and 300 K for temperature T in the above formula, the Debye shielding length $\lambda_D$ is found to be as long as $5.7\times10^{10}$ µm. This indicates that when the channel length is greater than $1.14\times10^{11}$ µm, which is twice as large as the Debye shielding length $\lambda_D$, the height of a barrier between the n-layer and the i-layer is half the energy gap of the oxide semiconductor layer.

Figure 5:
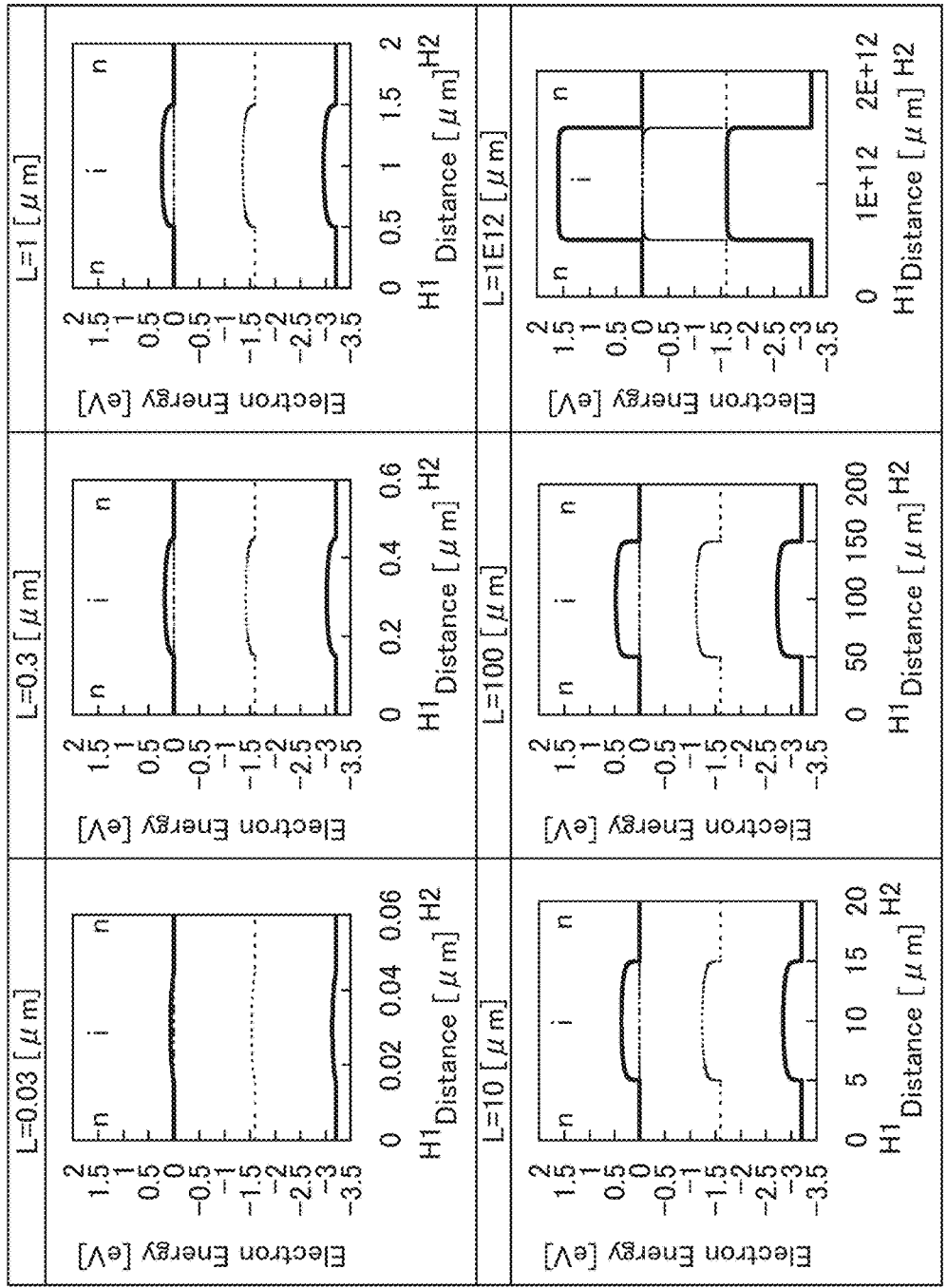
FIG. 5 shows band structures of calculation models.

FIG. 5 shows calculation results of band structures with channel lengths of 0.03 µm, 0.3 µm, 1 µm, 10 µm, 100 µm, and $1\times10^{12}$ µm. Note that in FIG. 5, "n" denotes the n-layer and "i" denotes a region of an oxide semiconductor layer (i-layer) which is sandwiched between the n-layers, and a dashed-dotted line represents the Fermi energy of the oxide semiconductor layer and a dashed line indicates the mid gap of the oxide semiconductor layer.

According to FIG. 5, in the case where a channel length is as large as $1\times10^{12}$ µm, the difference in electron energy between the i-layer and the n-layer is half the energy gap of the oxide semiconductor layer. However, the difference in electron energy between the i-layer and the n-layer gradually becomes smaller as the channel length becomes smaller, and there is almost no barrier when the channel length is 1 µm or less. Note that the electron energy of the n-layer is fixed by the source electrode and the drain electrode.

As described above, the barrier between the n-layer and the i-layer is sufficiently small when the channel length is small.

Owing to the CBL effect, the subthreshold value of the transistor including the oxide semiconductor layer is reduced to near the theoretical limit even when there is a barrier between the source and drain electrodes and the oxide semiconductor layer; thus, favorable switching characteristics are obtained.

Figure 3B:
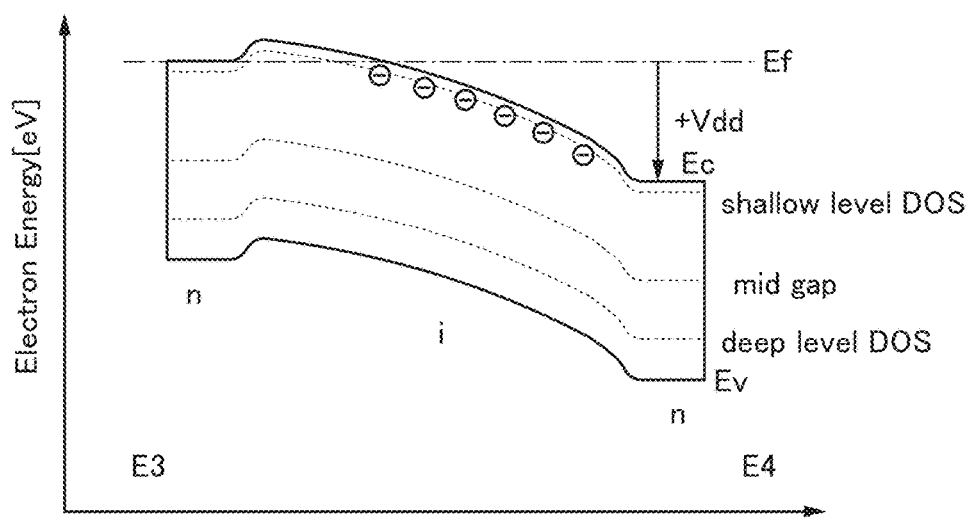

When positive voltage Vdd is applied to the drain electrode, the band structure shown in FIG. 3A turns into a band structure shown in FIG. 3B. When positive voltage is applied to the gate electrode at this time, current flows in the forward direction of the transistor. In that case, more negative charges are accumulated in the shallow level with energy that is lower than the Fermi energy. This indicates that the shallow level energy is likely to be much lower than the Fermi energy when positive voltage is applied to the drain electrode. Thus, even when positive voltage or negative voltage is applied to the gate electrode, the threshold voltage might shift in the positive direction depending on voltage applied to the drain electrode.

Figure 6A:
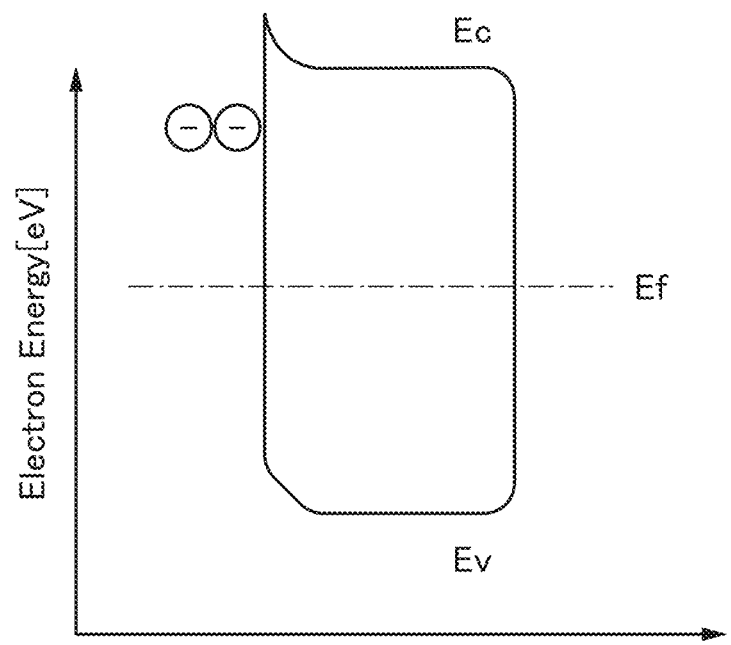
FIGS. 6A and 6B each show a band structure of a transistor including an oxide semiconductor layer.
Figure 6B:
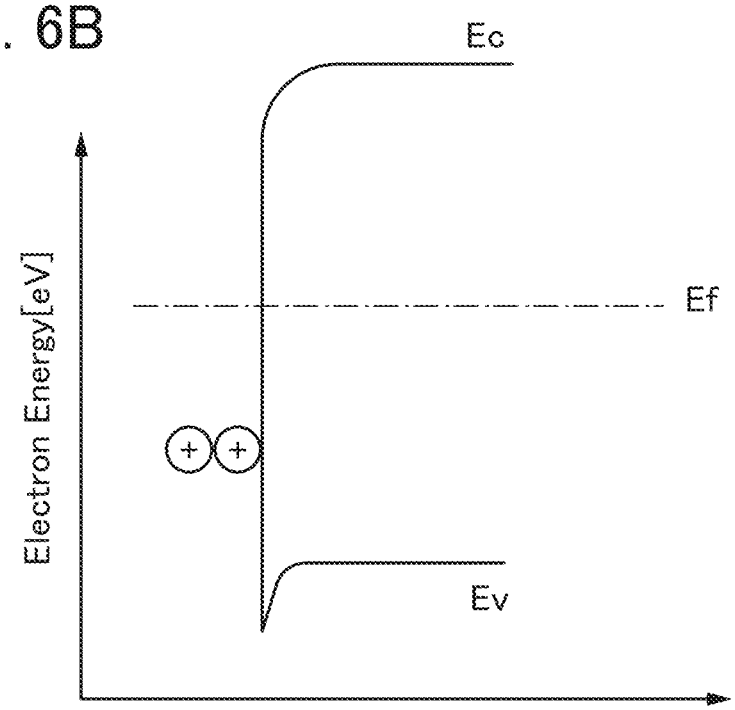

Further, after positive voltage is applied to the gate electrode, a gate potential is set to be equal to a source potential (ground potential (GND)), whereby a band structure shown in FIG. 6A or FIG. 6B is obtained. At this time, the surface band bends towards opposite directions depending on a trapped charge. For example, in the case where a negative charge is trapped as shown in FIG. 6A, the band bends in the normally-off direction and the threshold voltage shifts in the positive direction. Alternatively, in the case where a positive charge is trapped as shown in FIG. 6B, the band bends in the normally-on direction and the threshold voltage shifts in the negative direction.

In a channel having n-type conductivity (n$^-$ type conductivity), an electron can easily pass from the source to the drain and a path is formed between the source and the drain. As a result, the switching characteristics are hard to be obtained. To avoid this, the channel needs to be completely prevented from having n-type conductivity and needs to be necessarily intrinsic (i-type).

Here, causes and remedies of DOS will be described.

Formation of an oxygen vacancy due to silicon is one of the causes of DOS. Specifically, a bond between indium and oxygen is cut by silicon and an oxygen vacancy is formed as shown in the following Chemical Formula (1).

[Chemical Formula 1]

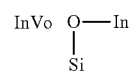
(1)

To suppress the formation of an oxygen vacancy due to silicon, it is important that silicon, which is a substance inducing DOS formation, be prevented from being in contact with the oxide semiconductor layer or entering the oxide semiconductor layer. It is particularly important that an oxide semiconductor layer containing indium be separated from a layer containing silicon.

Damage by plasma is another cause of DOS. In the case where plasma is used to form the oxide semiconductor layer or a layer which is to be formed over the oxide semiconductor layer, the oxide semiconductor layer might be damaged by the plasma and an In—O—In bond having the weakest bonding might be cut, which causes an oxygen vacancy (see Chemical Formula (2) below). In addition, the released oxygen bonds with hydrogen to produce water.

[Chemical Formula 2]

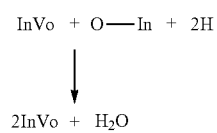
(2)

To reduce DOS, it is important to reduce damage of the oxide semiconductor layer by plasma and to supply oxygen to the oxide semiconductor layer by heat treatment for repairing an oxygen vacancy.

Then, two kinds of DOS, which might be formed in the oxide semiconductor layer, will be described below.

A deep level, which is one kind of DOS, is described in detail. The deep level is DOS in a deep level (deep position in terms of energy as compared with the lowest conduction band energy (Ec)) which is in a band gap (field band) between the highest valence band energy (Ev) and the mid gap. As described above, an oxygen vacancy is formed when an In—O—In bond in the oxide semiconductor layer is cut. This oxygen vacancy becomes a neutral deep level. The deep level becomes a hole trapping center and a positively charge is trapped above the Fermi energy.

Note that the deep level can be quantified by CPM.

Next, a shallow level, which is another kind of DOS, is described in detail. The shallow level is said to be in a position in the band gap which is close to the lowest conduction band energy.

Here, the shallow level is assumed to be In-VoH. That is, a neutral becomes an electron trapping center and a negatively charge is trapped below the Fermi energy. The neutrals are formed as follows: a large amount of hydrogen contained in the oxide semiconductor layer comes close to oxygen vacancies.

To reduce oxygen vacancies, the oxide semiconductor layer in which the channel is formed is surrounded (or wrapped or covered) by an oxide semiconductor layer containing a small amount of In (or containing a large amount of M such as Ga), whereby the channel where current flows can be separated from impurities which might be contained in an insulating film in contact with the oxide semiconductor layer. As the insulating film in contact with the oxide semiconductor layer, a silicon oxide film can be given, for example. Silicon becomes a substance inducing Vo formation.

Since DOS is less likely to be formed in the oxide semiconductor layer containing a small amount of In (or containing a large amount of M such as Ga), DOS is less likely to be formed at an interface between the oxide semiconductor layer which surrounds the channel and a silicon oxide film. The proportion of M (e.g., Ga) atoms in the oxide semiconductor layer surrounding the channel is increased and M (e.g., Ga) is substituted for In in an In—O plane of the oxide semiconductor layer, whereby the number of In—O bonds having weak bonding is reduced and Vo is less likely to be formed. This enables a transistor to have stable electric characteristics (or high reliability).

Figure 7:
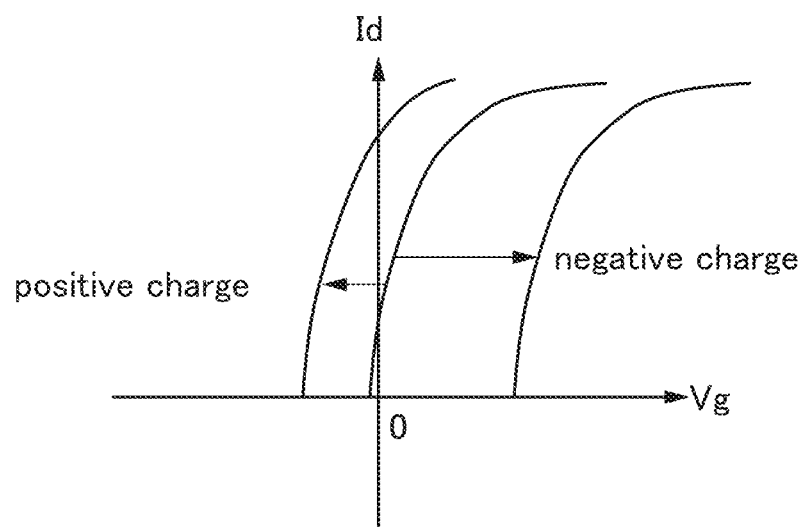
FIG. 7 shows Vg-Id characteristics of a transistor including an oxide semiconductor layer.

FIG. 7 shows a relation between Vg-Id characteristics and DOS. As shown in FIG. 7, the threshold voltage shifts in the negative direction in the Vg-Id characteristics when a positive charge is trapped in the deep level. On the other hand, the threshold voltage shifts in the positive direction in the Vg-Id characteristics when a negative charge is trapped in the shallow level.

When positive voltage is applied to the drain and the shallow level energy is lower than the Fermi energy, DOS is likely to be negatively charged. This means that the threshold voltage likely shifts in the positive direction. To prevent this shift, the number of shallow levels needs to be reduced.

Further, when constant positive voltage is applied to the drain so that the gate voltage can vary, the shallow level energy becomes lower than the Fermi energy and DOS is negatively charged in accordance with the drain voltage and the gate voltage. This negative charge apparently exhibits the same effect as the case where negative voltage is applied to the gate voltage. Thus, the drain current (Id) is decreased, in other words, a shoulder appears, at a position where the gate voltage is low in a graph of the Vg-Id characteristics (see FIG. 8).

Figure 8:
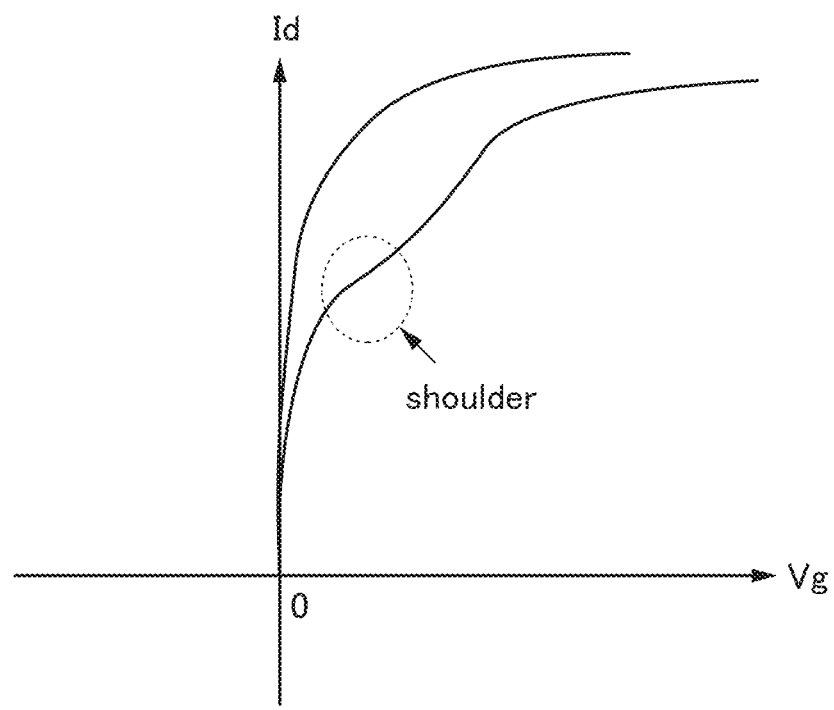
FIG. 8 shows Vg-Id characteristics of a transistor including an oxide semiconductor layer.

The shoulder shown in FIG. 8 appears when positive voltage is applied to the drain. When DOS at the gate electrode side to which higher electric field is applied (particularly in the shallow level) is reduced, the shoulder shown in FIG. 8 can be probably relieved.

The above description shows that the removal or reduction of DOS is effective to improve the reliability of the transistor including the oxide semiconductor layer.

<2. Multilayer Film Including Oxide Semiconductor Layer>

A multilayer film having a small number of DOS, with which a transistor including an oxide semiconductor layer and having stable electric characteristics can be fabricated, will be described below.

<2-1. Structure of Multilayer Film>

In this section, a structure of the multilayer film is described.

The multilayer film having low DOS has a structure in which an oxide layer is provided so as to surround an oxide semiconductor layer in which a channel is formed. In the oxide layer, DOS is less likely to be formed than in the oxide semiconductor layer. Note that there are a variety of possible methods for forming the structure in which the oxide semiconductor layer is surrounded by the oxide layer, and one of them is described below.

FIG. 9A to FIG. 9D each illustrate a cross-sectional structure of a multilayer film 108. The multilayer film 108 includes an oxide layer 105a, an oxide semiconductor layer 106 provided over the oxide layer 105a, an oxide layer 105b provided over the oxide semiconductor layer 106, and an oxide layer 105c which is in contact with at least a side surface of the oxide semiconductor layer 106. Note that the oxide layer 105c has a curved surface.

Figure 9A:
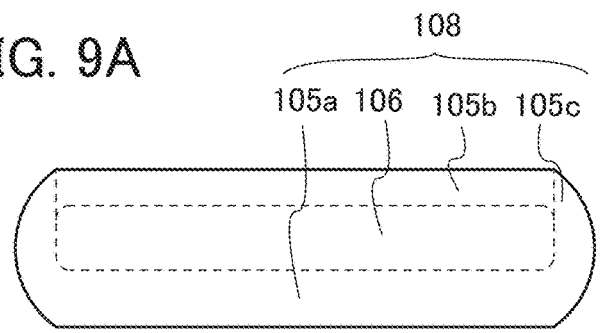
FIGS. 9A to 9D are a cross-sectional views each illustrating a multilayer film in one embodiment of the present invention.
Figure 9B:
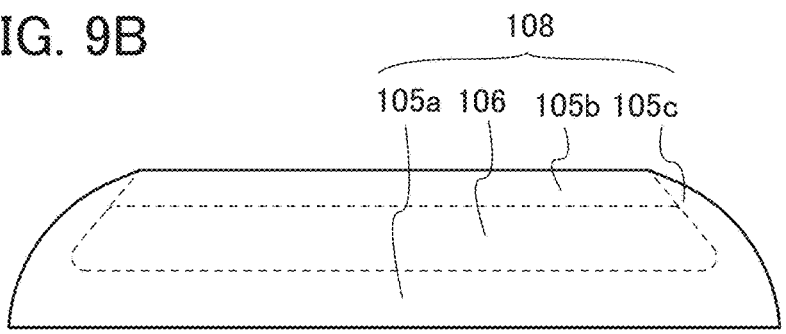

In one of the side surfaces of a cross section of the multilayer film 108 illustrated in FIG. 9A or FIG. 9B, the oxide layer 105c has curvature (a curved surface) based on one osculating circle (also referred to as a circle of curvature). On the other hand, in one of the side surfaces of a cross section of the multilayer film 108 illustrated in FIG. 9C or FIG. 9D, the oxide layer 105c has curvature based on one osculating circle at each of an upper end portion and a lower end portion.

Figure 9C:
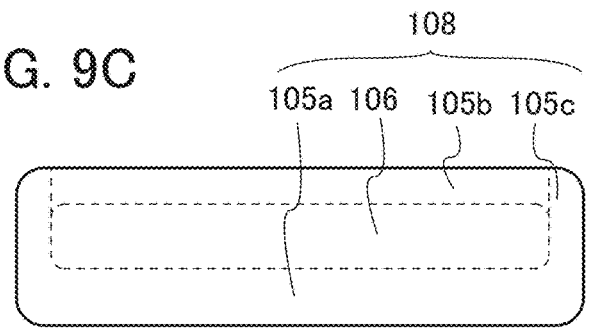
Figure 9D:
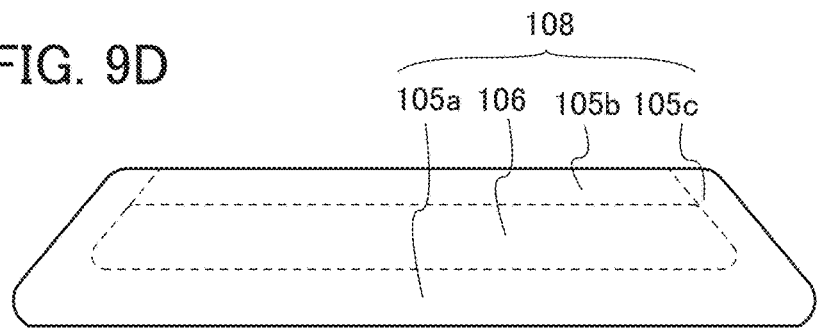

As in the multilayer film 108 in FIG. 9A or FIG. 9C, side surfaces of the oxide layer 105a, the oxide semiconductor layer 106, and the oxide layer 105b may be substantially perpendicular to the bottom surface of the oxide layer 105a. Alternatively, the multilayer film 108 may have a slope (taper angle) as illustrated in FIG. 9B and FIG. 9D.

With the above-described oxide layer 105c having a curved side surface, which is part of the multilayer film 108, occurrence of a shape defect of a transistor including the multilayer film 108 can be reduced.

<2-1-1. Oxide Layer Forming End Portion of Multilayer Film>

A curved surface included in the oxide layer 105c will be described with reference to FIGS. 10A to 10C.

Figure 10A:
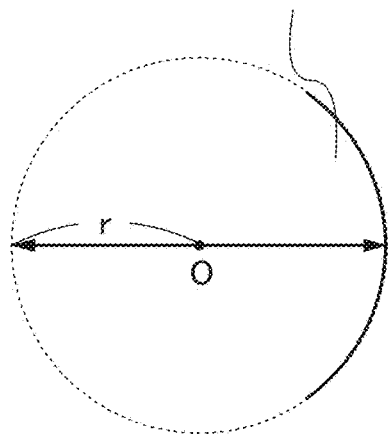
FIGS. 10A to 10C are diagrams illustrating the radius of curvature.

FIG. 10A is a cross-sectional view of the oxide layer 105c, which corresponds to each of the side surfaces of the cross sections of the multilayer films 108 in FIG. 9A and FIG. 9B. The oxide layer 105c illustrated in FIG. 10A has curvature based on an osculating circle whose radius of curvature is r. Note that the radius of curvature is equal to the radius of an osculating circle of a curve.

Figure 10B:
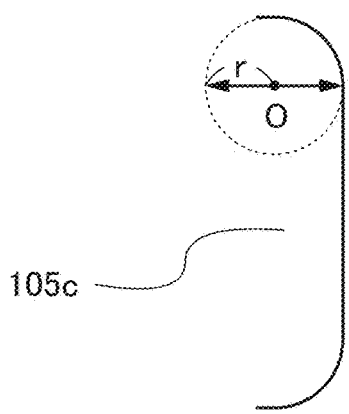

FIG. 10B is a cross-sectional view of the oxide layer 105c, which corresponds to each of the side surfaces of the cross sections of the multilayer films 108 in FIG. 9C and FIG. 9D. The oxide layer 105c illustrated in FIG. 10B has curvature based on an osculating circle whose radius of curvature is r at each of the upper end portion and the lower end portion. Note that the curvature of the upper end portion and the curvature of the lower end portion may have different radiuses of curvature.

Figure 10C:
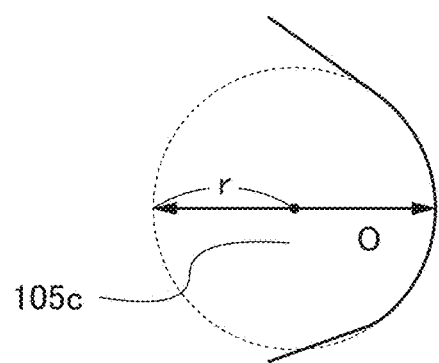

The oxide layer 105c illustrated in FIG. 10C has curvature based on an osculating circle whose radius of curvature is r. Note that the oxide layer 105c may have two or three portions with curvatures based on different osculating circles.

At this time, the radius of curvature r is $\frac{1}{50}$ to 50 times as large as the thickness t of the multilayer film 108 (the total thickness of the oxide layer 105a, the oxide semiconductor layer 106, and the oxide layer 105b), preferably $\frac{1}{20}$ to 20 times as large as the thickness t, further preferably $\frac{1}{10}$ to 10 times as large as the thickness t, still further preferably $\frac{1}{5}$ to 5 times as large as the thickness t.

<2-1-2. Formation Mechanism of Multilayer Film>

A formation mechanism of the multilayer film 108 which includes the oxide layer 105c having a curved surface will be described.

<2-1-3. Formation Mechanism (1)>

An example of the formation mechanism of the multilayer film 108 which includes the oxide layer 105c having a curved surface is described with reference to FIGS. 11A to 11C, FIGS. 12A to 12C, and FIGS. 13A and 13B.

Figure 11A:
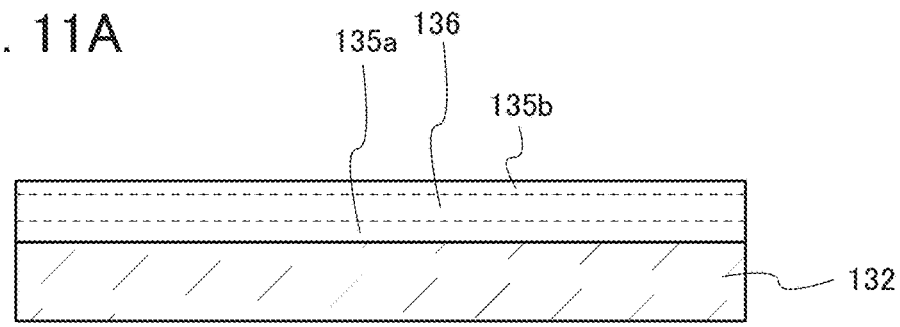
FIGS. 11A to 11C are cross-sectional views illustrating a formation mechanism of a multilayer film in one embodiment of the present invention.

First, a multilayer film including an oxide layer 135a provided over a base insulating film 132, an oxide semiconductor layer 136 provided over the oxide layer 135a, and an oxide layer 135b provided over the oxide semiconductor layer 136 is prepared (see FIG. 11A).

Figure 11B:
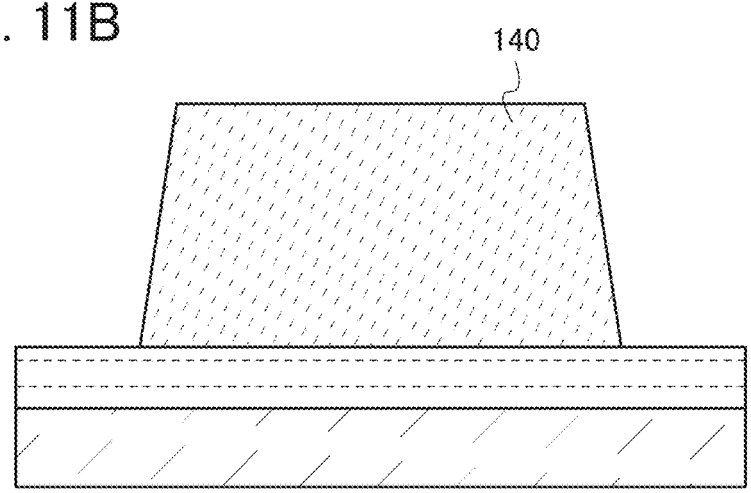

Next, a resist mask 140 is formed over part of the oxide layer 135b (see FIG. 11B).

Figure 11C:
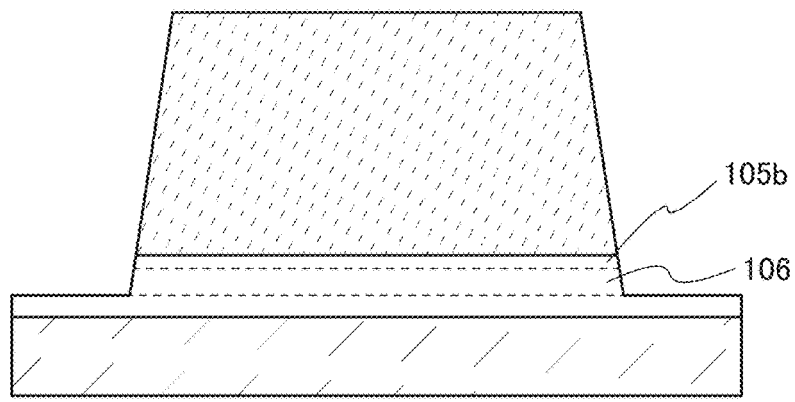

Then, the oxide layer 135b and the oxide semiconductor layer 136 in a region where the resist mask 140 is not provided are etched by a dry etching method, so that the oxide layer 135a is exposed (see FIG. 11C).

Figure 12A:
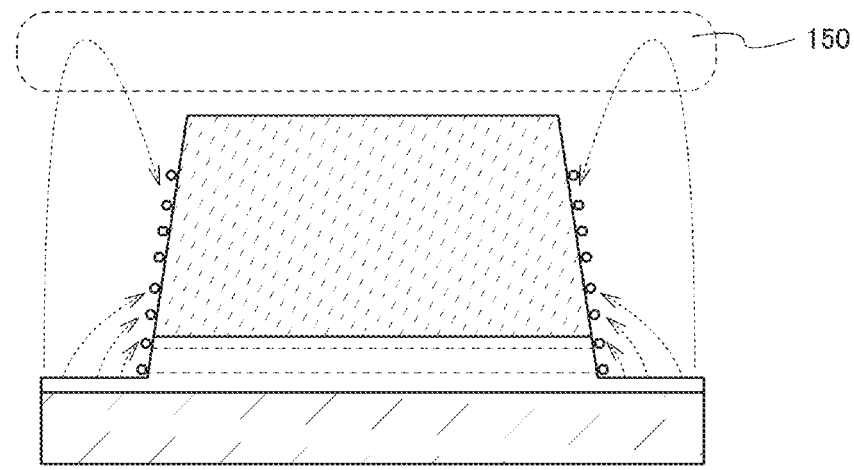
FIGS. 12A to 12C are cross-sectional views illustrating a formation mechanism of a multilayer film in one embodiment of the present invention.
Figure 12B:
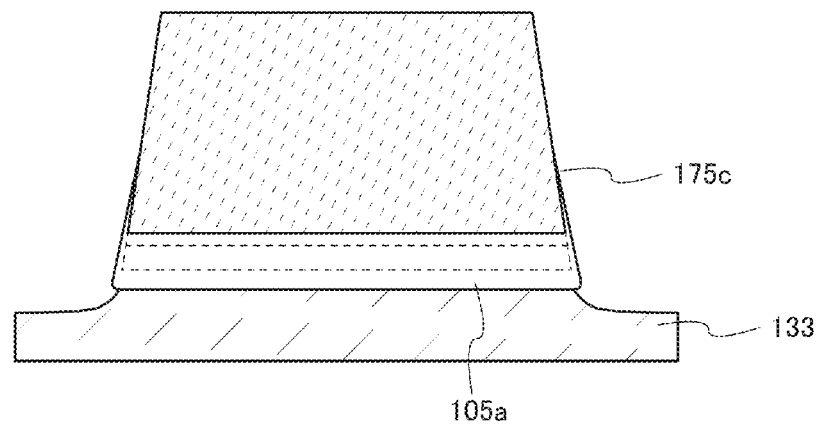
Figure 12C:
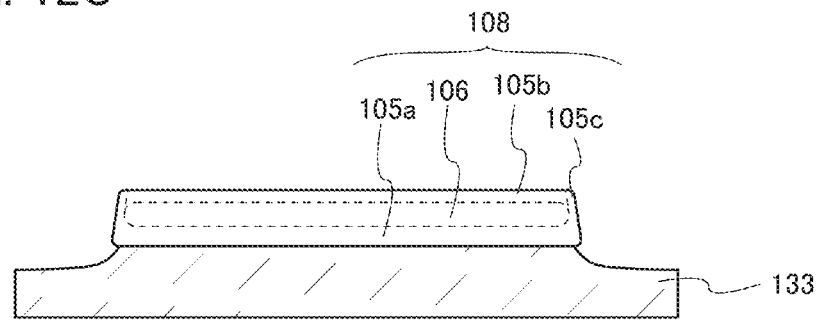

After that, the oxide layer 135a exposed by the dry etching method is etched (see FIG. 12A). At this time, a reaction product of the oxide layer 135a is attached to at least a side surface of the oxide semiconductor layer 106 in the multilayer film to form an oxide layer serving as a sidewall protective film (also referred to as a rabbit ear). Note that the reaction product of the oxide layer 135a is attached by a sputtering phenomenon or through plasma 150 at the time of the dry etching. The dry etching may be performed under the following conditions, for example: a boron trichloride gas and a chlorine gas are used as etching gases, and inductively coupled plasma (ICP) power and substrate bias power are applied.

Subsequently, the oxide layer 135a is etched so that the oxide layer 105a and an oxide layer 175c are formed. At this time, the base insulating film 132 is partly etched to be a base insulating film 133 (see FIG. 12B).

Note that since the oxide layer 175c is formed using the reaction product of the oxide layer 135a, constituent of the etching gas used at the time of etching (e.g., chlorine and boron) remains therein. When the constituent reacts with moisture or the like in the air, for example, the oxide layer 175c is further etched.

Next, the constituent of the etching gas remaining in the etched oxide layer 175c is removed by ashing treatment, whereby an oxide layer to be the oxide layer 105c is formed.

After that, the resist mask 140 is removed.

Then, heat treatment is performed in an atmosphere containing an oxidizing gas to reduce oxygen vacancies in the oxide layer 105a, the oxide semiconductor layer 106, the oxide layer 105b, and the oxide layer to be the oxide layer 105c. An oxygen vacancy is likely to occur particularly in the oxide layer to be the oxide layer 105c, because the oxide layer is formed using the reaction product at the time of etching. In such a manner, the oxide layer to be the oxide layer 105c becomes the oxide layer 105c with an extremely low carrier density by the above-described ashing treatment and the heat treatment (see FIG. 12C). Note that the oxidizing gas refers to a gas of oxygen, nitrous nitrogen, ozone, or the like. The heat treatment is performed at a temperature higher than or equal to 250° C. and lower than or equal to 650° C., preferably higher than or equal to 300° C. and lower than or equal to 500° C. The heat treatment is performed in an atmosphere containing an oxidizing gas at 10 ppm or more, 1% or more, or 10% or more. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen.

In the above manner, the multilayer film 108 which includes the oxide layer 105c having a curved surface can be formed. This means that a photomask or the like only for forming the oxide layer 105c is unnecessary to form the multilayer film 108 which includes the oxide layer 105c having a curved surface.

Figure 13A:
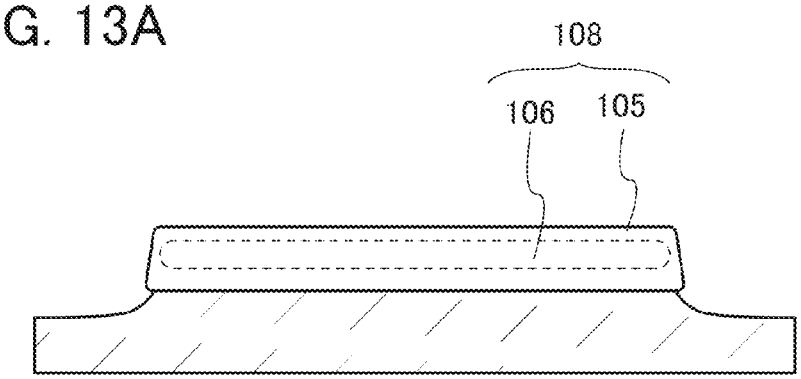
FIGS. 13A and 13B are cross-sectional views illustrating a formation mechanism of a multilayer film in one embodiment of the present invention.

The oxide layer 105a, the oxide layer 105b, and the oxide layer 105c formed in the above manner cannot be clearly distinguished from each other in some cases. Thus, the oxide layer 105a, the oxide layer 105b, and the oxide layer 105c can be collectively called an oxide layer 105. As illustrated in FIG. 13A, the oxide semiconductor layer 106 and the oxide layer 105 which surrounds the oxide semiconductor layer 106 can be collectively called the multilayer film 108.

Figure 13B:
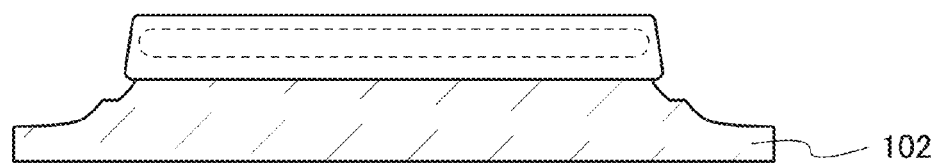

Next, the base insulating film 133 may be etched so that a base insulating film 102 having a plurality of steps (two steps here) is formed (see FIG. 13B). When the base insulating film 102 has two steps, the base insulating film 102 has three regions with different thicknesses.

<2-1-4. Formation Mechanism (2)>

An example of the formation mechanism of the multilayer film 108 which includes the oxide layer 105c having a curved surface is described with reference to FIGS. 14A to 14C and FIGS. 15A to 15C.

Figure 14A:
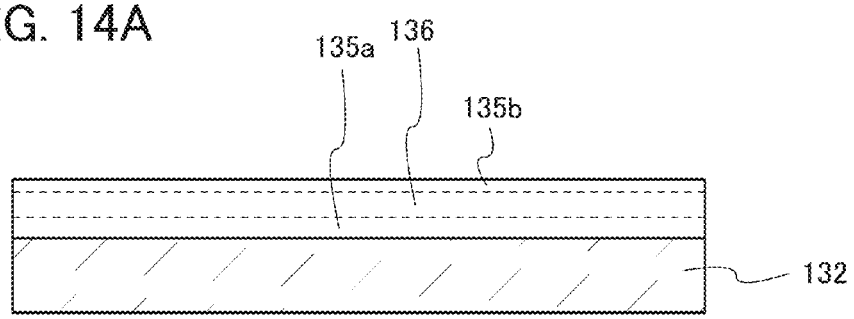
FIGS. 14A to 14C are cross-sectional views illustrating a formation mechanism of a multilayer film in one embodiment of the present invention.

First, a multilayer film including an oxide layer 135a provided over a base insulating film 132, an oxide semiconductor layer 136 provided over the oxide layer 135a, and an oxide layer 135b provided over the oxide semiconductor layer 136 is prepared (see FIG. 14A).

Figure 14B:
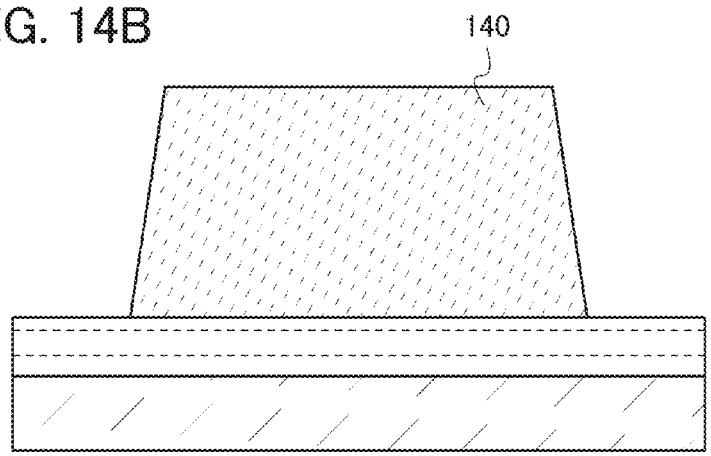
Figure 14C:
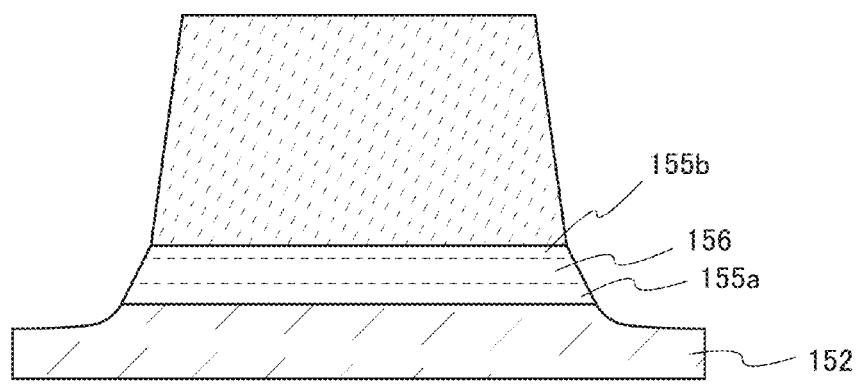

Next, a resist mask 140 is formed over part of the oxide layer 135b (see FIG. 14B).

Then, the oxide layer 135b, the oxide semiconductor layer 136, and the oxide layer 135a in a region where the resist mask 140 is not provided are etched by a dry etching method to be an oxide layer 155b, an oxide semiconductor layer 156, and an oxide layer 155a, respectively. At this time, the base insulating film 132 is partly etched to be a base insulating film 152 (see FIG. 14C). Note that the oxide layer 155b, the oxide semiconductor layer 156, and the oxide layer 155a have taper angles.

After that, the oxide layer 155b, the oxide semiconductor layer 156, and the oxide layer 155a are etched by a dry etching method to be the oxide layer 105b, the oxide semiconductor layer 106, and the oxide layer 105a, respectively. At this time, a reaction product of the oxide layer 155a is attached to a side surface of the multilayer film to form an oxide layer to be the oxide layer 105c serving as a sidewall protective film (also referred to as a rabbit ear). Note that the reaction product of the oxide layer 155a is attached by a sputtering phenomenon or through plasma at the time of the dry etching. At this time, the base insulating film 152 is partly etched and becomes the base insulating film 102 (see FIG. 15A).

Note that since the oxide layer to be the oxide layer 105c is formed using the reaction product of the oxide layer 155a, constituent of the etching gas used at the time of etching (e.g., chlorine and boron) remains therein.

Next, the constituent of the etching gas remaining in the oxide layer to be the oxide layer 105c is removed by ashing treatment.

After that, the resist mask 140 is removed.

Then, heat treatment is preferably performed in an atmosphere containing an oxidizing gas to reduce oxygen vacancies in the oxide layer 105a, the oxide semiconductor layer 106, the oxide layer 105b, and the oxide layer to be the oxide layer 105c. An oxygen vacancy is likely to occur particularly in the oxide layer to be the oxide layer 105c, because the oxide layer is formed using the reaction product at the time of etching. In such a manner, the oxide layer to be the oxide layer 105c becomes the oxide layer 105c with an extremely low carrier density by the above-described ashing treatment and the heat treatment (see FIG. 15B). Note that the oxidizing gas refers to a gas of oxygen, nitrous nitrogen, ozone, or the like.

In the above manner, the multilayer film 108 which includes the oxide layer 105c having a curved surface can be formed. This means that a photomask or the like only for forming the oxide layer 105c is unnecessary to form the multilayer film 108 which includes the oxide layer 105c having a curved surface.

Figure 15A:
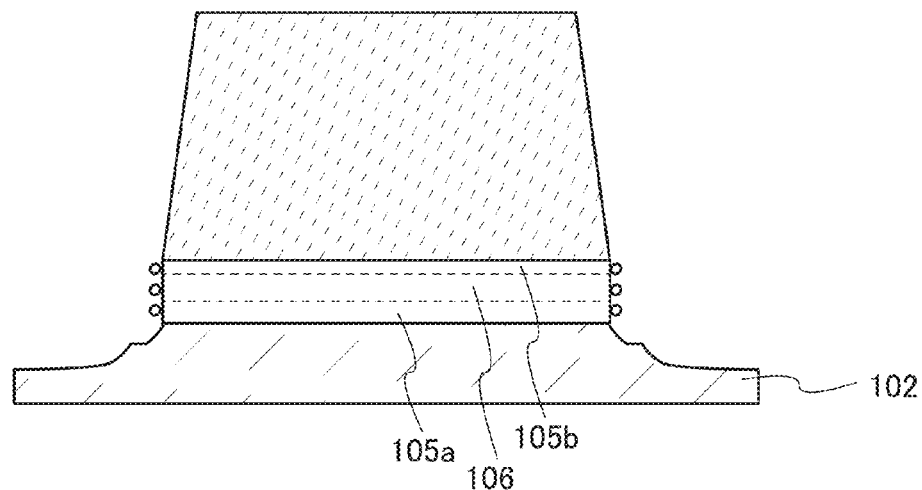
FIGS. 15A to 15C are cross-sectional views illustrating a formation mechanism of a multilayer film in one embodiment of the present invention.
Figure 15B:
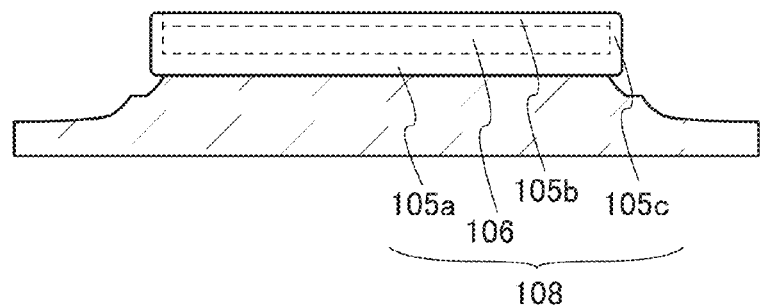
Figure 15C:
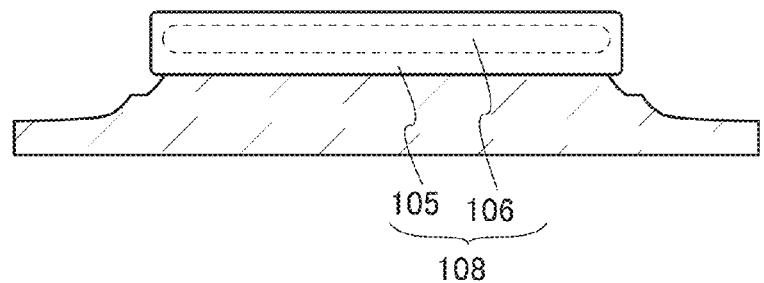

As described above, the oxide layer 105c is formed using the reaction product of the oxide layer 155a which becomes the oxide layer 105a. Thus, the oxide layer 105c might have composition and physical properties different from those of the oxide layer 105a because of its formation process. Note that the oxide layer 105a and the oxide layer 105c cannot be distinguished from each other by analysis or the like, in some cases. In that case, the oxide layer 105c has physical properties similar to those of the oxide layer 105a and if there is no description of the physical properties of the oxide layer 105c, the description of the oxide layer 105a can be referred to. Further, when the oxide layer 105b has a structure similar to that of the oxide layer 105a, the oxide layer 105b cannot be distinguished from the oxide layer 105c in some cases. Thus, the oxide layer 105a, the oxide layer 105b, and the oxide layer 105c can be collectively called an oxide layer 105. As illustrated in FIG. 15C, the oxide semiconductor layer 106 and the oxide layer 105 which surrounds the oxide semiconductor layer 106 can be collectively called the multilayer film 108.

The multilayer film 108 has a structure in which the oxide semiconductor layer 106 is surrounded (or wrapped or covered) by the oxide layer 105a, the oxide layer 105b, and the oxide layer 105c. Thus, entry of impurities to the oxide semiconductor layer 106 can be reduced. Further, since there is no level between the oxide semiconductor layer 106 and another oxide layer, the carrier mobility (electron mobility) of the oxide semiconductor layer 106 can be increased.

<2-2. Physical Properties of Multilayer Film>

In this section, the physical properties of the multilayer film will be described.

<2-2-1. Composition of Multilayer Film>

The compositions of the multilayer film 108, and the oxide layer 105a, the oxide semiconductor layer 106, the oxide layer 105b, and the oxide layer 105c included in the multilayer film 108 will be described below.

The oxide semiconductor layer 106 contains at least indium. In addition to indium, an element M (aluminum, titanium, silicon, gallium, germanium, yttrium, zirconium, tin, lanthanum, cerium, or hafnium) is preferably contained. It is preferable that the oxide semiconductor layer 106 contain at least indium because carrier mobility (electron mobility) can be increased.

The oxide layer 105a contains one or more elements which are not oxygen and are contained in the oxide semiconductor layer 106. For that reason, interface scattering is unlikely to occur at the interface between the oxide semiconductor layer 106 and the oxide layer 105a. Thus, the transistor can have high field-effect mobility because the movement of carriers is not hindered at the interface.

The oxide layer 105a may contain, for example, aluminum, titanium, silicon, gallium, germanium, yttrium, zirconium, tin, lanthanum, cerium, or hafnium at a higher atomic ratio than indium. Specifically, the amount of any of the above elements in the oxide layer 105a in an atomic ratio is 1.5 times or more, preferably 2 times or more, more preferably 3 times or more as much as that of indium in an atomic ratio. Any of the above elements strongly bonds with oxygen and thus has a function of suppressing generation of an oxygen vacancy in the oxide layer. That is, an oxygen vacancy is less likely to occur in the oxide layer 105a. Further, the oxide layer 105a contains any of the above elements at a higher atomic ratio than the oxide semiconductor layer 106.

The oxide layer 105b contains one or more elements which are not oxygen and are contained in the oxide semiconductor layer 106. Since the oxide layer 105b includes one or more elements other than oxygen included in the oxide semiconductor layer 106, an interface state is unlikely to be formed at the interface between the oxide semiconductor layer 106 and the oxide layer 105b. When the interface has an interface level, in some cases, a second transistor in which the interface serves as a channel and which has a different threshold voltage is formed; accordingly, the apparent threshold voltage of the transistor is changed. Thus, with the oxide layer 105b, fluctuation in the electric characteristics of the transistors, such as a threshold voltage, can be reduced.

The oxide layer 105b may contain, for example, aluminum, titanium, silicon, gallium, germanium, yttrium, zirconium, tin, lanthanum, cerium, or hafnium at a higher atomic ratio than indium. Specifically, the amount of any of the above elements in the oxide layer 105b in an atomic ratio is 1.5 times or more, preferably 2 times or more, more preferably 3 times or more as much as that of indium in an atomic ratio. Any of the above elements strongly bonds with oxygen and thus has a function of suppressing generation of an oxygen vacancy in the oxide layer. That is, an oxygen vacancy is less likely to occur in the oxide layer 105b. Further, the oxide layer 105b contains any of the above elements at a higher atomic ratio than the oxide semiconductor layer 106.

The description of the oxide layer 105a can be referred to for the oxide layer 105c. The oxide layer 105c is formed as the side surface of the multilayer film 108. When an oxygen vacancy occurs in the oxide layer 105c, a second transistor in which an interface between the oxide layer 105c and the oxide semiconductor layer 106 serves as a channel and which has a different threshold voltage is formed at the interface; accordingly, the apparent threshold voltage of the transistor is changed. Thus, with the oxide layer 105c in which an oxygen vacancy is less likely to occur, fluctuation in the electric characteristics of the transistors, such as a threshold voltage, can be reduced. The variation in the electric characteristics of the second transistor becomes noticeable, as a channel length of a transistor is smaller. This indicates that a smaller transistor has a stronger effect with the oxide layer 105c in which an oxygen vacancy is less likely to occur.

When indium contained in the oxide layer 105b is diffused outward, the electric characteristics of the transistor might deteriorate; thus, the oxide layer 105b preferably contains indium at a lower atomic ratio than the oxide semiconductor layer 106.

It is preferable that the oxide layer 105a and the oxide layer 105c be each an oxide layer in which an oxygen vacancy is less likely to occur than in the oxide layer 105b.

It is further preferable that the oxide layer 105a and the oxide layer 105c be each an oxide layer having a higher insulating property than the oxide layer 105b. To obtain the oxide layer 105a and the oxide layer 105c in which an oxygen vacancy occurs less frequently than in the oxide layer 105b and the insulating property is higher than that of the oxide layer 105b, the oxide layer 105a and the oxide layer 105c preferably contain an element which reduces occurrence of an oxygen vacancy in the oxide layer or a metal element which strongly bonds with oxygen at a higher concentration than the oxide layer 105b.

When an In-M-Zn oxide is used for the oxide layer 105a, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. When an In-M-Zn oxide is used for the oxide semiconductor layer 106, the atomic ratio between In and M is preferably as follows: the atomic percentage of In is greater than or equal to 25 atomic % and the atomic percentage of M is less than 75 atomic %; further preferably, the atomic percentage of In is greater than or equal to 34 atomic % and the atomic percentage of M is less than 66 atomic %. When an In-M-Zn oxide is used for the oxide layer 105b, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. When an In-M-Zn oxide is used for the oxide layer 105c, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

The thickness of the oxide layer 105a is greater than or equal to 3 nm and less than or equal to 100 nm, preferably greater than or equal to 3 nm and less than or equal to 50 nm. The thickness of the oxide semiconductor layer 106 is greater than or equal to 3 nm and less than or equal to 200 nm, preferably greater than or equal to 3 nm and less than or equal to 100 nm, more preferably greater than or equal to 3 nm and less than or equal to 50 nm. The thickness of the oxide layer 105b is greater than or equal to 3 nm and less than or equal to 50 nm, preferably greater than or equal to 3 nm and less than or equal to 20 nm. The thicknesses of the oxide layer 105a and the oxide layer 105c are preferably larger than the thickness of the oxide layer 105b. In other words, the thickness of the oxide layer 105b is preferably smaller than the thicknesses of the oxide layer 105a and the oxide layer 105c.

In the case where the oxide layer 105a and the oxide layer 105b are formed by a sputtering method, a target containing indium is preferably used in order not to increase the number of particles. Moreover, it is preferable to use an oxide target in which the proportion of gallium is relatively small. Particularly in the case where a target containing indium is used, the conductivity of the target can be increased and DC discharge and AC discharge are facilitated; thus, deposition over a large substrate can be easily performed. Thus, semiconductor devices can be manufactured with improved productivity.

<2-2-2. Band Structure of Multilayer Film>

First of all, a band structure of the multilayer film including the oxide semiconductor layer will be described.

Figure 16A:
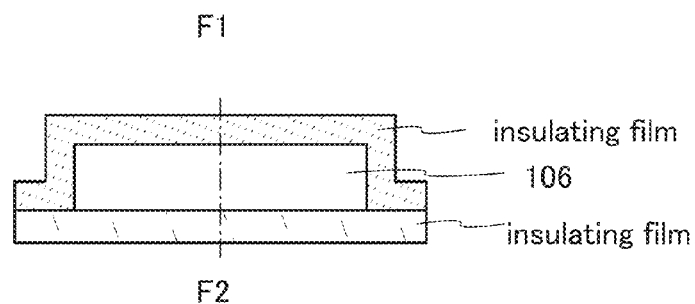
FIG. 16A is a cross-sectional view of the case where an oxide semiconductor layer is a single layer and FIG. 16B shows a band structure thereof.
Figure 16B:
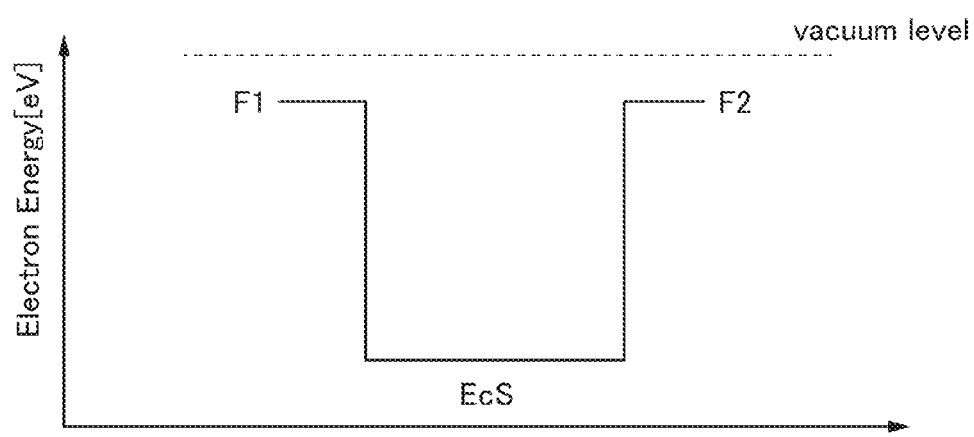

FIG. 16A is a cross-sectional view of the case of using a single layer of the oxide semiconductor layer 106, which is shown as a comparative example. FIG. 16B shows a band structure along dashed-dotted line F1-F2 in FIG. 16A. The lowest conduction band energy of the oxide semiconductor layer 106 is denoted by "EcS". Note that FIGS. 16A and 16B show the case where an insulating film (e.g., a silicon oxide film) which has an energy gap sufficiently wider than that of the oxide semiconductor layer 106 and has the lowest conduction band energy sufficiently higher than that of the oxide semiconductor layer 106 is provided over and below the oxide semiconductor layer 106.

According to FIG. 16B, in the case of using a single layer of the oxide semiconductor layer 106, the lowest conduction band energy is probably changed discontinuously (discontinuous connection) between the oxide semiconductor layer 106 and the insulating films. This is because the insulating film has an energy gap sufficiently wider than that of the oxide semiconductor layer 106 and has the lowest conduction band energy sufficiently higher than that of the oxide semiconductor layer 106, that is, the insulating film has physical properties completely different from those of the oxide semiconductor layer 106.

This suggests that a number of DOS exist at an interface between the oxide semiconductor layer 106 and the insulating film. The DOS which exists at the interface between the oxide semiconductor layer 106 and the insulating film (corresponding to a gate insulating film or a protective insulating film) in a transistor including a single layer of the oxide semiconductor layer 106 causes deterioration of the transistor in some cases.

Figure 17A:
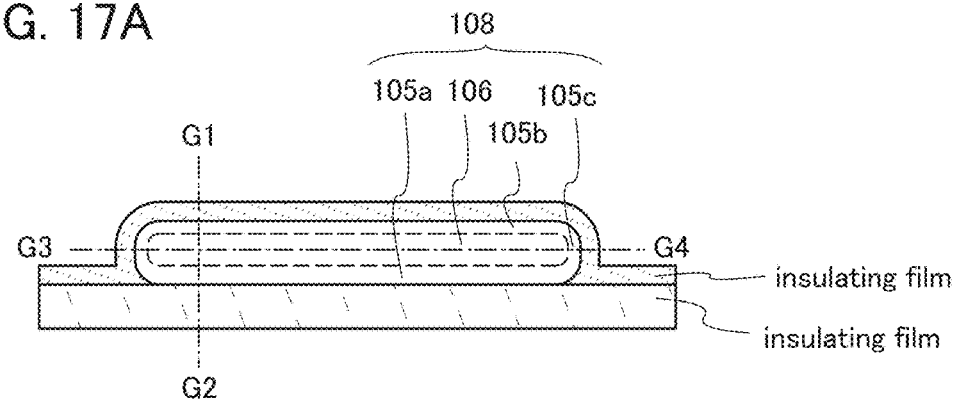
FIG. 17A is a cross-sectional view of the case of where a multilayer film is used and FIGS. 17B and 17C show band structures thereof.
Figure 17B:
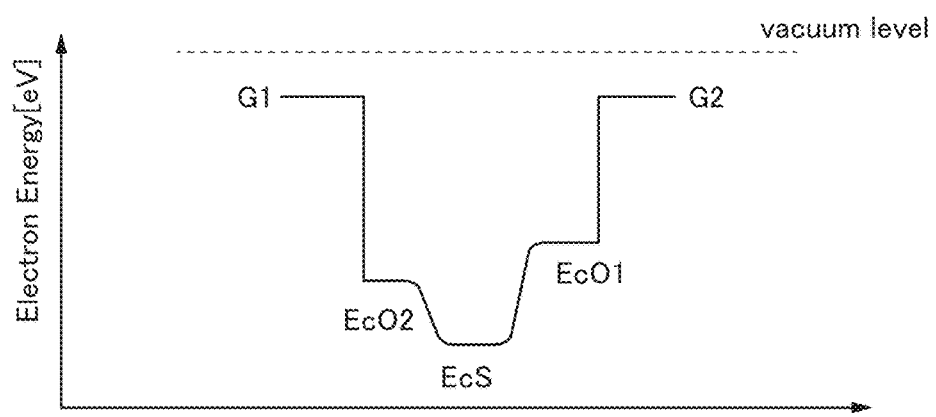
Figure 17C:
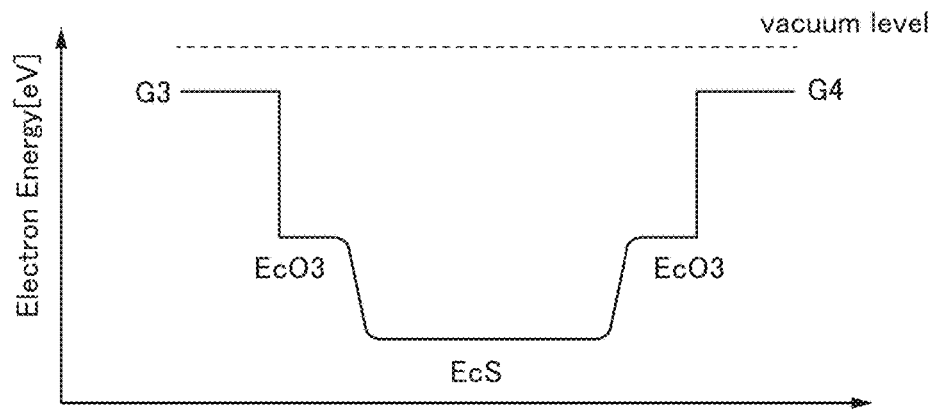

FIG. 17A is a cross-sectional view of the multilayer film 108. FIG. 17B shows a band structure along dashed-dotted line G1-G2 in FIG. 17A and FIG. 17C shows a band structure along dashed-dotted line G3-G4 in FIG. 17A. The lowest conduction band energy of the oxide layer 105a is denoted by "EcO1", the lowest conduction band energy of the oxide layer 105b is denoted by "EcO2", and the lowest conduction band energy of the oxide layer 105c is "EcO3". Note that FIGS. 17A to 17C show the case of providing insulating films (e.g., silicon oxide films) which surround the multilayer film 108 and each of which has an energy gap sufficiently wider than that of any layer in the multilayer film 108, and has the lowest conduction band energy sufficiently higher than that of any layer in the multilayer film 108.

The oxide layer 105a, the oxide semiconductor layer 106, the oxide layer 105b, and the oxide layer 105c are selected so that the relation expressed by Formula (2) is satisfied when the lowest conduction band energies of the oxide layer 105a, the oxide semiconductor layer 106, the oxide layer 105b, and the oxide layer 105c are EcS1, EcS2, EcS3, and EcS4, respectively.

$$EcS1 \approx EcS4 \geq EcS3 > EcS2 \qquad \text{[Formula 2]}$$

According to FIG. 17B, in the multilayer film 108, the lowest conduction band energy is probably changed continuously (continuous connection) between the oxide layers 105a and 105b and the oxide semiconductor layer 106. This is because the oxide layer 105a and the oxide layer 105b have physical properties similar to those of the oxide semiconductor layer 106.

This suggests that DOS scarcely exists at interfaces between the oxide semiconductor layer 106 and the oxide layers 105a and 105b. Since the oxide layer 105a and the oxide layer 105b are oxide layers in which an oxygen vacancy is less likely to occur as described above, DOS which is probably due to an oxygen vacancy scarcely exists.

Note that for each of the oxide layer 105a, the oxide layer 105b, the oxide layer 105c, and the oxide semiconductor layer 106, the difference (also referred to as the electron affinity) between the lowest conduction band energy and the vacuum energy can be obtained by subtracting an energy gap from the difference (also referred to as an ionization potential) between the vacuum energy and the highest valence band energy.

The energy gaps can be measured using a spectroscopic ellipsometer (UT-300 manufactured by HORIBA JOBIN YVON SAS.). The ionization potential can be measured using an ultraviolet photoelectron spectroscopy (UPS) apparatus (VersaProbe manufactured by Physical Electronics, Inc.).

According to FIGS. 17B and 17C, the oxide semiconductor layer 106 of the multilayer film 108 serves as a well and a channel of the transistor including the multilayer film 108 is formed in the oxide semiconductor layer 106. Note that since the lowest conduction band energy of the multilayer film 108 is continuously changed, the oxide semiconductor layer 106 and the oxide layer 105b can be regarded as being continuously connected.

Then, diffusion of oxygen in the multilayer film 108 through heat treatment at 300° C. or 450° C. will be described with reference to FIGS. 18A to 18C.

Figure 18A:
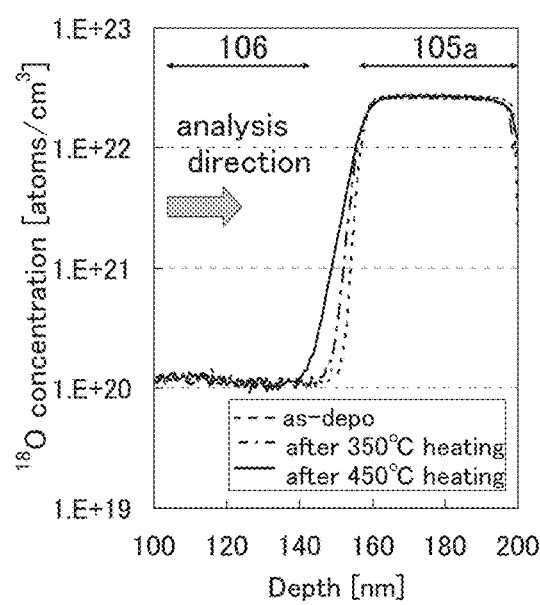
FIGS. 18A to 18C each show diffusion of oxygen in a multilayer film in one embodiment of the present invention.
Figure 18B:
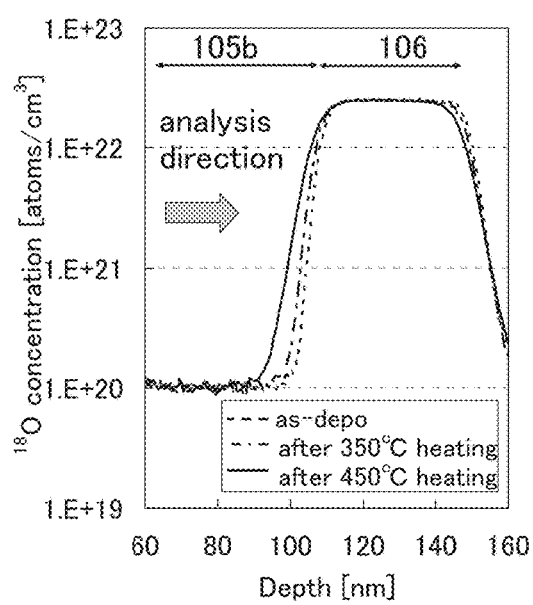
Figure 18C:
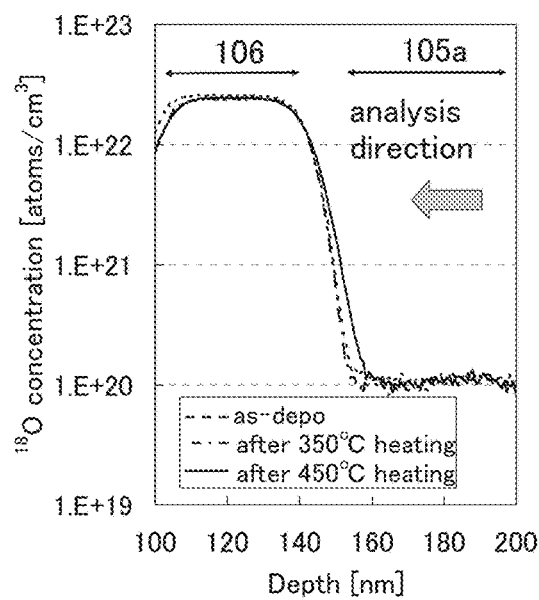

FIGS. 18A to 18C each show SIMS measurement results of concentration distribution of $^{18}O$ in a depth direction in samples in which any of the layers of the multilayer film 108 is formed using an $^{18}O_2$ gas.

Here, the oxide layer 105a is an oxide layer formed by a sputtering method using an In—Ga—Zn oxide (the atomic ratio of In to Ga and Zn is 1:1:1) target.

The oxide semiconductor layer 106 is an oxide semiconductor layer formed by a sputtering method using an In—Ga—Zn oxide (the atomic ratio of In to Ga and Zn is 3:1:2) target.

The oxide layer 105b is an oxide layer formed by a sputtering method using an In—Ga—Zn oxide (the atomic ratio of In to Ga and Zn is 1:1:1) target.

Here, FIG. 18A shows $^{18}O$ concentration distributions in a depth direction of the oxide layer 105a, the oxide semiconductor layer 106, and the interface therebetween of samples in each of which an $^{18}O_2$ gas is used for forming the oxide layer 105a but an $^{18}O_2$ gas is not used for forming the other layers. The SIMS measurement results show as follows: $^{18}O$ is more diffused from the oxide layer 105a to the oxide semiconductor layer 106 in a sample subjected to the heat treatment at 350° C. (shown as "after heat treatment at 350° C." with a dashed-dotted line) and a sample subjected to the heat treatment at 450° C. (shown as "after heat treatment at 450° C." with a solid line) than in a sample not subjected to heat treatment (shown as "as-depo" with a dotted line).

FIG. 18B shows $^{18}O$ concentration distributions in a depth direction of the oxide semiconductor layer 106, the oxide layer 105b, and the interface therebetween of samples in each of which an $^{18}O_2$ gas is used for forming oxide semiconductor layer 106 but an $^{18}O_2$ gas is not used for forming the other layers. The SIMS measurement results show as follows: $^{18}O$ is more diffused from the oxide semiconductor layer 106 to the oxide layer 105b in a sample subjected to the heat treatment at 350° C. (shown as "after heat treatment at 350° C." with a dashed-dotted line) and a sample subjected to the heat treatment at 450° C. (shown as "after heat treatment at 450° C." with a solid line) than in a sample not subjected to heat treatment (shown as "as-depo" with a dotted line).

FIG. 18C shows $^{18}O$ concentration distributions in a depth direction of the oxide layer 105a, the oxide semiconductor layer 106, and the interface therebetween of samples in each of which an $^{18}O_2$ gas is used for forming the oxide semiconductor layer 106 but an $^{18}O_2$ gas is not used for forming the other layers. The SIMS measurement results show as follows: $^{18}O$ is more diffused from the oxide semiconductor layer 106 to the oxide layer 105a in a sample subjected to the heat treatment at 350° C. (shown as "after heat treatment at 350° C." with a dashed-dotted line) than in a sample subjected to the heat treatment at 450° C. (shown as "after heat treatment at 450° C." with a solid line) and a sample not subjected to heat treatment (shown as "as-depo" with a dotted line).

As shown in FIGS. 18A to 18C, in the multilayer film 108, oxygen is diffused from one layer to the other layer. This means that at an interface between any two of the oxide layer 105a, the oxide semiconductor layer 106, the oxide layer 105b, and the oxide layer 105c, a layer in which constituent elements of the two layers are mixed (also referred to as a mixed layer) is formed and the two layers are continuously connected. Note that the mixed layer has an intermediate property between the two layers.

Next, DOS in the multilayer film 108 was measured by CPM.

In order that the transistor may have high field-effect mobility and stable electric characteristics, the absorption coefficient due to the localized states of the multilayer film 108 measured by CPM is preferably lower than $1\times10^{-3}$ cm$^{-1}$, more preferably lower than $3\times10^{-4}$ cm$^{-1}$.

A sample on which CPM measurement was performed will be described below.

The oxide layer 105a is an oxide layer formed by a sputtering method using an In—Ga—Zn oxide (the atomic ratio of In to Ga and Zn is 1:3:2) target. Note that an argon gas at a flow rate of 30 sccm and an oxygen gas at a flow rate of 15 sccm were used as a deposition gas, the pressure was 0.4 Pa, the substrate temperature was 200° C., and a DC power of 0.5 kW was applied.

The oxide semiconductor layer 106 is an oxide semiconductor layer formed by a sputtering method using an In—Ga—Zn oxide (the atomic ratio of In to Ga and Zn is 1:1:1) target. Note that an argon gas at a flow rate of 30 sccm and an oxygen gas at a flow rate of 15 sccm were used as a deposition gas, the pressure was 0.4 Pa, the substrate temperature was 200° C., and a DC power of 0.5 kW was applied.

The oxide layer 105b is an oxide layer formed by a sputtering method using an In—Ga—Zn oxide (the atomic ratio of In to Ga and Zn is 1:3:2) target. Note that an argon gas at a flow rate of 30 sccm and an oxygen gas at a flow rate of 15 sccm were used as a deposition gas, the pressure was 0.4 Pa, the substrate temperature was 200° C., and a DC power of 0.5 kW was applied.

Here, in order to improve the accuracy of the CPM measurement, the multilayer film 108 needs to have a certain thickness. Specifically, the thicknesses of the oxide layer 105a, the oxide semiconductor layer 106, and the oxide layer 105b which are included in the multilayer film 108 were set at 30 nm, 100 nm, and 30 nm, respectively.

In the CPM measurement, the amount of light with which a surface of the sample between terminals is irradiated is adjusted so that a photocurrent value is kept constant in the state where voltage is applied between a first electrode and a second electrode provided in contact with the multilayer film 108 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

Figure 19A:
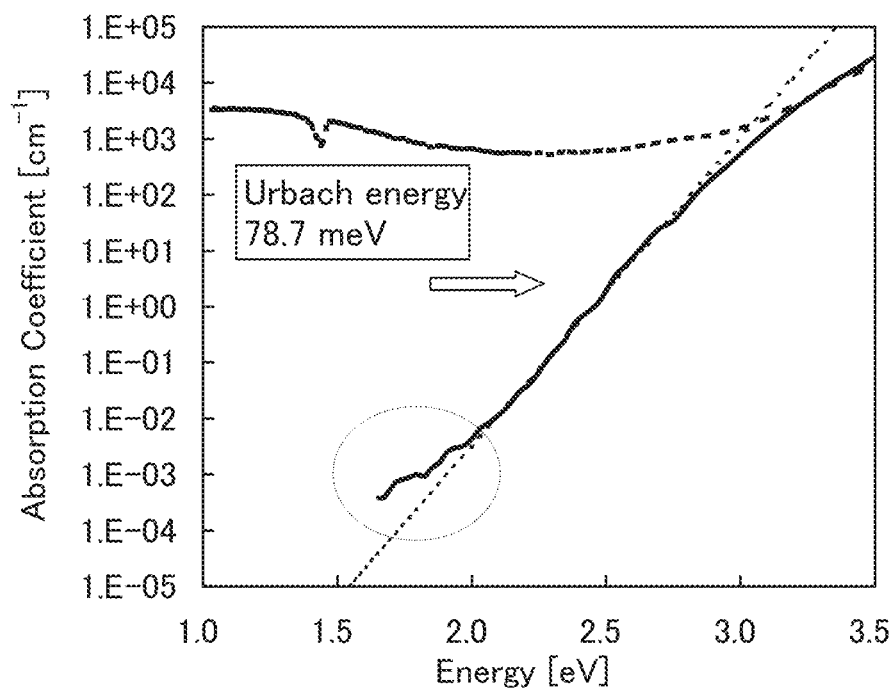
FIGS. 19A and 19B show results of CPM measurement of a multilayer film in one embodiment of the present invention.
Figure 19B:
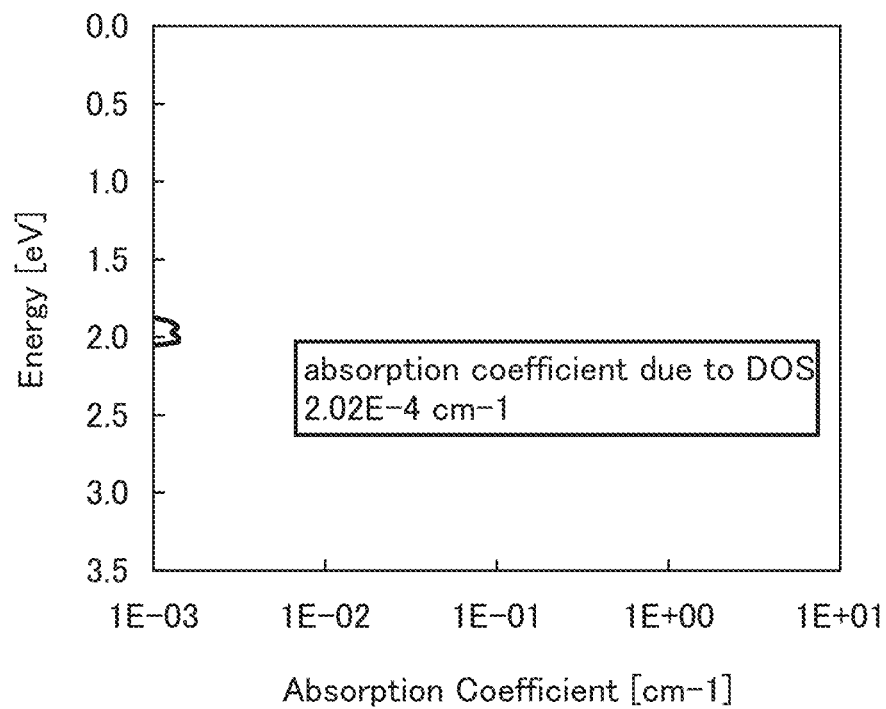

FIG. 19A shows results of fitting the absorption coefficient (dotted line) measured using a spectrophotometer and the absorption coefficient (solid line) measured by CPM in the range of energy higher than or equal to the energy gap of each layer in the multilayer film 108. Note that the Urbach energy obtained based on the absorption coefficient measured by CPM was 78.7 meV. The integral value of the absorption coefficient in the energy range was derived in such a manner that a background (thin dotted line) was subtracted from the absorption coefficient measured by CPM in the energy range shown with a dashed-line circle in FIG. 19A (see FIG. 19B). As a result, the absorption coefficient due to DOS of this sample was found to be $2.02 \times 10^{-4}$ cm$^{-1}$.

This indicates that an extremely small number of DOS is in the multilayer film 108. That is, the transistor including the multilayer film 108 has high field-effect mobility and stable electric characteristics.

<2-2-3. Impurities in Multilayer Film>

The concentrations of silicon in the layers included in the multilayer film 108 will be described below with reference to FIG. 20.

The oxide layer 105a is an oxide layer formed by a sputtering method using an In—Ga—Zn oxide (the atomic ratio of In to Ga and Zn is 1:3:2) target. Note that the deposition was performed under the following conditions: an argon gas at a flow rate of 30 sccm and an oxygen gas at a flow rate of 15 sccm were used as a deposition gas; the pressure was 0.4 Pa; the substrate temperature was 200° C.; and a DC power of 0.5 kW was applied.

The oxide semiconductor layer 106 is an oxide semiconductor layer formed by a sputtering method using an In—Ga—Zn oxide (the atomic ratio of In to Ga and Zn is 1:1:1) target. Note that the deposition was performed under the following conditions: an argon gas at a flow rate of 30 sccm and an oxygen gas at a flow rate of 15 sccm were used as a deposition gas; the pressure was 0.4 Pa; the substrate temperature was 300° C.; and a DC power of 0.5 kW was applied.

The oxide layer 105b is an oxide layer formed by a sputtering method using an In—Ga—Zn oxide (the atomic ratio of In to Ga and Zn is 1:3:2) target. Note that the deposition was performed under the following conditions: an argon gas at a flow rate of 30 sccm and an oxygen gas at a flow rate of 15 sccm were used as a deposition gas; the pressure was 0.4 Pa; the substrate temperature was 200° C.; and a DC power of 0.5 kW was applied.

The multilayer film 108 is provided over a silicon wafer, and a sample not subjected to heat treatment and a sample subjected to heat treatment at 450° C. for two hours are prepared. The secondary ion intensities of In, Ga, and Zn in a depth direction, and the SiO$_3$ concentration (atoms/cm$^3$) in a depth direction of the samples measured by ToF-SIMS (Time-of-flight secondary ion mass spectrometry) are shown. The multilayer film 108 includes the oxide layer 105a having a thickness of 10 nm, the oxide semiconductor layer 106 having a thickness of 10 nm over the oxide layer 105a, and the oxide layer 105b having a thickness of 10 nm over the oxide semiconductor layer 106.

Figure 20:
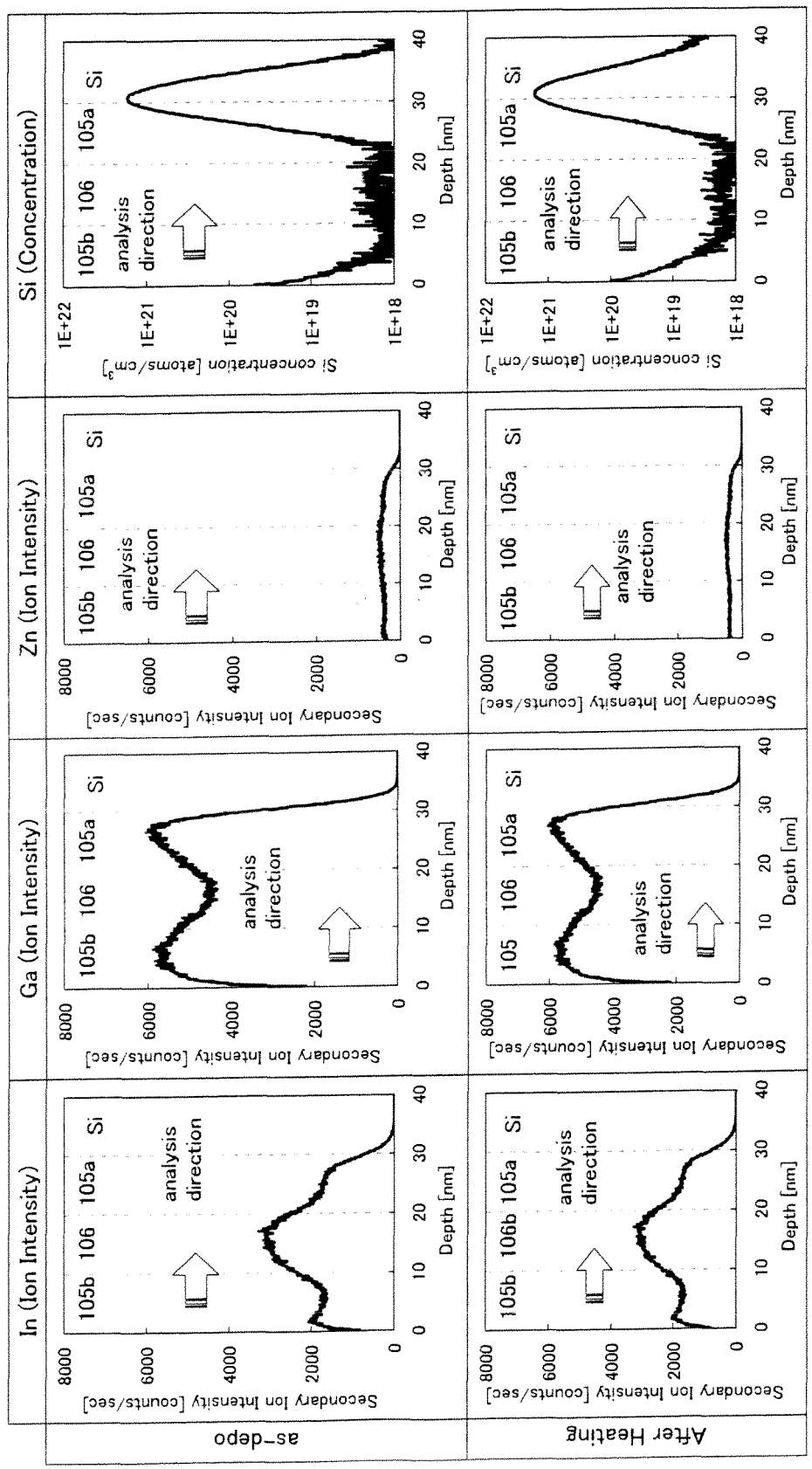
FIG. 20 shows ToF-SIMS results of a multilayer film in one embodiment of the present invention.

FIG. 20 shows that the compositions of the layers included in the multilayer film 108 are changed depending on the compositions of the respective targets used at the time of the deposition. Note that the compositions of the layers cannot be simply compared using FIG. 20.

FIG. 20 indicates that the interface between the silicon wafer and the oxide layer 105a of the multilayer film 108 and the upper surface of the oxide layer 105b has higher SiO$_3$ concentrations. Moreover, FIG. 20 shows that the concentration of SiO$_3$ in the oxide semiconductor layer 106 is about $1 \times 10^{18}$ atoms/cm$^3$ which is the lower limit of detection by Tof-SIMS. This is probably because, owing to existence of the oxide layers 105a and 105b, the oxide semiconductor layer 106 is not influenced by silicon due to the silicon wafer or the surface contamination. Although silicon is contained in the oxide layer 105a and the oxide layer 105b, silicon probably does not contribute to deterioration of the electric characteristics of the transistor because an oxygen vacancy is less likely to occur in the oxide layer 105a and the oxide layer 105b by entry of silicon.

Further, comparison of the sample after the heat treatment with an as-deposited sample (the sample not subjected to heat treatment, referred to as "as-depo" in FIG. 20) indicates that silicon is less likely to be diffused by the heat treatment though entry of silicon mainly occurs at the time of the deposition.

It is effective to highly purify the oxide semiconductor layer 106 to be a highly purified intrinsic oxide semiconductor layer so that a transistor including the multilayer film 108 has stable electric characteristics. Specifically, the carrier density of the oxide semiconductor layer 106 can be set to be lower than $1 \times 10^{17}$/cm$^3$, lower than $1 \times 10^{15}$/cm$^3$, or lower than $1 \times 10^{13}$/cm$^3$. In the oxide semiconductor layer 106, hydrogen, nitrogen, carbon, silicon, and a metal element other than the main component become an impurity. In order to reduce the concentration of impurities in the oxide semiconductor layer 106, it is also preferable to reduce the concentration of impurities in the oxide layers 105a and 105b which are close to the oxide semiconductor layer 106 to a value almost equal to that in the oxide semiconductor layer 106.

Particularly when silicon is contained in the oxide semiconductor layer 106 at a high concentration, an impurity level due to silicon is formed in the oxide semiconductor layer 106. In some cases, the impurity level becomes a trap, which deteriorates the electric characteristics of the transistor. In order to make the deterioration of the electric characteristics of the transistor small, the concentration of silicon in the oxide semiconductor layer 106 can be set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$. Moreover, the concentrations of silicon at the interface between the oxide layer 105a and the oxide semiconductor layer 106 and the interface between the oxide semiconductor layer 106 and the oxide layer 105b are each set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$.

In the oxide semiconductor layer 106, hydrogen enters an oxygen vacancy portion, so that DOS is formed. In order to make the oxide semiconductor layer 106 intrinsic or substantially intrinsic, the concentration of hydrogen in the oxide semiconductor layer 106, which is measured by SIMS, is set to be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

Note that when silicon and carbon are contained in the oxide semiconductor layer 106 at a high concentration, the crystallinity of the oxide semiconductor layer 106 is lowered in some cases. In order not to lower the crystallinity of the oxide semiconductor layer 106, the concentration of silicon in the oxide semiconductor layer 106 can be set to be lower than $1\times10^{19}$ atoms/cm$^3$, preferably lower than $5\times10^{18}$ atoms/cm$^3$, more preferably lower than $1\times10^{18}$ atoms/cm$^3$. Moreover, in order not to lower the crystallinity of the oxide semiconductor layer 106, the concentration of carbon in the oxide semiconductor layer 106 can be set to be lower than $1\times10^{19}$ atoms/cm$^3$, preferably lower than $5\times10^{18}$ atoms/cm$^3$, more preferably lower than $1\times10^{18}$ atoms/cm$^3$. Description of the crystallinity of the multilayer film 108 will be made later.

<2-2-4. Crystallinity of Multilayer Film>

The crystallinity of each of the oxide layer 105*a*, the oxide semiconductor layer 106, the oxide layer 105*b*, and the oxide layer 105*c* included in the multilayer film 108 will be described below.

In the multilayer film 108, the oxide layer 105*a*, the oxide semiconductor layer 106, the oxide layer 105*b*, and the oxide layer 105*c* each have an amorphous structure or a crystalline structure.

A structure of an oxide semiconductor layer (oxide layer) will be described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Further, the trigonal and rhombohedral crystal systems are included in the hexagonal crystal system.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, change in electric characteristics due to irradiation with visible light or ultraviolet light is small. Thus, the transistor has high reliability.

Note that an oxide semiconductor layer may be a stacked film including two or more films of an amorphous oxide semiconductor layer, a microcrystalline oxide semiconductor layer, and a CAAC-OS film, for example.

It is preferable that at least the oxide semiconductor layer 106 in the multilayer film 108 have a crystalline structure. It is particularly preferable that a CAAC-OS layer be used.

When the oxide semiconductor layer 106 is a CAAC-OS layer, the oxide layer 105a which is a base preferably has a crystalline structure similar to that of the CAAC-OS layer or an amorphous structure. In addition, when the oxide semiconductor layer 106 is the CAAC-OS layer, the oxide layer 105b whose base is the oxide semiconductor layer 106 tends to have a crystalline structure similar to that of the CAAC-OS layer. Note that the structure of the oxide layer 105b is not limited to a crystalline structure and can be an amorphous structure.

The oxide layer 105c may have either an amorphous structure or a crystalline structure.

In the transistor including the multilayer film 108, the oxide semiconductor layer 106 is a layer in which a channel is formed; thus, it is preferable that the oxide semiconductor layer 106 have high crystallinity so that the transistor can have stable electric characteristics.

<3. Transistor Including Multilayer Film>

Hereinafter, a transistor including the multilayer film 108 in which a channel is formed in the oxide semiconductor layer 106 will be described.

<3-1. Transistor Structure (1)>

Here, a top-gate top-contact (TGTC) transistor, which is one kind of top-gate transistor, is described with reference to FIGS. 21A to 21C.

Figure 21A:
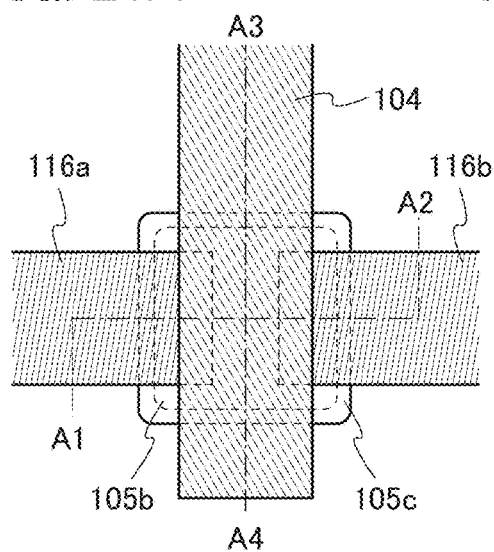
FIGS. 21A to 21C are a top view and cross-sectional views illustrating a semiconductor device in one embodiment of the present invention.
Figure 21C:
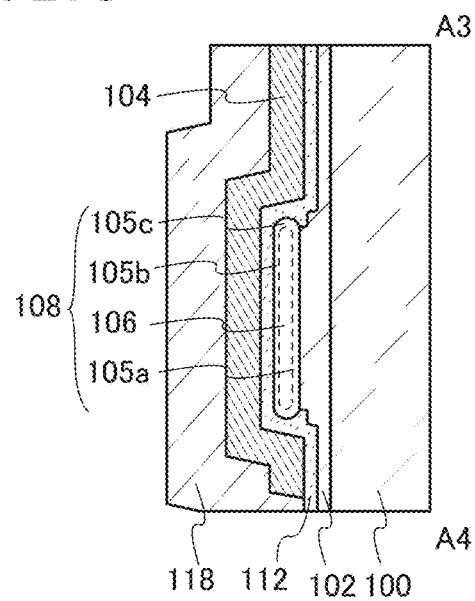
Figure 21B:
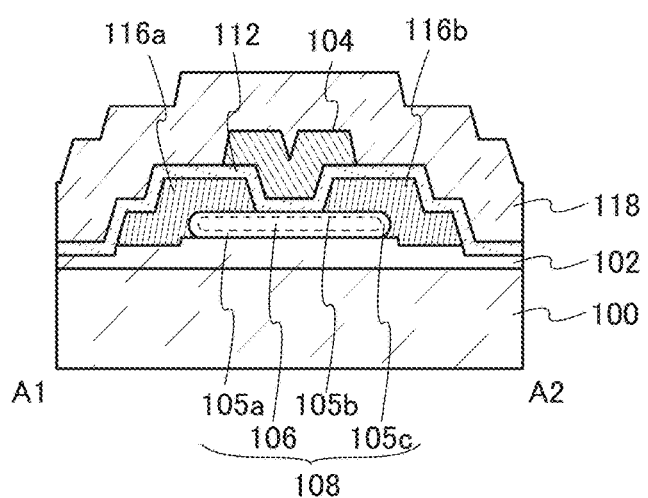

FIGS. 21A to 21C are a top view and cross-sectional views of the TGTC transistor. FIG. 21A is a top view of the transistor. FIG. 21B is a cross-sectional view taken along dashed-dotted line A1-A2 in FIG. 21A. FIG. 21C is a cross-sectional view taken along dashed-dotted line A3-A4 in FIG. 21A.

The transistor illustrated in FIG. 21B includes the base insulating film 102 provided over a substrate 100; the multilayer film 108 including the oxide semiconductor layer 106 which is provided over the base insulating film 102 and the oxide layer 105 which surrounds the oxide semiconductor layer 106; a source electrode 116a and a drain electrode 116b provided over the base insulating film 102 and the multilayer film 108; a gate insulating film 112 provided over the multilayer film 108, the source electrode 116a, and the drain electrode 116b; a gate electrode 104 provided over the gate insulating film 112; and a protective insulating film 118 provided over the gate insulating film 112 and the gate electrode 104. The transistor does not necessarily include the base insulating film 102 and/or the protective insulating film 118.

Figure 22A:
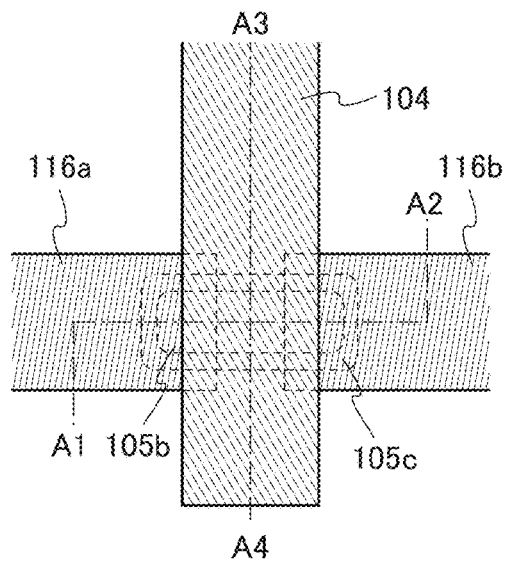
FIGS. 22A to 22C are a top view and cross-sectional views illustrating a semiconductor device in one embodiment of the present invention.
Figure 22C:
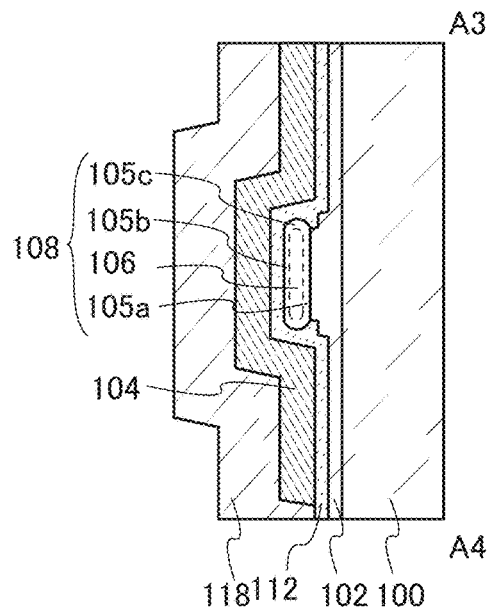
Figure 22B:
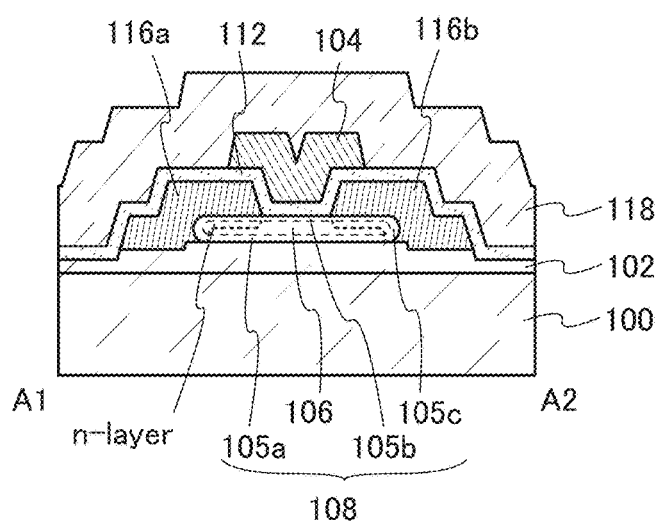

Note that the multilayer film 108 may be provided in an inner side than the width of the source electrode 116a and the drain electrode 116b (the length in the channel width direction) as in a transistor illustrated in FIGS. 22A to 22C. The multilayer film 108 in the transistor illustrated in FIGS. 22A to 22C is shielded from light by the gate electrode 104, the source electrode 116a, and the drain electrode 116b. As a result, a change in electric characteristics due to light is unlikely to occur.

A channel formation region of the transistor illustrated in FIGS. 21A to 21C is in the multilayer film 108 which is sandwiched between the source electrode 116a and the drain electrode 116b and overlaps with the gate electrode 104. Here, a main path of current which flows in the oxide semiconductor layer 106 is called a channel.

Depending on the kind of conductive film used for the source electrode 116a and the drain electrode 116b, in some cases, oxygen is released from part of the multilayer film 108 or a mixed layer (a layer formed due to an entry of a metal element, which is a main component of the conductive film, in the multilayer film 108) is formed, whereby a source region and a drain region are formed in the multilayer film 108 which is between the channel and the source electrode 116a and the drain electrode 116b.

Figure 23A:
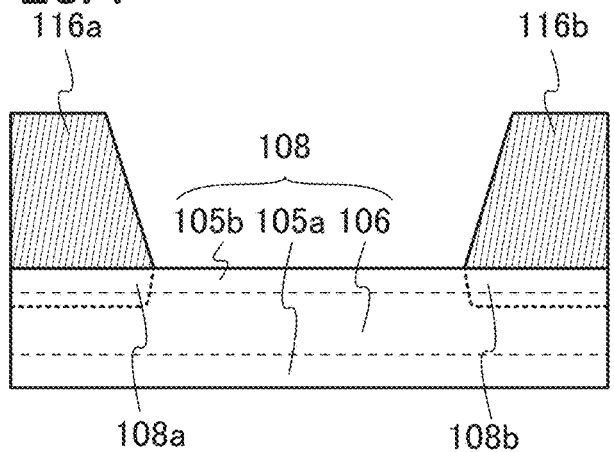
FIGS. 23A to 23C are cross-sectional views each illustrating shapes of a source electrode and a drain electrode.
Figure 23B:
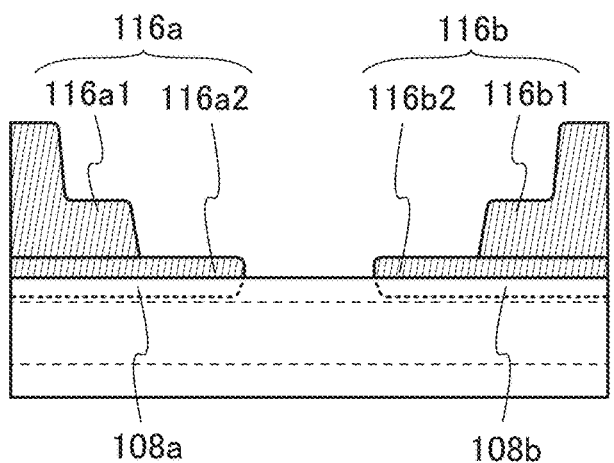
Figure 23C:
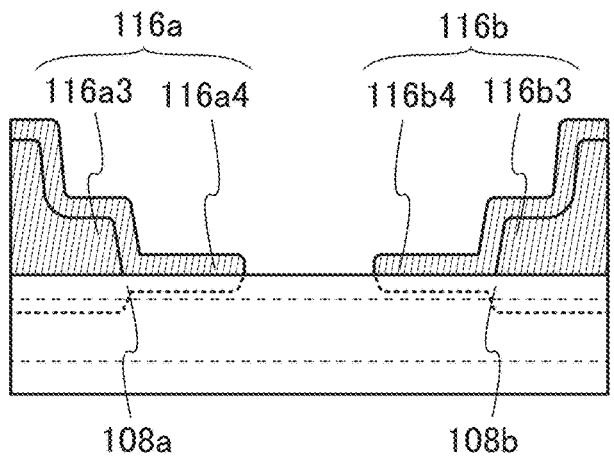

FIGS. 23A to 23C are cross-sectional views of the vicinities of the source electrode 116a and the drain electrode 116b of the transistor. The source electrode 116a and the drain electrode 116b may have any structure illustrated in FIGS. 23A to 23C. In some cases, an etching region where the top surface of the multilayer film 108 is partly etched at the time of forming the source electrode 116a and the drain electrode 116b is formed; however, the etching region is not illustrated in FIGS. 23A to 23C for easy understanding.

The structure in FIG. 23A is similar to that of the source electrode 116a and the drain electrode 116b in FIG. 21B. In such a structure, a source region 108a and a drain region 108b are formed in regions which are between the multilayer film 108 and the source electrode 116a and the drain electrode 116b and are indicated by dashed lines. The source region 108a and the drain region 108b are formed by damage at the time of forming the source electrode 116a and the drain electrode 116b over the multilayer film 108 or by an oxygen vacancy in the multilayer film 108 caused by the action of the conductive film which forms the source electrode 116a and the drain electrode 116b. Although the source region 108a and the drain region 108b reach the oxide semiconductor layer 106 of the multilayer film 108, the present invention is not limited thereto. For example, the source region 108a and the drain region 108b may be formed only in the oxide layer 105 of the multilayer film 108. With such a structure, the oxide layer 105b and the oxide semiconductor layer 106 included in the multilayer film 108 have physical properties different from those of the source region 108a and the drain region 108b. Specifically, the source region 108a and the drain region 108b have higher carrier density (lower resistance) than the oxide layer 105b and the oxide semiconductor layer 106.

In the structure illustrated in FIG. 23B, a conductive layer 116a2 which is not easily oxidized and a conductive layer 116a1 provided over the conductive layer 116a2 are used as the source electrode 116a, and a conductive layer 116b2 which is not easily oxidized and a conductive layer 116b1 provided over the conductive layer 116b2 are used as the drain electrode 116b. Note that the conductive layer which is not easily oxidized is unlikely to reduce the multilayer film 108. When the source electrode 116a and the drain electrode 116b have structures illustrated in FIG. 23B, the source region 108a and the drain region 108b are formed only in the oxide layer 105 of the multilayer film 108. In that case, diffusion of oxygen vacancies in the channel length direction is small, so that the channel formation region is less likely to have n-type conductivity. Further, owing to the conductive layer 116a1 and the conductive layer 116b1, the conductive layer 116a2 and the conductive layer 116b2 can have low conductivity. Thus, the thicknesses of the conductive layer 116a2 and the conductive layer 116b2 can be small, which leads to easy microfabrication. In other words, the structure illustrated in FIG. 23B is favorable for a miniaturized transistor having a small channel length.

In the structure illustrated in FIG. 23C, a conductive layer 116a3 and a conductive layer 116a4 which is not easily oxidized and is provided over the conductive layer 116a3 are used as the source electrode 116a, and a conductive layer 116b3 and a conductive layer 116b4 which is not easily oxidized and is provided over the conductive layer 116b3 are used as the drain electrode 116b. When the source electrode 116a and the drain electrode 116b have structures illustrated in FIG. 23C, the source region 108a and the drain region 108b formed in the multilayer film 108 each include a region formed in the oxide semiconductor layer and the oxide layer 105 of the multilayer film 108 and a region formed only in the oxide layer 105. In that case, diffusion of oxygen vacancies in the channel length direction is small, so that the channel formation region is less likely to have n-type conductivity. Since the source region 108a and the drain region 108b below the conductive layer 116a3 and the conductive layer 116b3 reach the oxide semiconductor layer 106, the resistance between the source electrode 116a and the drain electrode 116b is small; as a result, the field-effect mobility of the transistor can be increased. Further, owing to the conductive layer 116a3 and the conductive layer 116b3, the conductive layer 116a4 and the conductive layer 116b4 can have low conductivity. Thus, the thicknesses of the conductive layer 116a4 and the conductive layer 116b4 can be small, which leads to easy microfabrication. In other words, the structure illustrated in FIG. 23C is favorable for a miniaturized transistor having a small channel length.

As illustrated in FIG. 21C, the oxide layer 105c is provided on the side surface of the oxide semiconductor layer 106 in which a channel of the transistor is formed. The side surface of the oxide semiconductor layer 106 is a region where an oxygen vacancy or the like easily occurs and the impurity concentration is easily increased when there is no protective film. In the case where a number of oxygen vacancies or impurities exist in the side surface, a second transistor which has a different threshold voltage seems to be formed at the side surface in some cases, which causes the variation in the electric characteristics of the transistor. In the transistor illustrated in FIGS. 21A to 21C, the side surface of the oxide semiconductor layer 106 is protected by the oxide layer 105c; thus, an oxygen vacancy does not occur in the side surface and the impurity concentration is not increased. As a result, the transistor has stable electric characteristics.

In FIG. 21C, the base insulating film 102 has three regions with different thicknesses. Specifically, the thickness of a first region which is in contact with the oxide layer 105a is the largest, followed by the thickness of a second region which is in or in an outer side than the periphery of the oxide layer 105c (see FIG. 21A), and the thickness of a third region which is in an outer side than the second region is the smallest.

For the multilayer film 108, the description of the multilayer film 108 in the above section is referred to. The transistor illustrated in FIGS. 21A to 21C is a transistor in which a channel is formed in the oxide semiconductor layer 106 surrounded by the oxide layer 105. Owing to the oxide layer 105, the number of DOS in the multilayer film 108 can be extremely small, so that the transistor has stable electric characteristics. Further, since the oxide semiconductor layer 106 has a wide band gap and is substantially intrinsic, leakage current when the transistor is turned off (also referred to as off-state current) is extremely small. Specifically, in a transistor whose channel length is 3 μm and channel width is 10 μm, the off-state current can be lower than $1 \times 10^{-20}$ A, preferably lower than $1 \times 10^{-22}$ A, further preferably lower than $1 \times 10^{-24}$ A. In other words, the on/off ratio can be in 15 to 50 digits, preferably 20 to 50 digits, further preferably 20 to 150 digits.

In the transistor illustrated in FIGS. 21A to 21C, the oxide layer 105c having the curved side surface is provided as part of the multilayer film 108, and the base insulating film 102 having three regions with different thicknesses is provided. This leads to an increase in step coverage with a film formed thereover and a reduction in generation of a crack or a cavity in the film. As a result, impurities do not enter the oxide semiconductor layer from the outside through a crack or a cavity in the film; thus, the transistor has stable electric characteristics.

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is sometimes difficult due to shrinkage of the substrate 100, which is caused by heat treatment or the like in the manufacturing process of a semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment for one hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 100. As the method for providing a transistor over a flexible substrate, there is also a method in which a transistor is formed over a non-flexible substrate, and then, the transistor is separated from the non-flexible substrate and transferred to the substrate 100 which is a flexible substrate. In that case, a separation layer is preferably provided between the non-flexible substrate and the transistor.

The base insulating film 102 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 102 is, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of a spin corresponding to a signal with a g factor of 2.001 in ESR is less than or equal to $3 \times 10^{17}$ spins/cm$^3$, preferably less than or equal to $5 \times 10^{16}$ spins/cm$^3$ is used. As the silicon oxide layer, a silicon oxide layer having excess oxygen is used. As the silicon nitride layer, a silicon nitride layer from which hydrogen and ammonia are less likely to be released is used. The amount of discharge of hydrogen or ammonia may be measured by thermal desorption spectroscopy (TDS). Further, as the silicon nitride layer, a silicon nitride layer which does not transmit or hardly transmits oxygen is used.

Note that excess oxygen refers to oxygen which can move in the oxide layer, the oxide semiconductor layer, the silicon oxide layer, the silicon oxynitride layer, or the like by heat treatment, oxygen which exceeds the stoichiometric composition, or oxygen which has a function of entering an oxygen vacancy to reduce oxygen vacancies.

The silicon oxide layer having excess oxygen means a silicon oxide layer from which oxygen can be released by heat treatment or the like. An insulating film having excess oxygen means an insulating film from which oxygen is released by heat treatment.

Here, a film from which oxygen is released by heat treatment may release oxygen, the amount of which is greater than or equal to $1 \times 10^{18}$ atoms/cm$^3$, greater than or equal to $1 \times 10^{19}$ atoms/cm$^3$, or greater than or equal to $1 \times 10^{20}$ atoms/cm$^3$ in TDS analysis (converted into the number of oxygen atoms) at a substrate temperature higher than or equal to 50° C. and lower than or equal to 650° C., for example.

Here, a method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to Formula (3) using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having a mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[Formula 3]}$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is expressed as $N_{H2}/S_{H2}$. Further, $S_{O2}$ is the integral value of ion intensity in the TDS analysis of the measurement sample, and α is a coefficient affecting the ion intensity in the TDS analysis. Refer to Japanese Published Patent Application No. H6-275697 for details of Formula (3). The amount of released oxygen was measured with a thermal desorption spectroscopy apparatus produced by ESCO Ltd., EMD-WA1000S/W using a silicon wafer containing hydrogen atoms at a concentration of $1 \times 10^{16}$ atoms/cm$^2$ as the reference sample.

Further, in the TDS analysis, part of oxygen is detected as an oxygen atom. The ratio between oxygen molecules and oxygen atoms can be calculated from the ionization rate of the oxygen molecules. Since the above α includes the ionization rate of the oxygen molecules, the number of the released oxygen atoms can also be estimated through the evaluation of the number of the released oxygen molecules.

Here, $N_{O2}$ is the number of the released oxygen molecules. The amount of released oxygen converted into oxygen atoms is twice the number of the released oxygen molecules.

Further, the film from which oxygen is released by heat treatment may contain a peroxide radical. Specifically, the spin density attributed to the peroxide radical is greater than or equal to $5 \times 10^{17}$ spins/cm$^3$. Note that the film containing a peroxide radical may have an asymmetric signal with a g factor of approximately 2.01 in ESR.

The insulating film containing excess oxygen may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by RBS.

The source electrode 116a and the drain electrode 116b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten. Note that the source electrode 116a and the drain electrode 116b may have the same composition or different compositions.

Here, for the conductive layer 116a2, the conductive layer 116a4, the conductive layer 116b2, and the conductive layer 116b4 which are not easily oxidized and which can be used for the source electrode 116a and the drain electrode 116b, titanium nitride, tantalum nitride, molybdenum nitride, or the like can be given and titanium nitride is preferably used.

For the conductive layer 116a1, the conductive layer 116a3, the conductive layer 116b1, and the conductive layer 116b3 which can be used for the source electrode 116a and the drain electrode 116b, aluminum, titanium, chromium, cobalt, nickel, copper, yttrium, zirconium, molybdenum, ruthenium, silver, tantalum, and tungsten are used.

The gate insulating film 112 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 112 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of a spin corresponding to a signal with a g factor of 2.001 in electron spin resonance (ESR) is less than or equal to $3\times10^{17}$ spins/cm$^3$, preferably less than or equal to $5\times10^{16}$ spins/cm$^3$ is used. As the silicon oxide layer, a silicon oxide layer having excess oxygen is preferably used. As the silicon nitride layer, a silicon nitride layer from which hydrogen and ammonia are less likely to be released is used. The amount of discharge of hydrogen or ammonia may be measured by TDS.

The thickness of the gate insulating film 112 is appropriately set depending on the shapes of the oxide layer 105a and the base insulating film 102. Here, the thickness of the oxide layer 105a is denoted by $H_{S1}$, the difference between the thicknesses of the second region and the third region of the base insulating film 102 is denoted by $H_{O1}$, and the difference between the thicknesses of the first region and the second region is denoted by $H_{O2}$. In that case, the thickness of the gate insulating film 112 is less than or equal to $(H_{S1}+H_{O2}+H_{O1})$, preferably less than or equal to $(H_{S1}+H_{O2})$, further preferably less than or equal to $H_{S1}$. Specifically, the thickness of the gate insulating film 112 is less than or equal to 100 nm, preferably less than or equal to 50 nm, further preferably less than or equal to 30 nm, still further preferably less than or equal to 20 nm. With the gate insulating film 112 whose thickness is in the above range, the electric field can be applied from the gate electrode 104 to the oxide semiconductor layer 106 through the oxide layer 105c, which enables the on/off of the transistor to be quickly switched and enables the transistor to operate at high speed.

The gate electrode 104 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten.

The present invention is not limited to the structure in which the multilayer film 108 is not completely covered with the gate electrode 104 as illustrated in FIG. 21A, and the multilayer film 108 may be completely covered with the gate electrode 104. With such a structure, when light enters from the substrate 100 side, generation of carriers in the multilayer film 108 by the light can be suppressed.

Although the edge of the multilayer film 108 is located on the outer side than the edge of the gate electrode 104 in FIG. 21A, the edge of the multilayer film 108 may be located on the inner side than the edge of the gate electrode 104 in order to suppress generation of carriers in the multilayer film 108 due to light.

The protective insulating film 118 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 118 may be, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of a spin corresponding to a signal with a g factor of 2.001 in ESR is less than or equal to $3\times10^{17}$ spins/cm$^3$, preferably less than or equal to $5\times10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

Alternatively, the protective insulating film 118 may be, for example, a multilayer film including a first silicon oxide layer as a first layer, a second silicon oxide layer as a second layer, and a silicon nitride layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose density of a spin corresponding to a signal with a g factor of 2.001 in ESR is less than or equal to $3\times10^{17}$ spins/cm$^3$, preferably less than or equal to $5\times10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits oxygen is used.

When the base insulating film 102 and the gate insulating film 112, or the base insulating film 102 and the protective insulating film 118 include insulating films containing excess oxygen, the multilayer film 108 can be surrounded by the insulating films containing excess oxygen. With the structure in which the multilayer film 108 is surrounded by the insulating films containing excess oxygen, oxygen vacancies in the oxide semiconductor layer 106 can be efficiently reduced.

The transistor having the above structure includes the multilayer film 108 in which the oxide semiconductor layer 106 is surrounded by the oxide layer 105 and thus has stable electric characteristics and high field-effect mobility. Further, the oxide layer 105 having the curved side surface is provided as part of the multilayer film 108, and the base insulating film 102 having three regions with different thicknesses is provided, whereby the step coverage with a film formed over the transistor is high and the transistor has more stable electric characteristics.

<3-2. Method for Manufacturing Transistor Structure (1)>

Then, a method for manufacturing the transistor illustrated in FIGS. 21A to 21C will be described with reference to FIGS. 24A to 24C and FIGS. 25A and 25B.

First, the substrate 100 is prepared.

Next, an insulating film to be the base insulating film 102 is formed.

Here, the case where an insulating film to be the base insulating film 102 has a three-layer structure is described. First, a silicon nitride layer is formed. Next, a first silicon oxide layer is formed. Then, treatment for adding oxygen ions to the silicon oxide layer may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, a second silicon oxide layer is formed, so that the insulating film to be the base insulating film 102 is formed.

The silicon nitride layer is preferably formed by a plasma CVD method. Specifically, high-frequency power is supplied under the following conditions: the substrate temperature is set to be higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is set to be higher than or equal to 20 Pa and lower than or equal to 250 Pa, preferably higher than or equal to 40 Pa and lower than or equal to 200 Pa.

Note that the flow rate of the nitrogen gas is 5 to 50 times, preferably 10 to 50 times as high as that of the ammonia gas. The use of the ammonia gas facilitates decomposition of the deposition gas containing silicon and the nitrogen gas. This is because an ammonia gas is dissociated by plasma energy or heat energy, and energy generated by the dissociation contributes to decomposition of a molecular bond of the deposition gas containing silicon and a molecular bond of the nitrogen gas.

Accordingly, a silicon nitride layer from which a hydrogen gas and an ammonia gas are less released can be formed. Further, owing to the low hydrogen content, a dense silicon nitride layer through which hydrogen, water, and oxygen do not permeate or hardly permeate can be formed.

The first silicon oxide layer is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidizing gas are used; and the pressure is set to be higher than or equal to 100 Pa and lower than or equal to 250 Pa, preferably higher than or equal to 100 Pa and lower than or equal to 200 Pa.

In the above-described manner, the gas decomposition efficiency in plasma is enhanced, oxygen radicals are increased, and oxidation of the gas is promoted; as a result, the first silicon oxide layer can contain excess oxygen.

The second silicon oxide layer is preferably formed by a plasma CVD method, which is a kind of CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidizing gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

Note that the flow rate of the oxidizing gas is set to be 100 times as high as that of the deposition gas containing silicon, whereby the hydrogen content and dangling bonds in the second silicon oxide layer can be reduced.

In such a manner, the second silicon oxide layer whose defect density is low is formed. In other words, the second silicon oxide layer can have a density of a spin corresponding to a signal with a g factor of 2.001 in ESR less than or equal to $3 \times 10^{17}$ spins/cm$^3$, or less than or equal to $5 \times 10^{16}$ spins/cm$^3$.

Next, the multilayer film 108 which includes the oxide semiconductor layer 106 and the oxide layer 105 surrounding the oxide semiconductor layer 106 is formed. At this time, the insulating film to be the base insulating film 102 is partly etched and becomes the base insulating film 133 (see FIG. 24A). For the methods for forming the base insulating film 133 and the multilayer film 108, the descriptions for FIGS. 11A to 11C, FIGS. 12A to 12C, FIGS. 13A and 13B, FIGS. 14A to 14C, and FIGS. 15A to 15C can be referred to.

Then, a conductive film to be the source electrode 116a and the drain electrode 116b is formed. The conductive film to be the source electrode 116a and the drain electrode 116b may be formed using any of the conductive films given as examples of the source electrode 116a and the drain electrode 116b by a sputtering method, a chemical vapor deposition (CVD) method, a molecular beam epitaxy (MBE) method, an atomic layer deposition (ALD) method, or a pulsed laser deposition (PLD) method.

Subsequently, the conductive film to be the source electrode 116a and the drain electrode 116b is partly etched, so that the source electrode 116a and the drain electrode 116b are formed. At the same time, the base insulating film 133 is partly etched and becomes the base insulating film 102 (see FIG. 24B). The base insulating film 102 is partly etched twice to have three regions with different thicknesses.

In the case where the conductive film to be the source electrode 116a and the drain electrode 116b is formed by a sputtering method, a surface of the multilayer film 108 might be damaged by plasma at the time of the deposition and an oxygen vacancy might be formed. Further, hydrogen might enter the formed oxygen vacancy.

In the case of using an In-M-Zn oxide for the multilayer film 108, oxygen which bonds with In, M, or Zn is released by plasma damage. When dangling bonds of In, M, or Zn generated by release of oxygen are terminated with hydrogen, an In—H bond, an M-H bond, or a Zn—H bond might be formed. In particular, oxygen which bonds with In having the largest ionic radius and the weakest bonding with oxygen is easily released; thus, an In—O—In bond is cut and In-Vo is formed, and when H enters the In-Vo, In-VoH is easily formed.

Thus, after the conductive film to be the source electrode 116a and the drain electrode 116b, a surface of the multilayer film 108 which is in contact with the conductive film might have n-type conductivity.

Note that even when plasma damage is caused and the multilayer film 108 is also etched at the time of etching for forming the source electrode 116a and the drain electrode 116b, a Ga—O—Ga(Zn—O—Zn) bond is not cut owing to its strong bonding so that the crystallinity can be kept.

Here, it is effective to form the gate insulating film 112 containing excess oxygen in contact with the n-type part of the multilayer film 108 and to perform heat treatment for supplying oxygen to the region of the multilayer film 108 which is in contact with the gate insulating film 112.

By the heat treatment, oxygen is supplied to In-VoH contained in the n-type region of the channel formation region of the multilayer film 108, so that an In—O—In bond can be formed again. This is because, since a Ga—O—Ga (Zn—O—Zn) bond is not cut, the bonding state returns to the initial state by strain energy. Further, hydrogen which is taken into an oxygen vacancy portion can be released to the outside as water by heat treatment. That is, when oxygen is supplied to the multilayer film 108 by the heat treatment, the n-type channel region can return to an i-type channel region.

Furthermore, the temperature and heating time of the heat treatment are adjusted as appropriate, whereby In-VoH remains in a region in contact with the source electrode 116a and the drain electrode 116b and at the same time, the channel region can be an i-type channel region. In that case, it is possible to form the multilayer film 108 including an n-layer which serves as the source region 108a or the drain region 108b and an intrinsic or substantially intrinsic channel formation region.

Note that oxygen may be supplied to the n-type channel formation region by $N_2O$ plasma treatment performed on the region or plasma treatment for ashing a resist, instead of (or in addition to) the heat treatment.

In the above manner, the source region 108a and the drain region 108b can be formed in the regions of the multilayer film 108 which are in contact with the source electrode 116a and the drain electrode 116b, and the channel formation region of the multilayer film 108 can be made intrinsic or substantially intrinsic.

Figure 24A:
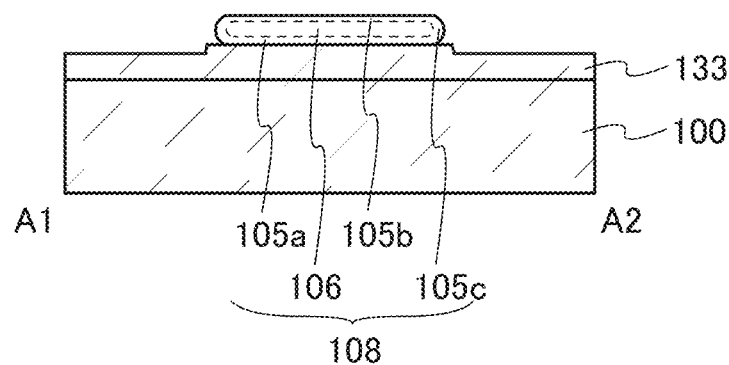
FIGS. 24A to 24C are cross-sectional views illustrating a method for manufacturing a semiconductor device in one embodiment of the present invention.
Figure 24B:
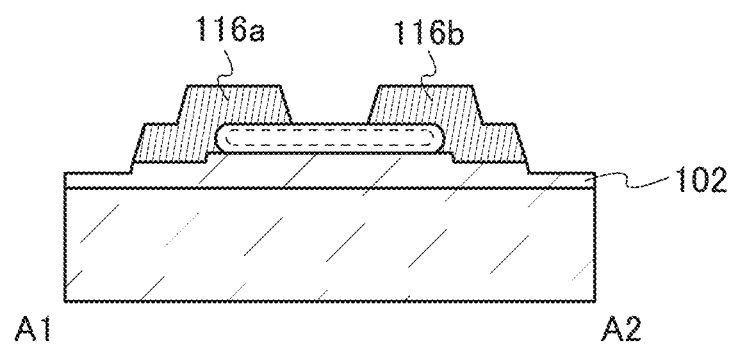
Figure 24C:
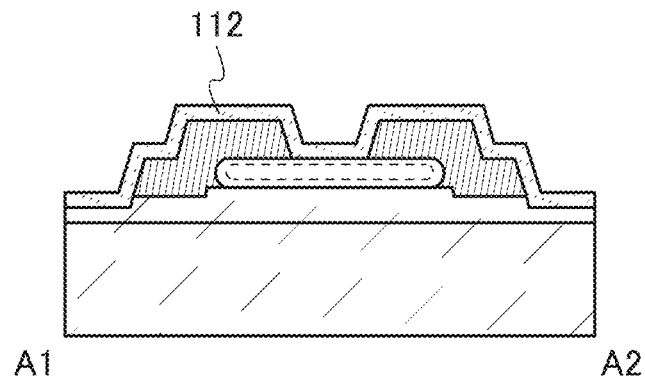

Next, the gate insulating film 112 is formed (see FIG. 24C). The gate insulating film 112 may be formed using any of the above insulating films given for the gate insulating film 112 by a sputtering method, a CVD method, an MBE method, an ALD method, or a PLD method. The oxide layer 105c having the curved side surface is provided as part of the multilayer film 108, and the base insulating film 102 has three regions with different thicknesses; thus, the step coverage with the gate insulating film 112 is high and a shape defect does not easily occur.

Then, a conductive film to be the gate electrode 104 is formed. The conductive film to be the gate electrode 104 may be formed using any of the above conductive films given for the gate electrode 104 by a sputtering method, a CVD method, an MBE method, an ALD method, or a PLD method.

Figure 25A:
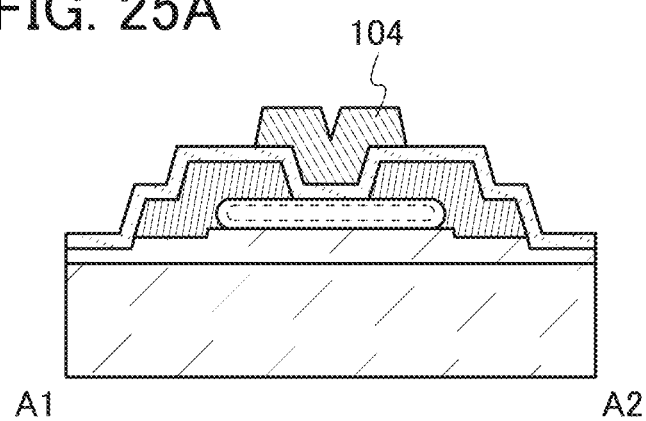
FIGS. 25A and 25B are cross-sectional views illustrating a method for manufacturing a semiconductor device in one embodiment of the present invention.

Next, the conductive film to be the gate electrode 104 is partly etched to form the gate electrode 104 (see FIG. 25A).

Figure 25B:
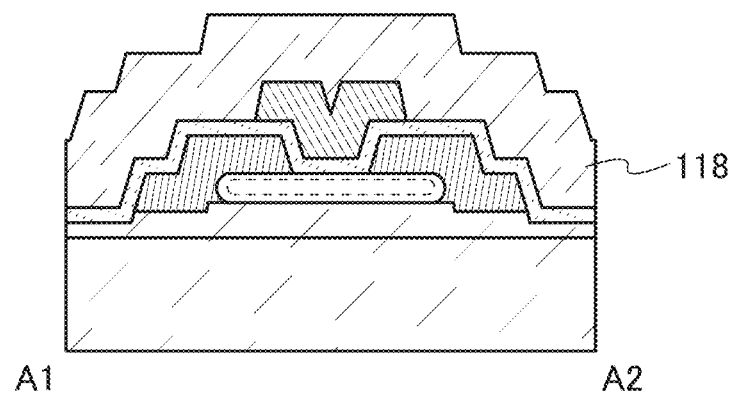

Next, the protective insulating film 118 is formed (see FIG. 25B). The protective insulating film 118 may be formed using any of the above insulating films given for the protective insulating film 118 by a sputtering method, a CVD method, an MBE method, an ALD method, or a PLD method. The oxide layer 105c having the curved side surface is provided as part of the multilayer film 108, and the base insulating film 102 has three regions with different thicknesses; thus, the step coverage with the protective insulating film 118 is high and a shape defect does not easily occur.

Here, the case where the protective insulating film 118 has a three-layer structure is described. First, a first silicon oxide layer is formed. Next, a second silicon oxide layer is formed. Then, treatment for adding oxygen ions to the second silicon oxide layer is preferably performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, a silicon nitride layer is formed, so that the protective insulating film 118 is formed.

The first silicon oxide layer is preferably formed by a plasma CVD method, which is a kind of CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidizing gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

Note that the flow rate of the oxidizing gas is set to be 100 times as high as that of the deposition gas containing silicon, whereby the hydrogen content and dangling bonds in the first silicon oxide layer can be reduced.

In such a manner, the first silicon oxide layer whose defect density is low is formed. In other words, the first silicon oxide layer can have a density of a spin corresponding to a signal with a g factor of 2.001 in ESR less than or equal to $3 \times 10^{17}$ spins/cm$^3$, or less than or equal to $5 \times 10^{16}$ spins/cm$^3$.

The second silicon oxide layer is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to the electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidizing gas are used; and the pressure is set to be higher than or equal to 100 Pa and lower than or equal to 250 Pa, preferably higher than or equal to 100 Pa and lower than or equal to 200 Pa.

In the above-described manner, the gas decomposition efficiency in plasma is enhanced, oxygen radicals are increased, and oxidation of the gas is promoted; as a result, the second silicon oxide layer can contain excess oxygen.

The silicon nitride layer is preferably formed by a plasma CVD method. Specifically, high-frequency power is supplied under the following conditions: the substrate temperature is set to be higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is set to be higher than or equal to 20 Pa and lower than or equal to 250 Pa, preferably higher than or equal to 40 Pa and lower than or equal to 200 Pa.

Note that the flow rate of the nitrogen gas is 5 to 50 times, preferably 10 to 50 times as high as that of the ammonia gas. The use of the ammonia gas facilitates decomposition of the deposition gas containing silicon and the nitrogen gas. This is because an ammonia gas is dissociated by plasma energy or heat energy, and energy generated by the dissociation contributes to decomposition of a molecular bond of the deposition gas containing silicon and a molecular bond of the nitrogen gas.

Accordingly, a silicon nitride layer from which a hydrogen gas and an ammonia gas are less released can be formed. Further, owing to the low hydrogen content, a dense silicon nitride layer through which hydrogen, water, and oxygen do not permeate or hardly permeate can be formed.

Next, heat treatment is preferably performed. The heat treatment is performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidizing gas at 10 ppm or more, 1% or more, or 10% or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the heat treatment, excess oxygen is released from at least any one of the base insulating film 102, the gate insulating film 112, and the protective insulating film 118; thus, oxygen vacancies in the multilayer film 108 can be reduced. Note that in the multilayer film 108, an oxygen vacancy captures an adjacent oxygen atom, so that the oxygen vacancy seems to move. Thus, excess oxygen can reach the oxide semiconductor layer 106 through the oxide layer 105*a*, the oxide layer 105*b*, the oxide layer 105*c*, or the like.

In the above manner, the transistor can be manufactured.

This transistor has stable electric characteristics because oxygen vacancies in the multilayer film 108 are reduced and a small number of DOS exists. Further, the oxide layer 105 having the curved side surface is provided as part of the multilayer film 108, and the base insulating film 102 has three regions with different thicknesses; thus, the step coverage with the gate insulating film 112, the protective insulating film 118, or the like is high and a shape defect does not easily occur. This enables the productivity to be improved.

<3-2-1. Manufacturing Apparatus>

With the oxide semiconductor layer 106 having low impurity concentration, the electric characteristics of the transistor become stable. Further, with the oxide semiconductor layer 106 having high crystallinity, the electric characteristics of the transistor become stable as compared with the case of the oxide semiconductor layer 106 having an amorphous structure. A deposition apparatus for forming the oxide semiconductor layer 136 to be the oxide semiconductor layer 106 having low impurity concentration and high crystallinity will be described below.

First, a structure of a deposition apparatus which allows the entry of few impurities during deposition is described with reference to FIGS. 26A and 26B.

Figure 26A:
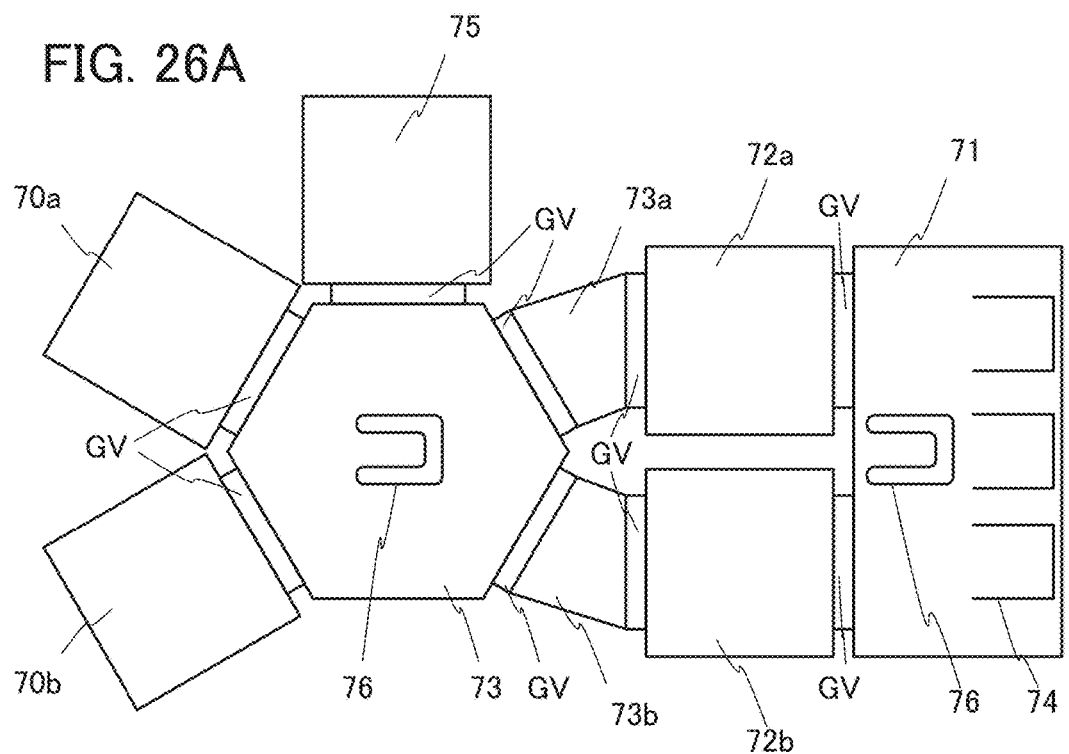
FIGS. 26A and 26B are top views each illustrating an example of a deposition apparatus.

FIG. 26A is a top view of a multi-chamber deposition apparatus. The deposition apparatus includes an atmosphere-side substrate supply chamber 71 provided with three cassette ports 74 for holding substrates, a load lock chamber 72*a*, an unload lock chamber 72*b*, a transfer chamber 73, a transfer chamber 73*a*, a transfer chamber 73*b*, a substrate heating chamber 75, a deposition chamber 70*a*, and a deposition chamber 70*b*. The atmosphere-side substrate supply chamber 71 is connected to the load lock chamber 72*a* and the unload lock chamber 72*b*. The load lock chamber 72*a* and the unload lock chamber 72*b* are connected to the transfer chamber 73 through the transfer chamber 73*a* and the transfer chamber 73*b*, respectively. The substrate heating chamber 75, the deposition chamber 70*a*, and the deposition chamber 70*b* are connected only to the transfer chamber 73. Gate valves (GV) are provided for connecting portions between chambers so that each chamber except the atmosphere-side substrate supply chamber 71 can be independently kept under vacuum. Moreover, the atmosphere-side substrate supply chamber 71 and the transfer chamber 73 each include one or more transfer robots 76, with which a substrate can be transferred. Here, the substrate heating chamber 75 preferably also serves as a plasma treatment chamber. With a multi-chamber deposition apparatus, it is possible to transfer a substrate without exposure to the air between treatments, and adsorption of impurities to a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and can be determined as appropriate depending on the space for placement or the process.

Figure 26B:
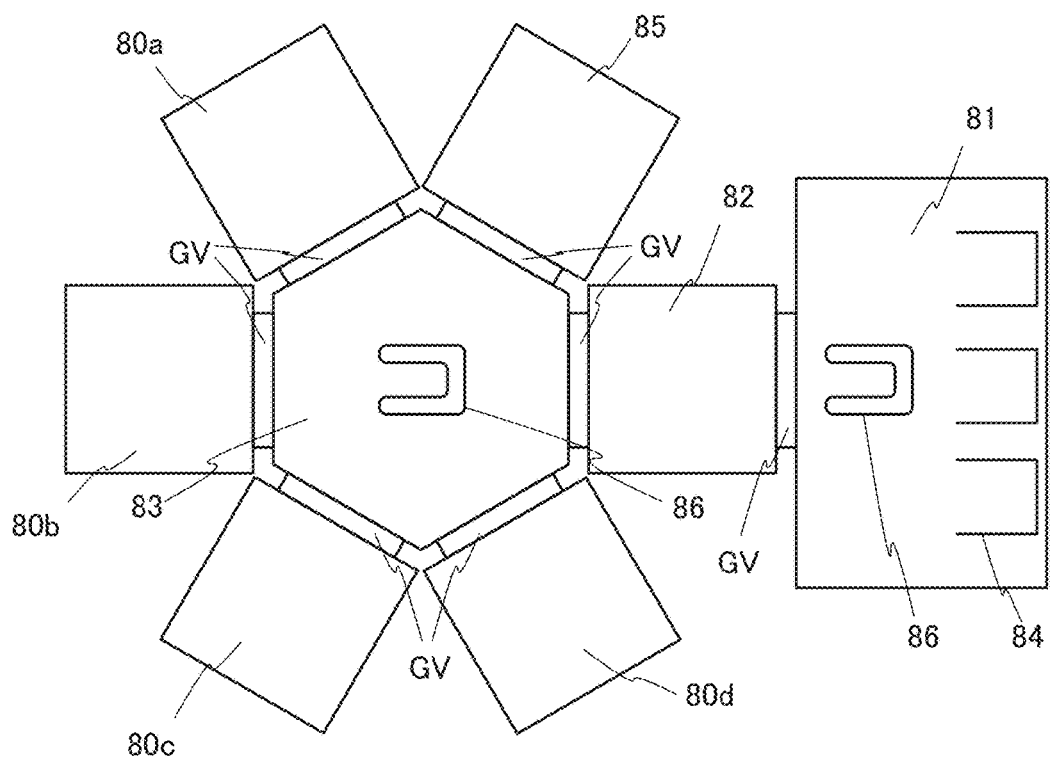

FIG. 26B is a top view of a multi-chamber deposition apparatus whose structure is different from that illustrated in FIG. 26A. The deposition apparatus includes an atmosphere-side substrate supply chamber 81 having a cassette port 84, a load/unload lock chamber 82, a transfer chamber 83, a substrate heating chamber 85, a deposition chamber 80*a*, a deposition chamber 80*b*, a deposition chamber 80*c*, and a deposition chamber 80*d*. The atmosphere-side substrate supply chamber 81, the substrate heating chamber 85, the deposition chamber 80*a*, the deposition chamber 80*b*, the deposition chamber 80*c*, and the deposition chamber 80*d* are connected to one another through the transfer chamber 83.

Note that gate valves (GV) are provided for connecting portions between chambers so that each chamber except the atmosphere-side substrate supply chamber 81 can be independently kept under vacuum. Moreover, the atmosphere-side substrate supply chamber 81 and the transfer chamber 83 each include one or more transfer robots 86, with which a glass substrate can be transferred.

Here, the details of the deposition chamber (sputtering chamber) illustrated in FIG. 26B are described with reference to FIG. 27A. The deposition chamber 80*b* includes a target 87, an attachment protection plate 88, and a substrate stage 90. Note that here, a glass substrate 89 is placed on the substrate stage 90. Although not illustrated, the substrate stage 90 may include a substrate holding mechanism which holds the glass substrate 89, a rear heater which heats the glass substrate 89 from the back surface, or the like. The attachment protection plate 88 can suppress deposition of a particle which is sputtered from the target 87 on a region where deposition is not needed.

Figure 27A:
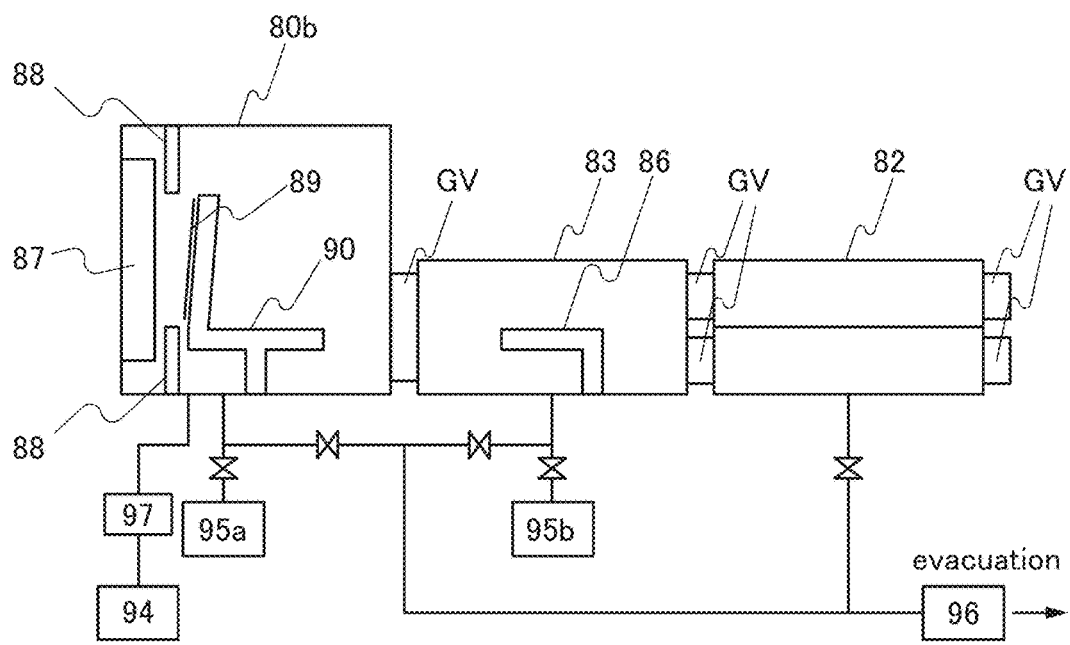
FIGS. 27A and 27B are cross-sectional views each illustrating an example of a deposition chamber.

The deposition chamber 80*b* illustrated in FIG. 27A is connected to the transfer chamber 83 through a gate valve, and the transfer chamber 83 is connected to the load/unload lock chamber 82 through a gate valve. The substrate transfer robot 86 is provided in the transfer chamber 83 and can deliver a glass substrate between the deposition chamber 80*b* and the load/unload lock chamber 82. The one load/unload lock chamber 82 is divided horizontally into two: one of them can be used as a load chamber and the other can be used as an unload chamber. Such a structure is preferable because the footprint of the sputtering apparatus can be reduced.

The deposition chamber 80*b* illustrated in FIG. 27A is connected to a refiner 94 through a mass flow controller 97. Note that although the refiner 94 and the mass flow controller 97 are provided in accordance with the number of kinds of gases, only one refiner 94 and one mass flow controller 97 are illustrated for simplicity. As a gas introduced to the deposition chamber 80*b* or the like, a gas whose dew point is lower than or equal to −80° C., preferably lower than or equal to −100° C. is used. With the use of an oxygen gas, a rare gas (e.g., an argon gas), or the like whose dew point is low, moisture entering a film at the time of deposition can be reduced.

The deposition chamber 80b illustrated in FIG. 27A is connected to a cryopump 95a through a valve. The transfer chamber 83 is connected to a cryopump 95b through a gate valve. The load/unload lock chamber 82 is connected to a vacuum pump 96 through a gate valve. Note that in the load/unload lock chamber 82, the load lock chamber and the unload lock chamber may be connected to respective vacuum pumps. Further, each of the deposition chamber 80b and the transfer chamber 83 is connected to the vacuum pump 96 through a gate valve.

Note that the vacuum pump 96 may be, for example, a pump in which a dry pump and a mechanical booster pump are connected in series. With such a structure, the deposition chamber 80b and the transfer chamber 83 are evacuated from atmospheric pressure to a low vacuum (about 0.1 Pa to 10 Pa) by the vacuum pump 96, and then evacuated from the low vacuum to a high vacuum ($1 \times 10^{-4}$ Pa to $1 \times 10^{-7}$ Pa) by the cryopump 95a or 95b after the valves are switched.

Next, another example of the deposition chamber illustrated in FIG. 26B will be described with reference to FIG. 27B.

Figure 27B:
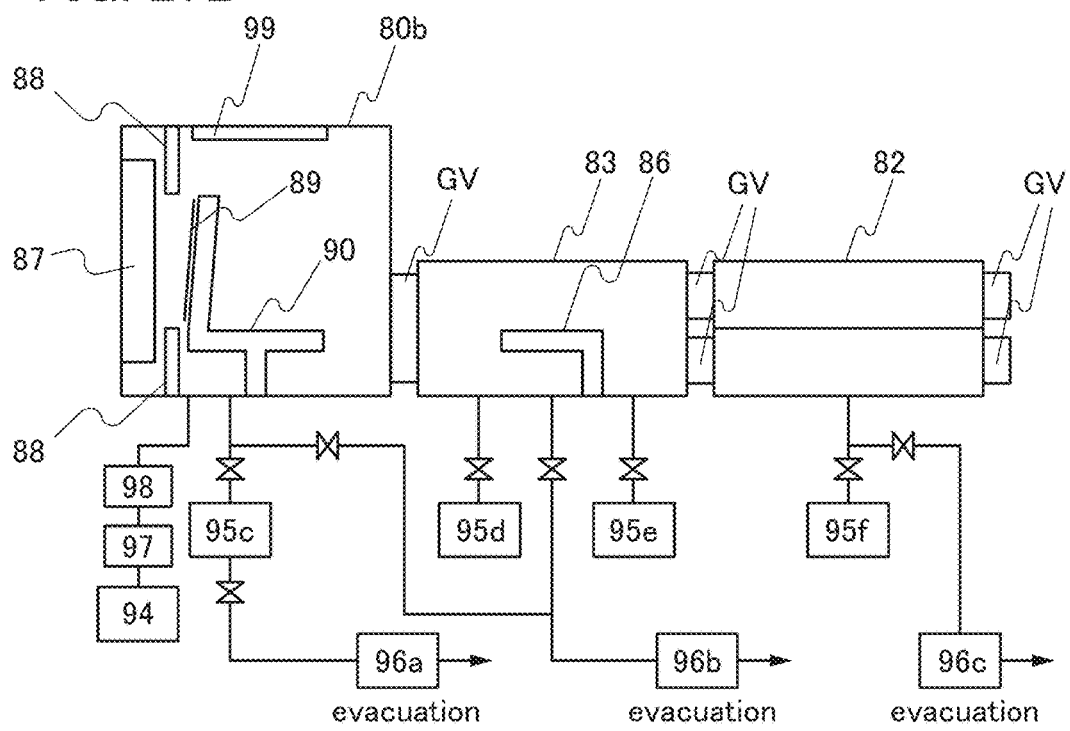

The deposition chamber 80b illustrated in FIG. 27B is connected to the transfer chamber 83 through the gate valve, and the transfer chamber 83 is connected to the load/unload lock chamber 82 through the gate valves.

The deposition chamber 80b in FIG. 27B is connected to the mass flow controller 97 through a gas heating system 98, and the gas heating system 98 is connected to the refiner 94 through the mass flow controller 97. With the gas heating system 98, a gas used in the deposition chamber 80b can be heated to higher than or equal to 40° C. and lower than or equal to 400° C., preferably higher than or equal to 50° C. and lower than or equal to 200° C. Note that although the gas heating systems 98, the refiner 94, and the mass flow controller 97 can be provided in accordance with the number of kinds of gases, only one gas heating system 98, one refiner 94, and one mass flow controller 97 are provided for simplicity.

The deposition chamber 80b illustrated in FIG. 27B is connected to a turbo molecular pump 95c and a vacuum pump 96b each through a valve. Note that as an auxiliary pump, a vacuum pump 96a is provided for the turbo molecular pump 95c through a valve. The vacuum pump 96a and the vacuum pump 96b can have structures similar to the structure of the vacuum pump 96.

In addition, the deposition chamber 80b illustrated in FIG. 27B is provided with a cryotrap 99.

It is known that the turbo molecular pump 95c is capable of stably evacuating a large-sized molecule (atom), needs low frequency of maintenance, and thus enables high productivity, whereas it has a low capability in evacuating hydrogen and water. Hence, the cryotrap 99 having a high capability in evacuating a molecule (atom) having a relatively high melting point, such as water, is connected to the deposition chamber 80b. The temperature of a refrigerator of the cryotrap 99 is set to be lower than or equal to 100 K, preferably lower than or equal to 80 K. When the cryotrap 99 includes a plurality of refrigerators, the refrigerators preferably have different temperatures, in which case efficient evacuation can be performed. For example, the temperatures of a first-stage refrigerator and a second-stage refrigerator may be set to be lower than or equal to 100 K and lower than or equal to 20 K, respectively.

The transfer chamber 83 illustrated in FIG. 27B is connected to the vacuum pump 96b, a cryopump 95d, and a cryopump 95e each through a valve. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules (atoms) entrapped in the cryopump. When molecules (atoms) are entrapped too much in a cryopump, the evacuation capability of the cryopump is lowered; therefore, regeneration is performed regularly.

The load/unload lock chamber 82 illustrated in FIG. 27B is connected to a cryopump 95f and a vacuum pump 96c through valves. Note that the vacuum pump 96c may have a structure similar to that of the vacuum pump 96.

In the deposition chamber 80b, a target-facing-type sputtering apparatus may be employed.

Note that a parallel-plate-type sputtering device or an ion beam sputtering apparatus may be provided in the deposition chamber 80b.

Next, an evacuation example of the substrate heating chamber illustrated in FIG. 26B is described with reference to FIG. 28.

Figure 28:
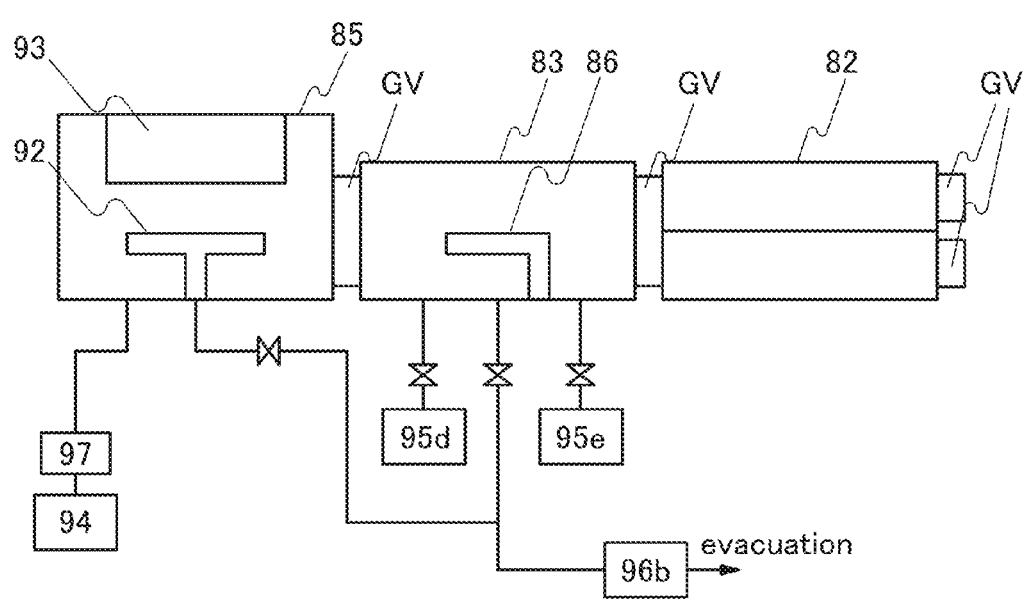
FIG. 28 illustrates an example of a heat treatment chamber.

The substrate heating chamber 85 illustrated in FIG. 28 is connected to the transfer chamber 83 through a gate valve. Note that the transfer chamber 83 is connected to the load/unload lock chamber 82 through a gate valve. Note that the structure of the load/unload lock chamber 82 is similar to that illustrated in FIG. 27A or FIG. 27B.

The substrate heating chamber 85 illustrated in FIG. 28 is connected to the refiner 94 through the mass flow controller 97. Note that although the refiner 94 and the mass flow controller 97 are provided in accordance with the number of kinds of gases, only one refiner 94 and one mass flow controller 97 are illustrated for simplicity. In addition, the substrate heating chamber 85 is connected to the vacuum pump 96b through a valve.

In addition, the substrate heating chamber 85 includes a substrate stage 92. At least one substrate is set on the substrate stage 92, and a substrate stage on which a plurality of substrates can be set may be used as the substrate stage 92. The substrate heating chamber 85 also includes a heating mechanism 93. The heating mechanism 93 may be the one using a resistance heater for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as the gas.

Note that the back pressure of each of the deposition chamber 80b and the substrate heating chamber 85 is lower than or equal to $1 \times 10^{-4}$ Pa, preferably lower than or equal to $3 \times 10^{-5}$ Pa, more preferably lower than or equal to $1 \times 10^{-5}$ Pa.

In each of the deposition chamber 80b and the substrate heating chamber 85, the partial pressure of a gas molecule (atom) having a mass-to-charge ratio (m/z) of 18 is lower than or equal to $3 \times 10^{-5}$ Pa, preferably lower than or equal to $1 \times 10^{-5}$ Pa, more preferably lower than or equal to $3 \times 10^{-6}$ Pa.

Moreover, in each of the deposition chamber 80b and the substrate heating chamber 85, the partial pressure of a gas molecule (atom) having a mass-to-charge ratio (m/z) of 28 is lower than or equal to $3\times10^{-5}$ Pa, preferably lower than or equal to $1\times10^{-5}$ Pa, more preferably lower than or equal to $3\times10^{-6}$ Pa.

Moreover in each of the deposition chamber 80b and the substrate heating chamber 85, the partial pressure of a gas molecule (atom) having a mass-to-charge ratio (m/z) of 44 is lower than or equal to $3\times10^{-5}$ Pa, preferably lower than or equal to $1\times10^{-5}$ Pa, more preferably lower than or equal to $3\times10^{-6}$ Pa.

Further, in each of the deposition chamber 80b and the substrate heating chamber 85, the leakage rate is less than or equal to $3\times10^{-6}$ Pa·m³/s, preferably less than or equal to $1\times10^{-6}$ Pa·m³/s.

In each of the deposition chamber 80b and the substrate heating chamber 85, the leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s.

In each of the deposition chamber 80b and the substrate heating chamber 85, the leakage rate of a gas molecule (atom) having a mass-to-charge ratio (m/z) of 28 is less than or equal to $1\times10^{-5}$ Pa·m³/s, preferably less than or equal to $1\times10^{-6}$ Pa·m³/s.

Moreover, in each of the deposition chamber 80b and the substrate heating chamber 85, the leakage rate of a gas molecule (atom) having a mass-to-charge ratio (m/z) of 44 is less than or equal to $3\times10^{-6}$ Pa·m³/s, preferably less than or equal to $1\times10^{-6}$ Pa·m³/s.

Note that the total pressure and the partial pressure in the vacuum chambers such as the deposition chamber, the substrate heating chamber, and the transfer chamber can be measured using a mass analyzer. For example, Qulee CGM-051, a quadrupole mass analyzer (also referred to as Q-mass) manufactured by ULVAC, Inc. can be used. Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be less than or equal to the above value.

For example, an open/close portion of the deposition chamber is preferably sealed with a metal gasket. For the metal gasket, metal covered with an iron fluoride, an aluminum oxide, or a chromium oxide is preferably used. The metal gasket realizes higher adhesion than an O-ring, and can reduce the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the deposition apparatus, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the released gas can be reduced.

Alternatively, the above-mentioned member of the deposition apparatus may be covered with iron fluoride, aluminum oxide, chromium oxide, or the like.

The member of the deposition apparatus is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

In the case where the refiner is provided just before a deposition gas is introduced, the length of a pipe between the refiner and the deposition chamber is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly.

Furthermore, as the pipe for the deposition gas, a metal pipe the inside of which is covered with iron fluoride, aluminum oxide, chromium oxide, or the like is preferably used. With the above pipe, the amount of released gas containing impurities is made small and the entry of impurities into the deposition gas can be reduced as compared with a SUS316L-EP pipe, for example. Further, a high-performance ultra-compact metal gasket joint (a UPG joint) is preferably used as a joint of the pipe. A structure where all the materials of the pipe are metal is preferably employed, in which case the effect of the generated released gas or the external leakage can be reduced compared with a structure where resin or the like is used.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced to the deposition chamber, the rate of desorption of water or the like, which is difficult to be desorbed simply by evacuation, can be further increased. Note that the rate of desorption of the adsorbate can be further increased by heating of the inert gas at substantially the same temperature as the temperature of the baking. Here, a rare gas is preferably used as the inert gas. Depending on the kind of a film to be formed, oxygen or the like may be used instead of an inert gas. For example, in the case of forming an oxide semiconductor layer, using oxygen, which is the main component of the oxide, is preferable in some cases.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbate in the deposition chamber, and the impurities present in the deposition chamber can be reduced. Note that an advantageous effect can be achieved when this treatment is repeated 2 to 30 times, preferably 5 to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the deposition chamber is evacuated for longer than or equal to 5 minutes and shorter than or equal to 300 minutes, preferably longer than or equal to 10 minutes and shorter than or equal to 120 minutes.

The rate of desorption of the adsorbate can be further increased also by dummy deposition. Here, the dummy deposition refers to deposition on a dummy substrate by sputtering or the like, in which a film is formed on the dummy substrate and the inner wall of the deposition chamber so that impurities in the deposition chamber and an adsorbate on the inner wall of the deposition chamber are confined in the film. As the dummy substrate, a substrate which releases a smaller amount of gas is preferably used, and for example, a substrate similar to the substrate 100 described later may be used. By performing dummy deposition, the concentration of impurities in a film to be formed later can be reduced. Note that the dummy deposition may be performed at the same time as the baking of the deposition chamber.

An oxide semiconductor layer is formed with the use of the above deposition apparatus, so that the entry of impurities into the oxide semiconductor layer can be suppressed. Further, a film in contact with the oxide semiconductor layer is formed with the use of the above deposition apparatus, so that the entry of impurities into the oxide semiconductor layer from the film in contact therewith can be suppressed.

Next, methods for forming the oxide layer 135a to be the oxide layer 105a, the oxide semiconductor layer 136 to be the oxide semiconductor layer 106, and the oxide layer 135b to be the oxide layer 105b using the above-described deposition apparatus will be described.

First, the oxide layer 135a is formed. The oxide layer 135a is formed in an oxygen gas atmosphere at a substrate heating temperature higher than or equal to room temperature (25° C.) and lower than or equal to 600° C., preferably higher than or equal to 70° C. and lower than or equal to 550° C., more preferably higher than or equal to 100° C. and lower than or equal to 500° C. As the heating temperature at the time of the deposition increases, the concentration of impurities in the oxide layer 135a decreases. Further, migration of sputtered particles on a deposition surface is likely to occur; thus, the atomic arrangement is ordered and the density of the oxide layer 135a is increased, so that the crystallinity of the oxide layer 135a becomes high. Furthermore, when the deposition is performed in an oxygen gas atmosphere, plasma damage is alleviated and a surplus atom such as a rare gas atom is not contained in the oxide layer 135a, whereby the oxide layer 135a with a high degree of crystallinity is formed. Note that the deposition may be performed in a mixed atmosphere containing an oxygen gas and a rare gas. In that case, the percentage of an oxygen gas is set to be greater than or equal to 30 vol %, preferably greater than or equal to 50 vol %, further preferably greater than or equal to 80 vol %. The oxide layer 135a is formed after the following steps: a substrate is transferred to the deposition chamber; a deposition gas is flown; the deposition pressure is set to 0.8 Pa or lower, preferably 0.4 Pa or lower; and the deposition pressure is kept for longer than or equal to 10 seconds and shorter than or equal to 1000 seconds, preferably longer than or equal to 15 seconds and shorter than or equal to 720 seconds to be stabilized. Since the deposition pressure is kept for the above period of time to be stabilized, the amount of impurities entering the oxide layer 135a during the formation can be reduced. Note that since the oxide layer 135a may have an amorphous structure, the oxide layer 135a can be intentionally formed at a low temperature less than 70° C. with a percentage of an oxygen gas less than 30 vol %.

Next, the oxide semiconductor layer 136 is formed. The surface temperature of the target is set to be lower than or equal to 100° C., preferably lower than or equal to 50° C., more preferably about room temperature (typically, 20° C. or 25° C.). In a sputtering apparatus for a large substrate, a large target is often used. However, it is difficult to form a target for a large substrate without a juncture. In fact, a plurality of targets are arranged with as few spaces as possible to obtain a large shape; however, a tiny space is inevitably generated. When the surface temperature of the target increases, in some cases, Zn or the like is volatilized from such a tiny space, and the space might expand gradually. When the space expands, a metal of a backing plate or a metal used for adhesion might be sputtered and cause an increase in impurity concentration. Thus, it is preferable that the target be cooled sufficiently.

Specifically, for the backing plate, a metal having high conductivity and a high heat dissipation property (specifically Cu) is used. The target can be cooled efficiently by making a sufficient amount of cooling water flow through a water channel which is formed in the backing plate. Here, the sufficient amount of cooling water, which depends on the size of the target, is set to be greater than or equal to 3 L/min, greater than or equal to 5 L/min, or greater than or equal to 10 L/min in the case of, for example, a circular target whose diameter is 300 mm.

The oxide semiconductor layer 136 is formed in an oxygen gas atmosphere at a substrate heating temperature higher than or equal to 100° C. and lower than or equal to 600° C., preferably higher than or equal to 150° C. and lower than or equal to 550° C., more preferably higher than or equal to 200° C. and lower than or equal to 500° C. As the substrate heating temperature in deposition increases, the concentration of impurities in the oxide semiconductor layer 136 decreases. Further, migration of sputtered particles on a deposition surface is likely to occur; thus, the atomic arrangement is ordered and the density of the oxide semiconductor layer 136 is increased, so that the crystallinity of the oxide semiconductor layer 136 becomes high. Furthermore, when the deposition is performed in an oxygen gas atmosphere, plasma damage is alleviated and a surplus atom such as a rare gas atom is not contained in the oxide semiconductor layer 136, whereby the oxide semiconductor layer 136 with a high degree of crystallinity is formed. Note that the deposition may be performed in a mixed atmosphere containing an oxygen gas and a rare gas. In that case, the percentage of an oxygen gas is set to be greater than or equal to 30 vol %, preferably greater than or equal to 50 vol %, further preferably greater than or equal to 80 vol %.

Note that in the case where the target includes Zn, plasma damage is alleviated by the deposition in an oxygen gas atmosphere; thus, the oxide semiconductor layer 136 in which Zn is unlikely to be volatilized can be obtained.

The oxide semiconductor layer 136 is formed after the following steps: a substrate is transferred to the deposition chamber; a deposition gas is flown; the deposition pressure is set to 0.8 Pa or lower, preferably 0.4 Pa or lower; and the deposition pressure is kept for longer than or equal to 10 seconds and shorter than or equal to 1000 seconds, preferably longer than or equal to 15 seconds and shorter than or equal to 720 seconds to be stabilized. Since the deposition pressure is kept for the above period of time to be stabilized, the amount of impurities entering the oxide semiconductor layer 136 during the formation can be reduced. At this time, the distance between the target and the substrate is set to be less than or equal to 40 mm, preferably less than or equal to 25 mm. When the oxide semiconductor layer 136 is formed under the above conditions, the frequency of the collision between a sputtered particle and another sputtered particle, a gas molecule, or an ion can be reduced. That is, depending on the deposition pressure, the distance between the target and the substrate is made shorter than the mean free path of a sputtered particle, a gas molecule, or an ion, so that the concentration of impurities entering the film can be reduced.

For example, when the pressure is 0.4 Pa and the temperature is 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, an methane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm. Note that doubling of the pressure halves a mean free path and doubling of the absolute temperature doubles a mean free path.

The mean free path depends on pressure, temperature, and the diameter of a molecule (atom). In the case where pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter and the crystallinity is lowered due to the large diameter of the molecule (atom) when the molecule (atom) enters the film. For this reason, it can be said that, for example, a molecule (atom) whose diameter is larger than that of Ar is likely to behave as an impurity which decreases the crystallinity.

Next, the oxide layer 135b is formed. The oxide layer 135b is formed in an oxygen gas atmosphere at a substrate heating temperature higher than or equal to room temperature (25° C.) and lower than or equal to 600° C., preferably higher than or equal to 70° C. and lower than or equal to 550° C., more preferably higher than or equal to 100° C. and lower than or equal to 500° C. As the heating temperature at the time of deposition increases, the concentration of impurities in the oxide layer 135b decreases. Further, migration of sputtered particles on a deposition surface is likely to occur; thus, the atomic arrangement is ordered and the density of the oxide layer 135b is increased, so that the crystallinity of the oxide layer 135b becomes high. Furthermore, when the deposition is performed in an oxygen gas atmosphere, plasma damage is alleviated and a surplus atom such as a rare gas atom is not contained in the oxide layer 135b, whereby the oxide layer 135b with high crystallinity is formed. Note that the deposition may be performed in a mixed atmosphere containing an oxygen gas and a rare gas. In that case, the percentage of an oxygen gas is set to be greater than or equal to 30 vol %, preferably greater than or equal to 50 vol %, further preferably greater than or equal to 80 vol %. The oxide layer 135b is formed after the following steps: a substrate is transferred to the deposition chamber; the deposition gas is flown; the deposition pressure is set to 0.8 Pa or lower, preferably 0.4 Pa or lower; the deposition pressure is kept for longer than or equal to 10 seconds and shorter than or equal to 1000 seconds, preferably longer than or equal to 15 seconds and shorter than or equal to 720 seconds to be stabilized. Since the deposition pressure is kept for the above period of time to be stabilized, the amount of impurities entering the oxide layer 135b during the formation can be reduced.

Next, heat treatment is performed. The heat treatment is performed under reduced pressure or in an inert atmosphere or an oxidation atmosphere. By the heat treatment, the concentration of impurities in the oxide semiconductor layer 136 can be reduced.

The heat treatment is preferably performed in such a manner that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the concentration of impurities in the oxide semiconductor layer 136 can be reduced; however, oxygen vacancies are caused at the same time. By the heat treatment in an oxidation atmosphere, the caused oxygen vacancies can be reduced.

When heat treatment is performed on the oxide semiconductor layer 136 in addition to the substrate heating at the time of the formation, the concentration of impurities in the layer can be reduced.

Specifically, the concentration of hydrogen in the oxide semiconductor layer 136, which is measured by SIMS, can be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

The concentration of nitrogen in the oxide semiconductor layer 136, which is measured by SIMS, can be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in the oxide semiconductor layer 136, which is measured by SIMS, can be lower than $5\times10^{19}$ atoms/cm$^3$, preferably lower than or equal to $5\times10^{18}$ atoms/cm$^3$, more preferably lower than or equal to $2\times10^{18}$ atoms/cm$^3$, still more preferably lower than or equal to $5\times10^{17}$ atoms/cm$^3$.

The amount of each of the following gas molecules (atoms) released from the oxide semiconductor layer 136 can be less than or equal to $1\times10^{19}$/cm$^3$, preferably less than or equal to $1\times10^{18}$/cm$^3$, which is measured by TDS analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

A measurement method of the amount of released oxygen atoms, which is described later, is referred to for a measurement method of the release amount using TDS analysis.

The oxide semiconductor layer 136 and the oxide layer 135b are formed in the above manner, whereby the crystallinity of the oxide semiconductor layer 136 can be high and the impurity concentration of the oxide semiconductor layer 136 and the oxide layer 135b and the impurity concentration at the interface between the oxide semiconductor layer 136 and the oxide layer 135b can be reduced.

<3-3. Transistor Structure (2)>

Here, a bottom-gate top-contact (BGTC) transistor which is one kind of bottom gate transistor is described with reference to FIGS. 29A to 29D.

Figure 29A:
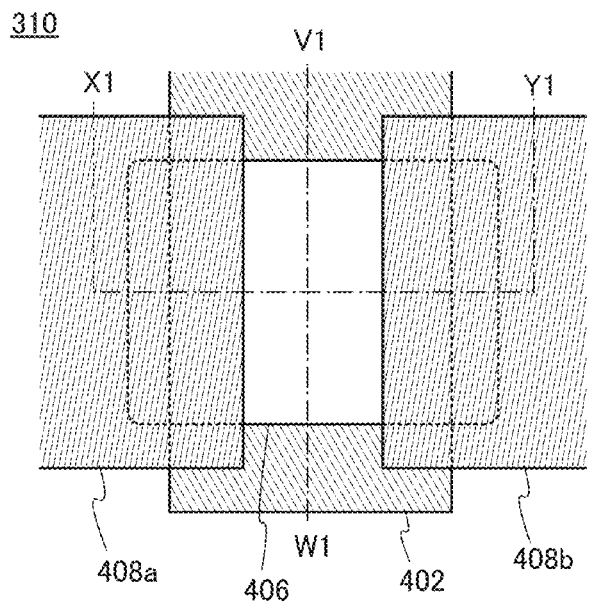
FIGS. 29A to 29D are a top view and cross-sectional views illustrating a semiconductor device in one embodiment of the present invention.
Figure 29C:
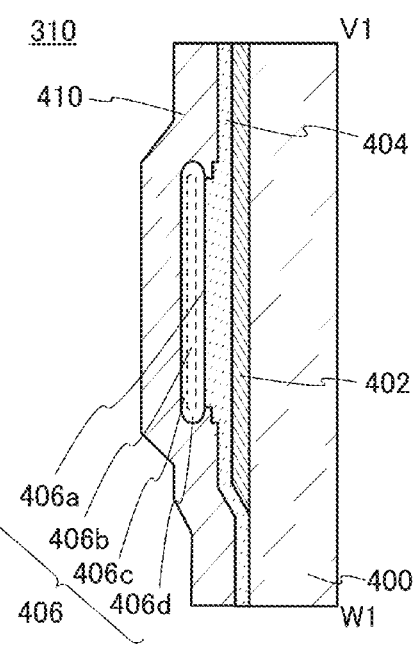
Figure 29B:
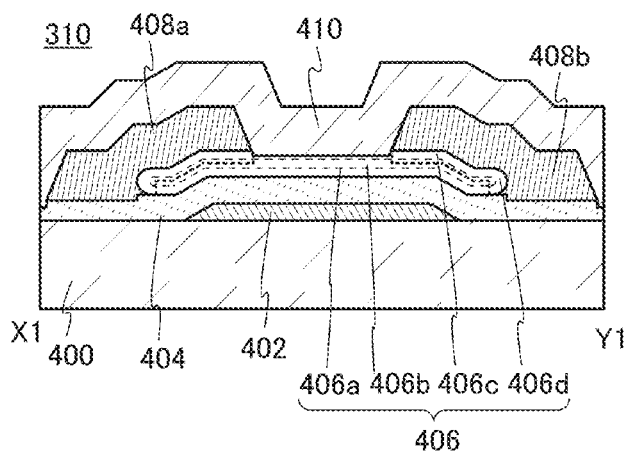
Figure 29D:
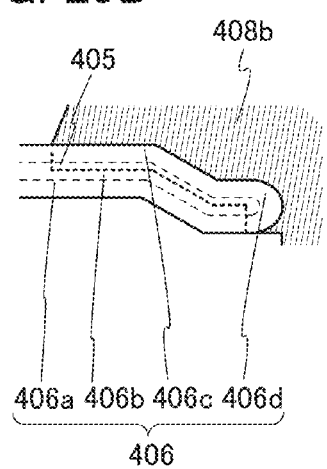

FIGS. 29A to 29D illustrates a structural example of a transistor 310. FIG. 29A is a plan view of the transistor 310. FIG. 29B is a cross-sectional view taken along line X1-Y1 in FIG. 29A. FIG. 29C is a cross-sectional view taken along line V1-W1 in FIG. 29A. FIG. 29D is a partial enlarged view of FIG. 29B. Note that in FIG. 29A, some components of the transistor 310 (e.g., the gate insulating film 404 and the like) are not illustrated to avoid complexity.

The transistor 310 illustrated in FIGS. 29A to 29D includes a gate electrode 402 formed over a substrate 400; a gate insulating film 404 over the gate electrode 402; a multilayer film 406 which overlaps with the gate electrode 402 with the gate insulating film 404 provided therebetween and which includes an oxide semiconductor layer 406b, a first oxide layer 406a in contact with the bottom surface of the oxide semiconductor layer 406b, a second oxide layer 406c in contact with the top surface of the oxide semiconductor layer 406b, and a third oxide layer 406d in contact with a side surface of the oxide semiconductor layer 406b; and a source electrode 408a and a drain electrode 408b which are electrically connected to the oxide semiconductor layer 406b. Note that a protective insulating film 410 containing oxygen, which is provided over the source electrode 408a and the drain electrode 408b, can also be regarded as a component of the transistor 310.

In the transistor 310, a channel formation region is a region of the multilayer film 406, which is located between the source electrode 408a and the drain electrode 408b and is overlapped with the gate electrode 402. Here, a main path of current which flows in the oxide semiconductor layer 406b is called a channel.

The transistor 310 includes the above-described multilayer film 406. In other words, in the transistor 310, the oxide semiconductor layer 406b in which a channel is formed is surrounded by the oxide layers (the first oxide layer 406a, the second oxide layer 406c, and the third oxide layer 406d) which is formed using one or more kinds of elements composing the oxide semiconductor layer 406b and in which an oxygen vacancy occurs less frequently than in the oxide semiconductor layer 406b. Accordingly, oxygen vacancies which might occur in the oxide semiconductor layer 406b in which a channel is formed can be reduced. In addition, the gate insulating film 404 and the protective insulating film 410 which are insulating films containing silicon can be separated from the oxide semiconductor layer 406b.

Note that the insulating films (the gate insulating film 404 and the protective insulating film 410) in contact with the multilayer film 406 preferably contain excess oxygen. With a structure in which the multilayer film 406 is surrounded by the insulating films containing excess oxygen, oxygen vacancies which might occur in the first oxide layer 406a, the second oxide layer 406c, or the third oxide layer 406d can be repaired. Accordingly, oxygen vacancies in the multilayer film 406 can be thoroughly reduced, which can suppress formation of DOS in the oxide semiconductor layer 406b.

The components of the transistor 310 will be described in detail below.

The substrate 400 is not limited to a simple supporting substrate, and may be a substrate where a device such as a transistor is formed. In this case, at least one of the gate electrode 402, source electrode 408a, and the drain electrode 408b of the transistor 310 may be electrically connected to the above device.

The gate electrode 402 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. Alternatively, the gate electrode 402 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element. The gate electrode 402 may have a single-layer structure or a stacked-layer structure of two or more layers.

Note that an In—Ga—Zn oxynitride semiconductor layer, an In—Sn oxynitride semiconductor layer, an In—Ga oxynitride semiconductor layer, an In—Zn oxynitride semiconductor layer, a Sn oxynitride semiconductor layer, an In oxynitride semiconductor layer, a film of a metal nitride (such as InN or ZnN), or the like may be provided between the gate electrode 402 and the gate insulating film 404. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn oxynitride semiconductor layer, an In—Ga—Zn oxynitride semiconductor layer having a higher nitrogen concentration than at least the oxide semiconductor layer 406b, specifically, an In—Ga—Zn oxynitride semiconductor layer having a nitrogen concentration of 7 atomic % or higher is used.

As the gate insulating film 404, an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used, for example. The gate insulating film 404 may be a stack including any of the above materials.

As the gate insulating film 404, an oxide insulator containing excess oxygen is preferably used. Although the first oxide layer 406a or the third oxide layer 406d which is in contact with the gate insulating film 404 might include an oxygen vacancy, oxygen can be supplied from the gate insulating film 404 containing excess oxygen. In such a manner, an oxygen vacancy in the oxide layer in contact with the oxide semiconductor layer 406b can be repaired.

The thickness of the gate insulating film 404 is greater than or equal to 5 nm and less than or equal to 400 nm, preferably greater than or equal to 10 nm and less than or equal to 300 nm, more preferably greater than or equal to 50 nm and less than or equal to 250 nm.

The multilayer film 406 includes at least the oxide semiconductor layer 406b in which a channel is formed, the first oxide layer 406a provided between the oxide semiconductor layer 406b and the gate insulating film 404, the second oxide layer 406c provided between the oxide semiconductor layer 406b and the protective insulating film 410, and the third oxide layer 406d which is provided in contact with side surfaces of the first oxide layer 406a, the oxide semiconductor layer 406b, and the second oxide layer 406c. The third oxide layer 406d has a curved surface.

As described above, the third oxide layer 406d is formed using the reaction product of the oxide film to be the first oxide layer 406a. Thus, the boundary between the first oxide layer 406a and the third oxide layer 406d might be unclear. Further, when the second oxide layer 406c has a structure similar to that of the first oxide layer 406a, the second oxide layer 406c cannot be distinguished from the third oxide layer 406d in some cases.

Here, the third oxide layer 406d having a curved surface is included, whereby the multilayer film 406 has a curved surface in the cross section. Accordingly, the coverage with a film (e.g., a conductive film which forms the source electrode and the drain electrode or the protective insulating film) formed over the multilayer film 406 can be improved. As a result, a film can be formed uniformly over the multilayer film 406, so as to prevent an entry of an impurity element from a region having low film density or a region where the film is not formed into the multilayer film 406, which causes deterioration in the characteristics of the semiconductor device.

In addition, an end portion (side surface) of the oxide semiconductor layer 406b is covered with the third oxide layer 406d as illustrated in FIG. 29C. This can reduce probability of generation of a parasitic channel which in the channel width direction of the island-shaped multilayer film 406.

Each of the first oxide layer 406a and the second oxide layer 406c is an oxide layer containing one or more kinds of metal elements composing the oxide semiconductor layer 406b. Further, the third oxide layer 406d contains the same constituent element as the first oxide layer 406a. Note that it is preferable that the content ratio of an element M be higher in the third oxide layer 406d in the first oxide layer 406a. The description of the multilayer film 108 can be referred to for the details of the multilayer film 406.

In the multilayer film 406, the oxide layers (the first oxide layer 406a, the second oxide layer 406c, and the third oxide layer 406d) whose main component is the same as that of the oxide semiconductor layer 406b and in which an oxygen vacancy occurs less frequently than in the oxide semiconductor layer 406b are provided so as to surround the oxide semiconductor layer 406b in which a channel is formed, whereby formation of an oxygen vacancy in the channel of the transistor can be suppressed.

An increase in oxygen vacancies in the oxide semiconductor layer 406b is suppressed and the impurity concentration is reduced, whereby the oxide semiconductor layer 406b can be a highly purified intrinsic oxide semiconductor layer. Specifically, the carrier density of the oxide semiconductor layer 406b is preferably set to be lower than $1\times10^{17}/cm^3$, lower than $1\times10^{15}/cm^3$, or lower than $1\times10^{13}/cm^3$. In the oxide semiconductor layer 406b, hydrogen, nitrogen, carbon, silicon, and a metal element other than the main component becomes an impurity. In order to reduce the concentration of impurities in the oxide semiconductor layer 406b, it is also preferable to reduce the concentration of impurities in the oxide layers which are close to the oxide semiconductor layer 406b to a value almost equal to that in the oxide semiconductor layer 406b. With a highly purified intrinsic oxide semiconductor layer 406b, the transistor can have stable electric characteristics.

The source electrode 408a and the drain electrode 408b can be formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component. A single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given as examples. Note that a transparent conductive material containing indium oxide, tin oxide, or zinc oxide may be used.

FIG. 29D is a cross-sectional view illustrating the vicinity of a region where the multilayer film 406 is in contact with the source electrode 408a or the drain electrode 408b of the transistor 310. As illustrated in FIG. 29D, in the multilayer film 406, an n-type region 405 is formed in the vicinity of the interface which is in contact with the source electrode 408a or the drain electrode 408b.

The n-type region 405 is formed between the channel and the source electrode 408a or the drain electrode 408b, and includes more oxygen vacancies than the channel. The n-type region 405 is formed in the following manner: the multilayer film 406 is damaged by plasma used when the conductive film to be the source electrode 408a and the drain electrode 408b, and oxygen vacancies occur in the multilayer film 406; or alternatively, depending on the kind of conductive film used for the source electrode 408a and the drain electrode 408b, oxygen is taken away from part of the multilayer film 406. As a conductive film which takes oxygen away from the multilayer film 406, a tungsten film can be given, for example. The n-type region 405 can function as a source or a drain of the transistor 310. The n-type region 405 has higher carrier density (lower resistance) than the first oxide layer 406a, the second oxide layer 406c, the third oxide layer 406d, and the oxide semiconductor layer 406b.

Note that in FIGS. 29B and 29D, a boundary of the n-type region 405 is illustrated schematically with a dotted line. However, the structure of the n-type region 405 is not limited to that illustrated in FIG. 29D because the depth of the n-type region 405 in the thickness direction and/or the area of n-type region 405 in the plane direction of the multilayer film 406 might depend on the manufacturing conditions of the transistor.

The protective insulating film 410 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

As the protective insulating film 410, an oxide insulator containing excess oxygen is preferably used. Although the second oxide layer 406c or the third oxide layer 406d which is in contact with the protective insulating film 410 might include an oxygen vacancy, oxygen can be supplied from the protective insulating film 410 containing excess oxygen. In such a manner, an oxygen vacancy in the oxide layer in contact with the oxide semiconductor layer 406b can be repaired.

It is further preferable that the protective insulating film 410 be a multilayer film in which an insulating film having low oxygen-permeability (having a barrier property against oxygen) is provided over an oxide insulator containing excess oxygen. An insulating film having a barrier property against oxygen is provided over an oxide insulator containing excess oxygen, whereby oxygen released from the oxide insulator containing excess oxygen can be effectively supplied to the multilayer film. As the insulating film having a barrier property against oxygen, a silicon nitride film or a silicon nitride oxide film can be provided, for example.

The protective insulating film 410 is, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of a spin corresponding to a signal with a g factor of 2.001 in ESR is less than or equal to $3\times10^{17}$ spins/cm$^3$, preferably less than or equal to $5\times10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

Alternatively, the protective insulating film 410 is, for example, a multilayer film including a first silicon oxide layer as a first layer, a second oxide layer as a second layer, and a silicon nitride layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose density of a spin corresponding to a signal with a g factor of 2.001 in ESR is less than or equal to $3\times10^{17}$ spins/cm$^3$, preferably less than or equal to $5\times10^{16}$ spins/cm$^3$ is used. As the silicon nitride layer, a silicon nitride layer from which hydrogen and ammonia are less likely to be released is used. As the second silicon oxide layer, a silicon oxide layer containing excess oxygen is used. Further, as the silicon nitride layer, a silicon nitride layer which does not transmit or hardly transmits oxygen is used.

With the structure of the transistor in one embodiment of the present invention, oxygen vacancies in the oxide semiconductor layer which serves as a channel can be reduced. Thus, a semiconductor device which has favorable electric characteristics and high long-term reliability can be provided.

<3-4. Modification Example of Transistor Structure (2)>

Figure 30A:
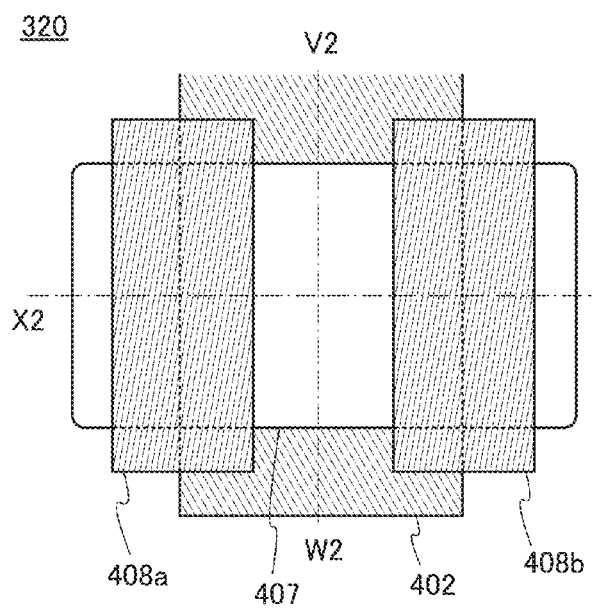
FIGS. 30A to 30C are a top view and cross-sectional views illustrating a semiconductor device in one embodiment of the present invention.
Figure 30C:
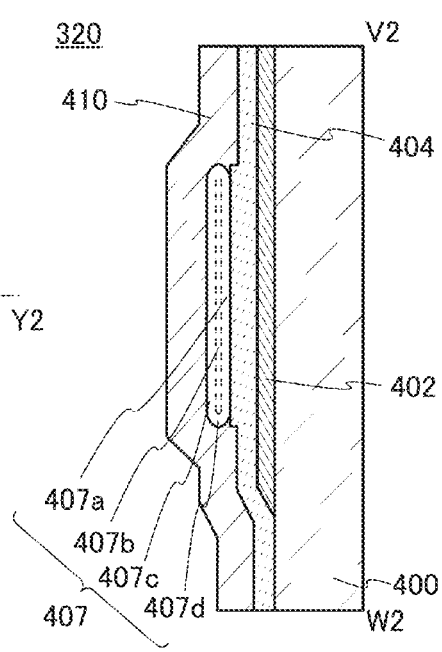
Figure 30B:
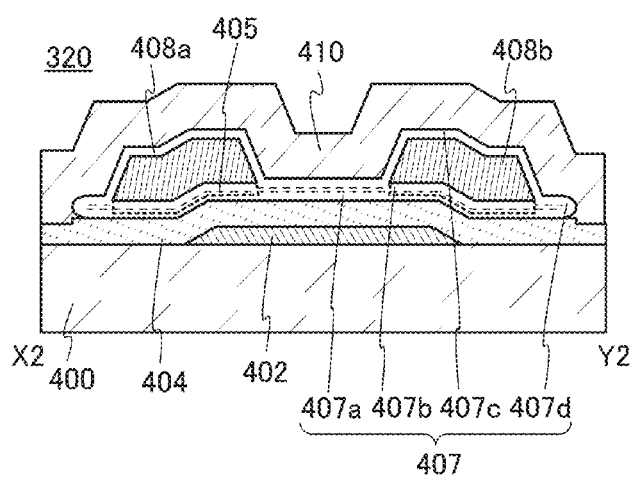

FIGS. 30A to 30C illustrates a structural example of a transistor 320. The transistor 320 is a modification example of the transistor 310 in FIGS. 29A to 29D. FIG. 30A is a plan view of the transistor 320. FIG. 30B is a cross-sectional view taken along line X2-Y2 in FIG. 30A. FIG. 30C is a cross-sectional view taken along line V2-W2 in FIG. 30A. Note that in FIG. 30A, some components of the transistor 320 (e.g., the gate insulating film 404 and the like) are not illustrated to avoid complexity.

The difference between the transistor 310 and the transistor 320 is the stacking order of layers in a multilayer film 407, the source electrode 408a, and the drain electrode 408b. That is, in the transistor 320, the source electrode 408a and the drain electrode 408b are provided so as to be in contact with part of the top surface of an island-shaped oxide semiconductor layer 407b, and a second oxide layer 407c is provided so as to cover the source electrode 408a and the drain electrode 408b. Further, a third oxide layer 407d is provided so as to cover side surfaces of an island-shaped first oxide layer 407a, the island-shaped oxide semiconductor layer 407b, and the island-shaped second oxide layer 407c. Furthermore, in the top surface of the oxide semiconductor layer 407b, a region which is not in contact with the source electrode 408a or the drain electrode 408b is covered with the second oxide layer 407c.

In the transistor 320, the multilayer film 407 including the first oxide layer 407a, the oxide semiconductor layer 407b, and the second oxide layer 407c is formed between the gate insulating film 404 and the protective insulating film 410.

In a method for manufacturing the transistor 320, the conductive film to be the source electrode 408a and the drain electrode 408b is formed over the oxide semiconductor layer 407b before the first oxide layer 407a and the oxide semiconductor layer 407b are processed into an island shape. After that, the conductive film is processed into the source electrode 408a and the drain electrode 408b. Subsequently, the second oxide layer 407c which covers the source electrode 408a and the drain electrode 408b is formed. Then, the first oxide layer 407a, the oxide semiconductor layer 407b, and the second oxide layer 407c are processed into island shapes, so that the multilayer film 407 is formed. In such a manufacturing process, the structure of the transistor 320 can be obtained without increasing the number of photomasks used for the transistor 310. At this time, a region which is in the oxide semiconductor layer 407b included in the multilayer film 407 and is not overlapped with the source electrode 408a or the drain electrode 408b might be partly etched to have a small thickness when the conductive film is processed into the source electrode 408a and the drain electrode 408b.

In the oxide semiconductor layer 407b included in the transistor 320, an oxygen vacancy occurs in a region which is close to the interface and is in contact with the source electrode 408a or the drain electrode 408b; thus, an n-type region is formed. The n-type region can function as a source or a drain of the transistor 320.

As illustrated in FIG. 30B, in a cross section of the transistor 320 in the channel length direction, an end portion (e.g., the third oxide layer 407d) of the multilayer film 407 can also be in contact with the protective insulating film 410. With such a structure, an oxygen vacancy which might occur in the end portion of the multilayer film 407 in the channel length direction can be repaired by oxygen contained in the protective insulating film 410. Therefore, reliability of the transistor can be improved.

<3-5. Method for Manufacturing Transistor Structure (2)>

An example of a method for manufacturing a transistor is described. Hereinafter, the case of manufacturing the transistor 310 illustrated in FIGS. 29A to 29D is described as an example with reference to FIGS. 31A to 31D.

First, a conductive film to be the gate electrode 402 is formed. The conductive film to be the gate electrode 402 may be formed by a sputtering method, a CVD method, an MBE method, an ALD method, or a PLD method.

Next, the conductive film to be the gate electrode 402 is partly etched to form the gate electrode 402.

Figure 31A:
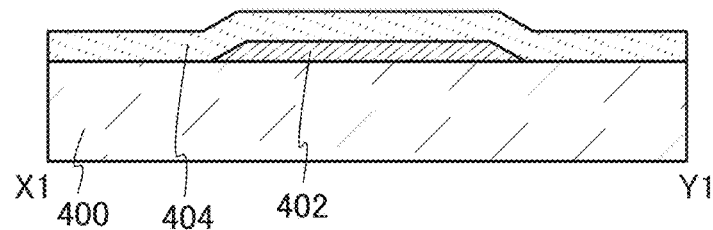
FIGS. 31A to 31D are cross-sectional views illustrating a method for manufacturing a semiconductor device in one embodiment of the present invention.

Then, the gate insulating film 404 is formed (see FIG. 31A). The gate insulating film 404 may be formed by a sputtering method, a CVD method, an MBE method, an ALD method, or a PLD method.

Figure 31B:
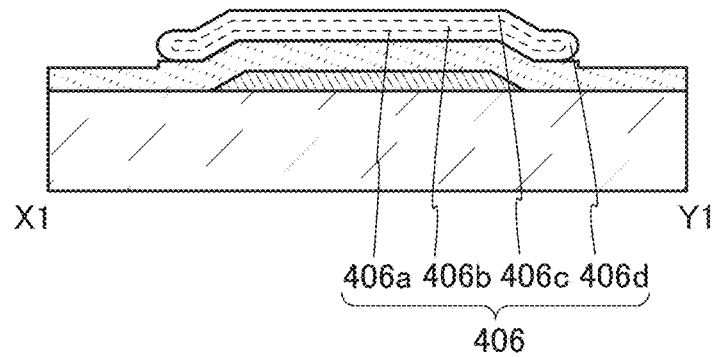

Subsequently, the multilayer film 406 is formed (see FIG. 31B). The description of a method for forming the multilayer film 108 can be referred to for the details of the multilayer film 406.

It is preferable that the oxide layer to be the first oxide layer 406a, the oxide semiconductor layer 406b, and the oxide layer to be the second oxide layer 406c be successively formed without being exposed to the air in order that impurities are less likely to be taken into each interface.

After the multilayer film 406 is formed, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 406b can be improved, and in addition, impurities such as hydrogen and water can be removed from the gate insulating film 404 and/or the multilayer film 406.

Figure 31C:
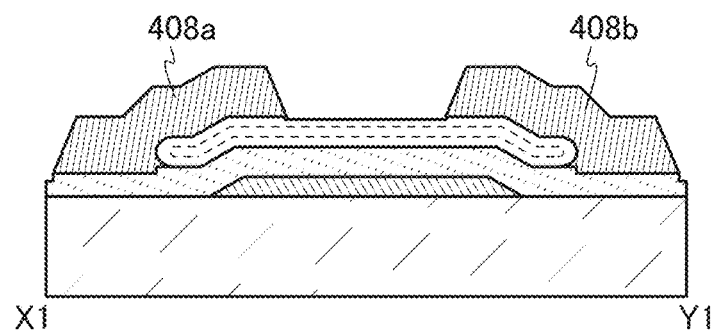

Next, the conductive film to be the source electrode 408a and the drain electrode 408b is formed, and the conductive film is processed into the source electrode 408a and the drain electrode 408b (see FIG. 31C). The conductive film can be deposited by a sputtering method, a CVD method, an MBE method, an ALD method, or a PLD method.

Next, second heat treatment is preferably performed. The description of the first heat treatment can be referred to for the second heat treatment. The second heat treatment can remove impurities such as hydrogen and water from the multilayer film 406.

Figure 31D:
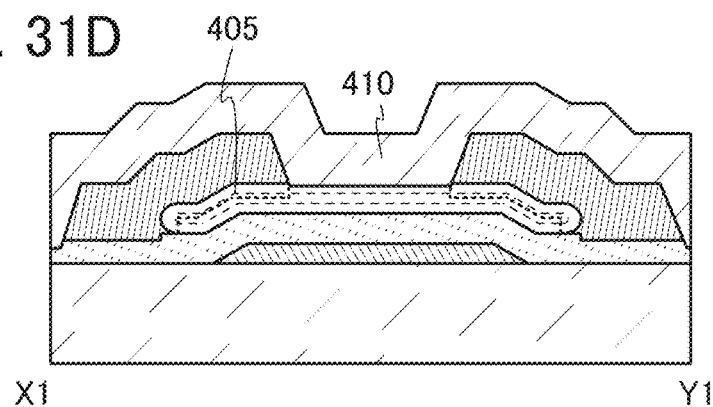

Next, the protective insulating film 410 is formed (see FIG. 31D). The protective insulating film 410 may be formed by a sputtering method, a CVD method, an MBE method, an ALD method, or a PLD method.

Here, the case where the protective insulating film 410 has a three-layer structure is described. First, a first silicon oxide layer is formed, and then a second silicon oxide layer is formed. Next, treatment for adding oxygen ions to the second silicon oxide layer is preferably performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, a silicon nitride layer is formed. The protective insulating film 410 may be formed in the above manner.

After the protective insulating film 410 is formed, third heat treatment is preferably performed. The description of the first heat treatment can be referred to for the third heat treatment. By the third heat treatment, excess oxygen is released from the gate insulating film 404 and/or the protective insulating film 410; thus, oxygen vacancies in the multilayer film 406 can be reduced.

In the case where the conductive film to be the source electrode 408a and the drain electrode 408b is formed by a sputtering method, a surface of the multilayer film 406 might be damaged by plasma at the time of the deposition and an oxygen vacancy (Vo) might be formed. Further, hydrogen (H) might enter the formed oxygen vacancy.

When an In-M-Zn oxide is used for the multilayer film 406, an In—H bond, an M-H bond, or a Zn—H bond might be formed because of the formation of an oxygen vacancy due to plasma damage and the transfer of hydrogen into the oxygen vacancy. In particular, oxygen which bonds with indium (In) having the largest ionic radius and the weakest bonding with oxygen is easily released; thus, an In—O—In bond is cut and In-Vo is formed, and when H enters the In-Vo, In-VoH is likely to be formed.

Thus, after the conductive film to be the source electrode 408a and the drain electrode 408b, the whole surface of the multilayer film 406 which is in contact with the conductive film might have n-type conductivity.

Here, it is effective to form the protective insulating film 410 containing excess oxygen in contact with the n-type part of the multilayer film 406 and to perform the third heat treatment for supplying oxygen to the region of the multilayer film 406 which is in contact with the protective insulating film 410.

Note that even when plasma damage due to formation of the conductive film is caused, a Ga—O—Ga(Zn—O—Zn) bond in the multilayer film 406 is not cut owing to its strong bonding. When the source electrode 408a and the drain electrode 408b are formed, the multilayer film 406 is partly etched and a region having a small thickness is formed in some cases. In the case where the multilayer film 406 to be etched is a CAAC-OS film, a crystal part does not become amorphous even after the etching and the structure of the CAAC-OS film is maintained. In other words, the structure of the CAAC-OS film is maintained even when plasma damage is caused.

By the third heat treatment, oxygen is supplied to In-VoH contained in the n-type region of the channel formation region on a back channel side of the multilayer film 406, so that an In—O—In bond can be formed again. This is because, since a Ga—O—Ga(Zn—O—Zn) bond is not cut, the bonding state returns to the initial state by strain energy. Further, hydrogen (H) which is taken into an oxygen vacancy portion can be released to the outside as water ($H_2O$) by heat treatment. That is, when oxygen is supplied to the multilayer film 406 by the third heat treatment, the n-type channel region can return to an i-type channel region.

Furthermore, the temperature and heating time of the third heat treatment are adjusted as appropriate, whereby In-VoH remains in a region in contact with the source electrode 408a and the drain electrode 408b and at the same time, the channel region can be an i-type channel region. In that case, it is possible to form the multilayer film 406 including the n-type region 405 which serves as a source region or a drain region and an intrinsic or substantially intrinsic channel region.

Note that oxygen may be supplied to the n-type channel region by $N_2O$ plasma treatment performed on the region or plasma treatment for ashing a resist, instead of (or in addition to) the third heat treatment.

In the above manner, the transistor 310 can be manufactured.

The transistor described here has the following structure: an oxide semiconductor layer in which a channel is formed is surrounded by an oxide layer whose main component is the same as that of the oxide semiconductor layer, and in which an oxygen vacancy does not easily occur. With the structure of the transistor, an increase in oxygen vacancies in the oxide semiconductor layer can be suppressed and the impurity concentration can be reduced, whereby the oxide semiconductor layer can be a highly purified intrinsic oxide semiconductor layer.

Thus, it is possible to suppress a change in electric characteristics such as threshold voltage, which might be caused by an oxygen vacancy in a channel formation region. Specifically, a transistor having stable normally-off characteristics can be obtained, for example. Thus, a semiconductor device which has favorable electric characteristics and high long-term reliability can be provided.

Although the oxide semiconductor layer described in the above embodiment can be formed by a sputtering method, such a layer may be formed by another method, e.g., a thermal CVD method. A metal organic chemical vapor deposition (MOCVD) method or ALD method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute transistor.

The oxide semiconductor layer described in the above embodiment can be formed by a thermal CVD method such as a MOCVD method or an ALD method. For example, in the case where an In—Ga—Zn oxide layer is formed by the MOCVD method, trimethylindium, trimethylgallium, and diethylzinc are used. Note that the chemical formula of trimethylindium is $(CH_3)_3In$. The chemical formula of trimethylgallium is $(CH_3)_3Ga$. The chemical formula of diethylzinc is $(CH_3)_2Zn$. Without limitation to the above combination, triethylgallium (chemical formula: $(C_2H_5)_3Ga$) can be used instead of trimethylgallium and dimethylzinc (chemical formula: $(C_2H_5)_2Zn$) can be used instead of diethylzinc.

For example, in the case where an oxide semiconductor layer, e.g., an In—Ga—Zn oxide layer is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, a Ga—In—O layer, a Zn—In—O layer or a Ga—Zn—O layer may be formed by mixing of these gases. Note that although an $H_2O$ gas which is obtained by bubbling with an inert gas such as Ar may be used instead of an $O_3$ gas, it is preferable to use an oxidizing gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Example 1

In this example, a transistor using a multilayer film including an oxide semiconductor layer was manufactured. Then, a cross section was observed using an electron microscope and electric characteristics were measured.

An example sample was prepared as described below. Note that the example sample is the transistor having a TGTC structure, which is illustrated in FIGS. 21A to 21C.

A glass substrate was used as the substrate 100.

A silicon oxynitride film was used as the base insulating film 102.

A method for forming the oxide layer 105a, the oxide semiconductor layer 106, the oxide layer 105b, and the oxide layer 105c will be described below.

First, a 5-nm-thick oxide layer was formed as the oxide layer 135a by a sputtering method under the following conditions: an In—Ga—Zn oxide (the atomic ratio of In to Ga and Zn is 1:3:2) target was used; an argon gas at a flow rate of 30 sccm and an oxygen gas at a flow rate of 15 sccm were used as a deposition gas; the pressure was 0.4 Pa; the substrate temperature was 200° C.; and a DC power of 0.5 kW was applied.

Further, a 5-nm-thick oxide semiconductor layer was formed as the oxide semiconductor layer 136 by a sputtering method under the following conditions: an In—Ga—Zn oxide (the atomic ratio of In to Ga and Zn is 3:1:2) target was used; an argon gas at a flow rate of 30 sccm and an oxygen gas at a flow rate of 15 sccm were used as a deposition gas; the pressure was 0.4 Pa; the substrate temperature was 200° C.; and a DC power of 0.5 kW was applied.

Furthermore, a 5-nm-thick oxide layer was formed as the oxide layer 135b by a sputtering method under the following conditions: an In—Ga—Zn oxide (the atomic ratio of In to Ga and Zn is 1:1:1) target was used; an argon gas at a flow rate of 30 sccm and an oxygen gas at a flow rate of 15 sccm were used as a deposition gas; the pressure was 0.4 Pa; the substrate temperature was 300° C.; and a DC power of 0.5 kW was applied.

Next, the resist mask 140 was formed over the oxide layer 135b, and the oxide layer 135b, the oxide semiconductor layer 136, and the oxide layer 135a were processed into the oxide layer 105b, the oxide semiconductor layer 106, and the oxide layer 105a, respectively, by a dry etching method. At the same time, the oxide layer 105c, which is a sidewall protective film, was formed in contact with at least the side surface of the oxide semiconductor layer 106.

The dry etching was performed under the following conditions: a boron trichloride gas at a flow rate of 60 sccm and a chlorine gas at a flow rate of 20 sccm were used as the etching gases; the pressure was 1.9 Pa; the ICP power was 450 W; the substrate bias power was 100 W; and the substrate temperature was 70° C. Further, ashing treatment was performed for three minutes under the following conditions: an oxygen gas at a flow rate of 300 sccm was used; the pressure was 66.5 Pa; and the ICP power was 1800 W. Then, to remove the resist mask 140, three-minute treatment using "Nagase resist stripper N-300" manufactured by Nagase ChemteX Corporation was performed twice at 80° C.

For the source electrode 116a and the drain electrode 116b, a tungsten film was used.

A silicon oxynitride film was used for the gate insulating film 112.

As the gate electrode 104, a multilayer film of a tantalum nitride layer and a tungsten layer over the tantalum nitride layer was used.

As the protective insulating film 118, a stack of an aluminum oxide layer and a silicon oxynitride film over the aluminum oxide layer was used.

In the above manner, the example sample was prepared.

Figure 32A:
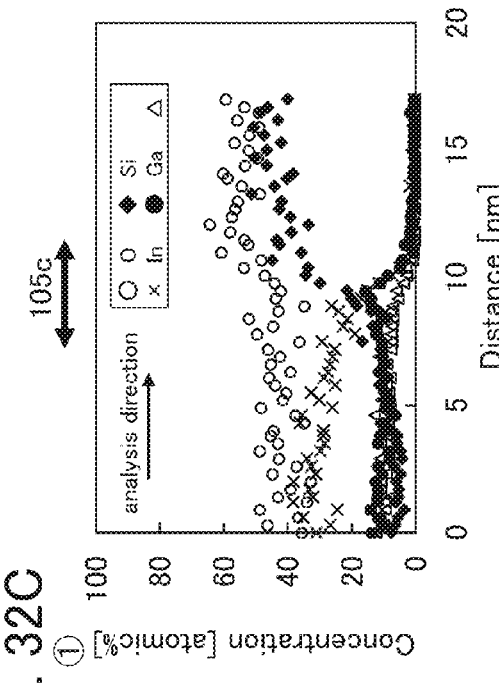
FIGS. 32A to 32D show cross-sectional observation images and composition of a multilayer film.
Figure 32B:
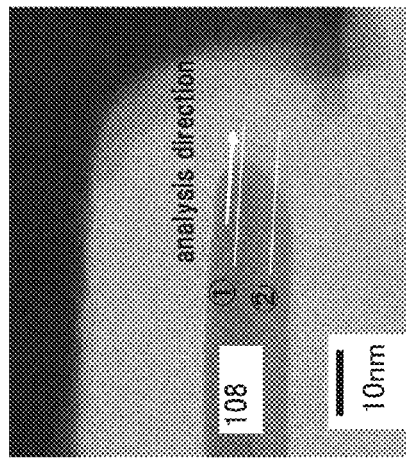

FIGS. 32A and 32B show cross-sectional observation images of the example sample, which were obtained with a scanning transmission electron microscope (STEM). Note that FIGS. 32A and 32B are phase contrast images (also referred to as transmitted electron (TE) images) of the transistor, which is the example sample, in the channel width direction (the direction of the dashed-dotted line A3-A4 in FIG. 21A).

Figure 32C:
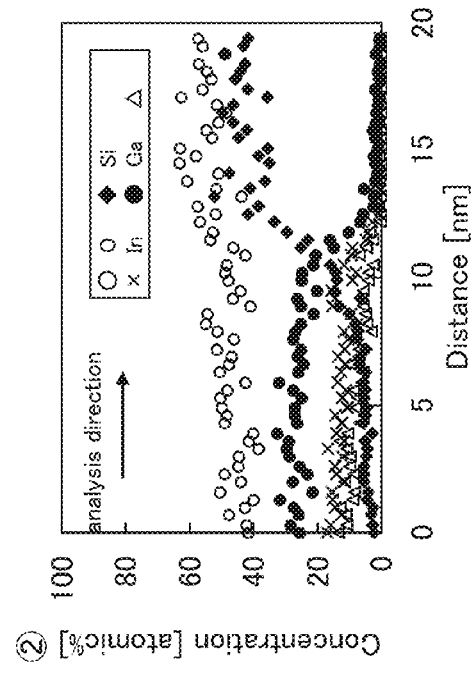
Figure 32D:
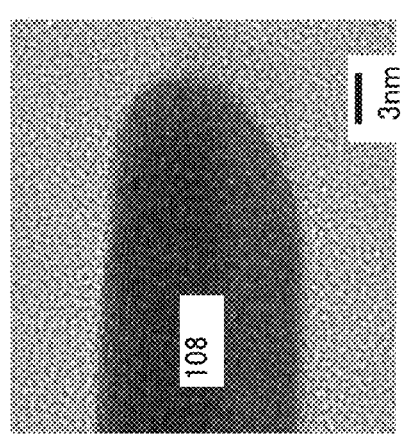

In the portion shown in FIG. 32A, a line analysis of the composition of the end portion of the multilayer film 108 was conducted by EDX. The line analysis was conducted on two portions and the results are shown in FIGS. 32C and 32D. Note that in FIGS. 32C and 32D, white circles (○), black rhombuses (♦), crosses (x), black circles (●), and white triangles (∆) indicate oxygen (O), silicon (Si), indium (In), gallium (Ga), and zinc (Zn), respectively.

As shown in FIGS. 32C and 32D, the proportion of gallium atoms in the oxide layer 105c is high at the end portion of the multilayer film 108.

EXPLANATION OF REFERENCE

70: atmosphere-side substrate supply chamber, 70a: deposition chamber, 70b: deposition chamber, 71: atmosphere-side substrate supply chamber, 72a: load lock chamber, 72b: unload lock chamber, 73: transfer chamber, 73a: transfer chamber, 73b: transfer chamber, 74: cassette port, 75: substrate heating chamber, 76: substrate transfer robot, 80: deposition chamber, 80a: deposition chamber, 80b: deposition chamber, 80c: deposition chamber, 80d: deposition chamber, 81: atmosphere-side substrate supply chamber, 82: load/unload lock chamber, 83: transfer chamber, 84: cassette port, 85: substrate heating chamber, 86: substrate transfer robot, 87: target, 88: deposition preventing plate, 89: glass substrate, 90: substrate stage, 92: substrate stage, 93: heating mechanism, 94: refiner, 95a: cryopump, 95b: cryopump, 95c: turbo molecular pump, 95d: cryopump, 95e: cryopump, 95f: cryopump, 96: vacuum pump, 96a: vacuum pump, 96b: vacuum pump, 96c: vacuum pump, 97: mass flow controller, 98: gas heating mechanism, 99: cryotrap, 100: substrate, 102: base insulating film, 104: gate electrode, 105: oxide layer, 105a: oxide layer, 105b: oxide layer, 105c: oxide layer, 106: oxide semiconductor layer, 106b: oxide layer, 108: multilayer film, 108a: source region, 108b: drain region, 112: gate insulating film, 116a: source electrode, 116a1: conductive layer, 116a2: conductive layer, 116a3: conductive layer, 116a4: conductive layer, 116b: drain electrode, 116b1: conductive layer, 116b2: conductive layer, 116b3: conductive layer, 116b4: conductive layer, 118: protective insulating film, 132: base insulating film, 133: base insulating film, 135a: oxide layer, 135b: oxide layer, 136: oxide semiconductor layer, 140: resist mask, 150: plasma, 152: base insulating film, 155a: oxide layer, 155b: oxide layer, 156: oxide semiconductor layer, 175c: oxide layer, 310: transistor, 320: transistor, 400: substrate, 402: gate electrode, 404: gate insulating film, 405: region, 406: multilayer film, 406a: oxide layer, 406b: oxide semiconductor layer, 406c: oxide layer, 406d: oxide layer, 407: multilayer film, 407a: oxide layer, 407b: oxide semiconductor layer, 407c: oxide layer, 407d: oxide layer, 408a: source electrode, 408b: drain electrode, and 410: protective insulating film.

This application is based on Japanese Patent Application serial no. 2012-234427 filed with Japan Patent Office on Oct. 24, 2012, Japanese Patent Application serial no. 2012-234510 filed with Japan Patent Office on Oct. 24, 2012, and Japanese Patent Application serial no. 2012-244909 filed with Japan Patent Office on Nov. 6, 2012, the entire contents of which are hereby incorporated by reference.

The invention claimed is:

1. A semiconductor device comprising a transistor, the transistor comprising:
   a gate electrode;
   a gate insulating film over the gate electrode;
   a multilayer film over the gate insulating film, the multilayer film comprising an oxide semiconductor layer and an oxide layer surrounding the oxide semiconductor layer;
   a source electrode; and
   a drain electrode,
   wherein the oxide layer includes a first region in contact with a bottom surface of the oxide semiconductor layer, a second region in contact with a top surface of the oxide semiconductor layer, and a third region in contact with a side surface of the oxide semiconductor layer,
   wherein an upper end portion of the oxide layer and a lower end portion of the oxide layer are rounded,
   wherein each of the oxide semiconductor layer and the oxide layer comprises at least indium,
   wherein a proportion of indium in the oxide semiconductor layer is higher than a proportion of indium in the oxide layer,
   wherein the oxide semiconductor layer comprises a channel formation region of the transistor, and
   wherein a top surface of the multilayer film over the channel formation region is partly etched.

2. The semiconductor device according to claim 1, wherein each of the oxide semiconductor layer and the oxide layer further comprises a metal element selected from aluminum, titanium, silicon, gallium, germanium, yttrium, zirconium, tin, lanthanum, cerium, and hafnium, and wherein a proportion of the metal element in the oxide layer is higher than a proportion of the metal element in the oxide semiconductor layer.

3. The semiconductor device according to claim 1, wherein the third region comprises the same kind of element as the first region.

4. The semiconductor device according to claim 1, wherein the multilayer film is in contact with an insulating film containing excess oxygen.

5. A semiconductor device comprising a transistor, the transistor comprising:
 a gate electrode;
 a gate insulating film over the gate electrode;
 a multilayer film over the gate insulating film, the multilayer film comprising an oxide semiconductor layer and an oxide layer surrounding the oxide semiconductor layer;
 a source electrode; and
 a drain electrode,
 wherein the oxide layer includes a first region in contact with a bottom surface of the oxide semiconductor layer, a second region in contact with a top surface of the oxide semiconductor layer, and a third region in contact with a side surface of the oxide semiconductor layer,
 wherein an upper end portion of the oxide layer and a lower end portion of the oxide layer are rounded,
 wherein the oxide semiconductor layer comprises a channel formation region of the transistor, and
 wherein a top surface of the multilayer film over the channel formation region is partly etched.

6. The semiconductor device according to claim 5,
 wherein each of the oxide semiconductor layer and the oxide layer comprises a metal element selected from aluminum, titanium, silicon, gallium, germanium, yttrium, zirconium, tin, lanthanum, cerium, and hafnium, and
 wherein a proportion of the metal element in the oxide layer is higher than a proportion of the metal element in the oxide semiconductor layer.

7. The semiconductor device according to claim 5, wherein the third region comprises the same kind of element as the first region.

8. The semiconductor device according to claim 5, wherein the multilayer film is in contact with an insulating film containing excess oxygen.

9. A semiconductor device comprising a transistor, the transistor comprising:
 a gate electrode;
 a gate insulating film over the gate electrode;
 a multilayer film over the gate insulating film, the multilayer film comprising an oxide semiconductor layer, a first oxide layer, a second oxide layer, and a third oxide layer;
 a source electrode; and
 a drain electrode,
 wherein the first oxide layer, the second oxide layer, and the third oxide layer surround the oxide semiconductor layer,
 wherein the first oxide layer is in contact with a bottom surface of the oxide semiconductor layer, the second oxide layer is in contact with a top surface of the oxide semiconductor layer, and the third oxide layer is in contact with a side surface of the oxide semiconductor layer,
 wherein an upper end portion of the third oxide layer and a lower end portion of the third oxide layer are rounded,
 wherein each of the oxide semiconductor layer, the first oxide layer, the second oxide layer, and the third oxide layer comprises at least indium,
 wherein a proportion of indium in the oxide semiconductor layer is higher than a proportion of indium in each of the first oxide layer, the second oxide layer, and the third oxide layer,
 wherein the oxide semiconductor layer comprises a channel formation region of the transistor, and
 wherein a top surface of the multilayer film over the channel formation region is partly etched.

10. The semiconductor device according to claim 9,
 wherein each of the oxide semiconductor layer, the first oxide layer, the second oxide layer, and the third oxide layer further comprises a metal element selected from aluminum, titanium, silicon, gallium, germanium, yttrium, zirconium, tin, lanthanum, cerium, and hafnium, and
 wherein a proportion of the metal element in each of the first oxide layer, the second oxide layer, and the third oxide layer is higher than a proportion of the metal element in the oxide semiconductor layer.

11. The semiconductor device according to claim 9, wherein the third oxide layer comprises the same kind of element as the first oxide layer.

12. The semiconductor device according to claim 9, wherein the multilayer film is in contact with an insulating film containing excess oxygen.

13. The semiconductor device according to claim 1, where the oxide layer surrounds the oxide semiconductor layer in a channel width direction.

14. The semiconductor device according to claim 5, where the oxide layer surrounds the oxide semiconductor layer in a channel width direction.

15. The semiconductor device according to claim 9, wherein the first oxide layer, the second oxide layer, and the third oxide layer surround the oxide semiconductor layer in a channel width direction.

16. The semiconductor device according to claim 1, wherein the source electrode and the drain electrode comprise a first layer and a second layer where an end portion of the first layer and an end portion of the second layer are not aligned with each other.

17. The semiconductor device according to claim 5, wherein the source electrode and the drain electrode comprise a first layer and a second layer where an end portion of the first layer and an end portion of the second layer are not aligned with each other.

18. The semiconductor device according to claim 9, wherein the source electrode and the drain electrode comprise a first layer and a second layer where an end portion of the first layer and an end portion of the second layer are not aligned with each other.

* * * * *